(12) United States Patent
Akselrod

(10) Patent No.: US 6,846,434 B2
(45) Date of Patent: Jan. 25, 2005

(54) ALUMINUM OXIDE MATERIAL FOR OPTICAL DATA STORAGE

(75) Inventor: Mark Akselrod, Stillwater, OK (US)

(73) Assignee: Landauer, Inc., Glenwood, IL (US)

( * ) Notice: Subject to any disclaimer, the term of this patent is extended or adjusted under 35 U.S.C. 154(b) by 31 days.

(21) Appl. No.: 10/309,021

(22) Filed: Dec. 4, 2002

(65) Prior Publication Data

US 2003/0218151 A1 Nov. 27, 2003

Related U.S. Application Data

(60) Provisional application No. 60/336,749, filed on Dec. 4, 2001, and provisional application No. 60/417,153, filed on Oct. 10, 2002.

(51) Int. Cl.⁷ .............................................. C09K 11/64
(52) U.S. Cl. ............................ 252/301.4 R; 501/127
(58) Field of Search ...................... 501/127; 252/301.4 R

(56) References Cited

U.S. PATENT DOCUMENTS

| | | |
|---|---|---|
| 3,021,285 A | 2/1962 | Bovarnick et al. |
| 3,591,348 A | 7/1971 | La Belle, Jr. |
| 3,915,662 A | 10/1975 | La Belle et al. |
| 4,186,046 A | 1/1980 | DeLai et al. |
| 4,224,099 A | 9/1980 | McGill |
| 4,292,374 A | 9/1981 | Nishizawa et al. |
| 4,471,470 A | 9/1984 | Swainson et al. |
| 4,533,489 A | 8/1985 | Utts et al. |
| 4,573,768 A | 3/1986 | Polak et al. |
| 4,604,225 A | 8/1986 | Chen et al. |
| 4,642,799 A | 2/1987 | Glass |
| 4,915,773 A | 4/1990 | Kravetsky et al. |
| 4,954,707 A | 9/1990 | Miller et al. |
| 4,963,225 A | 10/1990 | Lehman-Lamer |
| 5,025,159 A | 6/1991 | Miller et al. |
| 5,109,586 A | 5/1992 | Jones et al. |
| 5,136,163 A | 8/1992 | Miller et al. |
| 5,272,348 A | 12/1993 | Miller |
| 5,289,407 A | 2/1994 | Strickler et al. |
| 5,325,324 A | 6/1994 | Rentzepis et al. |
| 5,354,997 A | 10/1994 | Miller |
| 5,424,006 A | 6/1995 | Murayama et al. |
| 5,567,948 A | 10/1996 | Miller |
| 5,569,927 A | 10/1996 | Miller |
| 5,616,285 A | 4/1997 | Zhang |
| 5,619,371 A | 4/1997 | Pontius |
| 5,622,659 A | 4/1997 | Spicuzza |
| 5,702,654 A | 12/1997 | Chen et al. |
| 5,755,999 A | 5/1998 | Shi et al. |
| 5,892,234 A | 4/1999 | McKeever et al. |
| 5,932,363 A | 8/1999 | Hu et al. |
| 5,962,857 A | 10/1999 | McKeever et al. |
| 5,981,415 A | 11/1999 | Waku et al. |
| 5,993,545 A | 11/1999 | Lupton et al. |
| 6,010,761 A | 1/2000 | Tatewaki et al. |
| 6,074,477 A | 6/2000 | Imaeda et al. |
| 6,125,095 A | 9/2000 | Gemma et al. |
| 6,207,077 B1 | 3/2001 | Burnell-Jones |
| 6,267,911 B1 | 7/2001 | Yen et al. |
| 6,278,679 B1 | 8/2001 | Yea et al. |
| 6,281,171 B1 | 8/2001 | Ihara et al. |
| 6,302,959 B2 | 10/2001 | Srivastava et al. |
| 6,316,782 B1 | 11/2001 | Akselrod et al. |
| 6,322,931 B1 | 11/2001 | Cumpston et al. |
| 6,322,933 B1 | 11/2001 | Daiber et al. |
| 6,414,324 B1 | 7/2002 | Colyott et al. |
| 2003/0235136 A1 * | 12/2003 | Akselrod et al. ........... 369/108 |

OTHER PUBLICATIONS

US 5,028,794, 7/1991, Miller (withdrawn)
A. Toriumi, J.M. Herrmann, and S. Kawata, *Nondestructive readout of a three–dimensional photochromic optical memory with a near–infrared differential phase–contrast microscope*, Optics Letters, vol. 22, Issue 8, pp. 555–557, Apr. 1997.

(List continued on next page.)

*Primary Examiner*—C. Melissa Koslow
(74) *Attorney, Agent, or Firm*—Jagtiani + Guttag

(57) ABSTRACT

The present invention provides aluminum oxide crystalline materials including dopants and oxygen vacancy defects and methods of making such crystalline materials. The crystalline materials of the present invention have particular utility in optical data storage applications.

38 Claims, 27 Drawing Sheets

OTHER PUBLICATIONS

A. Toriumi, S. Kawata, and M. Gu, *Reflection confocal microscope readout system for three–dimensional photochromic optical data storage*, Optics Letters, vol. 23, Issue 24, pp. 1924–1926, Dec. 1998.

A.V. Stepanov, *New Method of Producing Articles (Sheets, Tubes, Rods, Various Sections, Etc.) Directly From Liquid Metal*, Soviet Physics—Technical Physics, vol. 4, Pt. 1, pp. 339–348, 1959.

M.S. Akselrod and E.A. Gorclova, *Deep Traps in Highly Sensitive a–Al203:C TL Crystals*, Nucl. Tracks Radiat. Meas., vol. 21 No. 1, pp. 143–146, 1993.

B. Chalmers, H.E. LaBelle, and A.J. Mlavsky, *Edge Defined, Film–Fed Crystal Growth*, J. Crystal Growth, vol. 13–14, pp. 84–87, 1972.

B.D. Evans and M. Stapclbroek, *Optical properties of the F+ center in crystalline $Al_2O_3$*, Phys. Rev. B, vol. 18, No. 12, pp. 7089–7098, Dec. 1978.

B.D. Evans, G.J. Pogatshnik and Y. Chen, *Optical Properties of lattice defects in $a–Al_2O_3$*, Nucl. Instrum. And Methods in Phys. Res. B, Vol. 91, pp. 258–262, 1994.

B.J. Jeffries, J.D. Brewer and G.P. Summers, *Photoconductivity and charge trapping in $a–Al_2O_3$*, Phys. Rev. B, vol. 24, No. 10, pp. 6074–6082, Nov. 1981.

B. Lommler, E. Pitt, and A. Scharmann, *Optical creation of radiophotoluminescence centers in dosimeter glass by two photon absorption*, Radiat. Prot. Dosim, vol. 65 No. 1–4, pp. 101–104, 1996.

C.A. Handwerker, P.A. Morris and R.L. Coble, *Effects of Chemical Inhomogeneities on Grain Growth and Microstructure in $Al_2O_3$*, Journal of American Ceramic Society, vol. 72, No. 1, pp. 130–136, Jan. 1989.

Crystal Growth in Science and Technology, edited by H. Arendt and J. Hulliger, New York: Plenum Press, pp. 275–302, 1989.

D.A. Parthenopoulos and P.M. Rentzepis, *Three–Dimensional Optical Storage Memory*, Science, vol. 245, pp. 843–845, Aug. 1989.

D. Lapraz, P. Iacconi, Y. Sayady, P. Keller, J. Barthe and G. Portal, *Some thermoluminescence properties of an $a–Al_2O_3$ sample*, Phys. Stat. Sol. (a), vol. 108, pp. 783–794, 1988.

D.J. Huntley, D.L. Godfrey–Smith and M.L.W. Thewalt, *Optical Dating of Sediments*, Nature, vol. 313, pp. 105–107, Jan. 1985.

Daniel Day, Min Gu, and Andrew Smallridge, *Use of two–photon excitation for erasable–rewritable three–dimensional bit optical data storage in a photo refractive polymer*, Optics Letters, vol. 24, Issue 14, pp. 948–950, Jul. 1999.

Daniel Day and Min Gu, *Effects of Refractive–Index Mismatch on Three–Dimensional Optical Data–Storage Density in a Two–Photon Bleaching Polymer*, Applied Optics–IP, vol. 37, Issue 26, pp. 6299–6304, Sep. 1998.

E.P. Walker, W. Feng, Y. Zhang, H. Zhang, F.B. McCormick, and S. Esener, *3–D Parallel Readout in a 3–D Multilayer Optical Data Storage System*, Technical Digest of Joint International Symposium on Optical Memory and Optical Data Storage, IEEE Catalog, No. 02EX552, pp. 147–149, 2002.

E.P. Walker, X. Zheng, F. B. McCormick, H. Zhang, N.-H. Kim, J. Costa, A. S. Dvornikov, *Servo Error Signal Generation for 2–Photon Recorded Monolithic Multilayer Optical Data Storage*, Optical Data Storage 2000, Proceedings of SPW vol. 4090, pp. 179–184, 2000.

G. Molnar, M. Benabdesselam, J. Borrosay, D. Lapraz, P. Iacconi, and M. Akselrod, *Influence of the Irradiation Temperature on TL Sensitivity of $Al_2O_3$:C*, Radiat. Measurements, v.33, pp. 6 19–623, 2001.

H. Blume, T. Bader, and F. Luty, *Bi–Directional Holographic Information Storage Based on the Optical Reorientation of $F_A$ Centers in KCl:Na*, Optics Communications, vol. 12, No. 2, pp. 147–151, Oct. 1974.

H. Guenther, R. Macfarlane, Y. Furukawa, K. Kitamura, and R. Neurgaonkar, *Two–color holography in reduced near–stoichiometric lithium niobate*, Applied Optics, vol. 37, No. 32, pp. 7611–7623, Nov. 1998.

H.J. Eichler, P. Kuemmel, S. Orlic, and A Wappelt, *High–Density Disk Storage by Multiplexed Microholograms*, IEEE Journal of Selected Topics in Quantum Electronics, vol. 4, No. 5, pp. 840–848, Sep./Oct. 1998.

H.M. Smith, *Holographic Recording Materials*, Chapters 4–5, pp. 101–159, Springer–Verlag Berlin Heidelberg, New York, 1977.

H. Ucki, Y. Kawata, and S. Kawata, *Three–dimensional optical bit–memory recording and reading with a photorefractive crystal: analysis and experiment*, Applied Optics, vol. 35, No. 14, pp. 2457–2465, May 1996.

H. Zhang, A.S. Dvornikov, E.P. Walker, N.H. Kim, and F.B. McCormick, *Single Beam Two–Photon–Recorded Monolithic Multi–Layer Optical Disks*, Optical Data Storage 2000, Proceedings of SPIE, vol. 4090, pp. 174–178, 2000.

I. Schnedier, W.C. Collins, M.J. Marrone, and M.E. Gingerich, *Holographic Subtraction Using Anisotropic Centers in Alkali Halide Crystals*, Applied Physics Letters, vol. 27, No. 6, pp. 348–350, Sep. 1975.

Ingolf Sander (Constellation 3D, Inc.), *Fluorescent Multilayer Technology*, Alternative Storage Technologies Symposium 2001, Monterey California, Jun. 26, 2001.

J.F. Heanue, M.C. Bashaw, and L. Hesselink, *Volume Holographic Storage and Retrieval of Digital Data*, vol. 265, pp. 749–752, Aug. 1994.

James H. Strickler and Watt W. Webb, *Three–dimensional optical data storage in refractive media by two–photon point excitation*, Optics Letters, vol. 16, Issue 22, 1780–1782, Nov. 1991.

K.E. Peiponen, P. Silfsten, and P. Racrinne, *Ruby Laser–Induced Dichroism of $F_A(II)$ Centers in KCl:Li Crystals*, J. Appl. Physics, vol. 70, No. 5, pp 2883–2884, Sep. 1991.

K.H. Lee and J.H. Crawford, *Electron centers in single crystal $Al_2O_3$*, Phys. Rev. B, vol. 15, No. 8, pp. 4065–4070, Apr. 1977.

K.P.D. Lagerlof and R.W. Grimes, *The Defect Chemistry of Sapphire $(a–Al_2O_3)$*, Acta Mater., vol. 46, No. 16., pp. 5689–5700, 1998.

K. Schwartz, *The physics of optical recording*, Chapter 4, pp. 89–111, Springer– Verlag, Germany, 1993.

L. Botter–Jensen and S.W.S. McKeever, *Optically Stimulated Luminescence Dosimetry Using Natural and Synthetic Materials*, Radiation Prot. Dosim., vol. 65, No. 1–4, pp. 273–280, 1996.

L. Hesselink, S.S. Orlov, A. Liu, A. Akella, D. Lande, R.R. Neugaonkar, *Photorefractive Materials for Nanvolatile Volume Holographic Data Storage*, Science, vol. 282, pp. 1089–1094, Nov. 1998.

L.R. Brock, K.C. Mishra, M. Raukas, W.P. Lapatovich, and G.C. Wei, *Color Centers in Magnesium Doped Polycrystalline Alumina*, Mat. Res. Soc. Symp. Proceedings, vol. 667, pp. G7.1.1–G7.1.11, 2001.

M.A. Noginov, G.B. Loutts, S.W. Helzer, A. Booker, B. Lucas, D. Fider, R.M. Macfarlane, and R.M. Shelby, *Two–Color Holographic Recording Scheme Allowing Nonvalatile Reading in Mn: YAlO3*, Applied Optics, vol. 40, No. 23, pp. 3915–3921, Aug. 2001.

M.A. Noginov, N. Noginova, M. Curley, N. Kukhtarev, H.J. Caulfield, and P. Venkateswarlu, *Optical Characterization of Mn: YAlO3: Material for Holographic Recording and Data Storage*, Optical Society of America, vol. 15, No. 5, pp. 1463–1468, May 1998.

M. Ishikwa, Y. Kawata, C. Egami, O. Sugihara, N. Okamoto, M. Tsuchimori, and O. Watanabe, *Reflection–type confocal readout for multilayered optical memory*, Optics Letters, vol. 23, Issue 22, 1781–1783, Nov. 1998.

M.S. Akselrod and V.S. Kortov, *Thermoluminescent and Exoemission Properties of New High–Sensitivity TLD a–A $l_2O_3$:C Crystals*, Radiat. Prot. Dosim., vol. 33 No. 1–4, pp. 123–126, 1990.

M.S. Akselrod, V.S. Kortov, and E.A. Gorelova, *Preparation and properties of a–$Al_2O_3$:C*, Radiat. Prot. Dosim., vol. 47, No. 1–4, pp. 159–164, 1993.

M.S. Akselrod, V.S. Kortov, D.J. Kravetsky, and V.I. Gotlib, *Highly Sensitive Thermoluminescent Anion–Defective a–$Al_2O_3$: C Single Crystal Detectors*, Radiat. Prot. Dosim., vol. 32, No. 1, pp. 15–20, 1990.

M.P. Bernal, H. Coufal, R.K. Grygier, J.A. Hoffnagle, C.M. Jefferson, R.M. Macfarlane, R.M. Shelby, G.T. Sincerbox, P. Wimmer, and G. Wittmann, *A Precision Tester for Studies Of Holographic Optical Storage Materials and Recording Physics*, Applied Optics, vol 35, No. 14, pp. 2360–2374, May 1996.

M.S. Akselrod and S.W.S. McKeever, *A Radiation Dosimetry Method Using Pulsed Optically Stimulated Luminescence*, Radiat. Prot. Dosim., vol. 81, No. 3, pp. 167–176, 1999.

M.S. Akselrod, A.C. Lucas, J.C. Polf and S.W.S. McKeever, *Optically Stimulated Luminescence of $Al_2O_3$*, Radiat. Measurements, vol. 29, No. 3–4, pp. 39 1–399, 1998.

M.S. Akselrod, N. Agersnap Larsen and S.W.S. McKeever, *A Procedure For the Distinction Between Static and Dynamic Radiation Exposures of Personal Radiation badges Using Pulsed Optically Stimulated Luminescence*, Radiat.Measurements, vol. 32, pp. 215–225, 2000.

Mark D. Rahn, David P. West, K. Khand, J.D. Shakos, and R.M. Shelby, *Digital Holographic Data Storage in a High–Performance Photorefractive Polymer Composite*, Applied Optics, vol. 40, No. 20, pp. 3395–3401, Jul. 2001.

Mark M. Wang and Sadik C. Esener, *Three–Dimensional Optical Data Storage in a Fluorescent Dye—Doped Photopolymer*, Applied Optics, vol. 39, No. 11, pp. 1826–1834, Apr. 2000.

Min Gu, *Confocal Readout of Three–Dimensional Data Bits Recorded by the Photorefractive Effect Under Single–Photon and Two–Photon Excitation*, Proceedings of the IEEE, vol. 87, No. 12, pp. 202 1–2029, Dec. 1999.

Min Gu and Daniel Day, *Use of continuous–wave illumination for two–photon three– dimensional optical bit data storage in a photo–bleaching polymer*, Optics Letter, vol. 24, Issue 5, pp. 288–290, Mar. 1999.

P.A. Kulis, M.J. Springis, I.A. Tale, V.S. Vainer and J.A. Valbis, *Impurity– associated colour centers in Mg– and Ca–doped $Al_2O_3$ single crystals*, Phys. Stat. Sol. (b), vol. 104, pp. 719–725, 1981.

P. Goldsmith, J. Lindmayer and C. Wrigley, *Electron trapping. A New approach to rewritable optical data storage*, Optical Data Storage Meeting proceedings, SPIE vol. 1316, pp. 312–320, 1990.

P. Pokorny and A. Ibarra, *On the origin of the thermoluminescence of $Al_2O_3$: Cr, Ni*, J. Phys.: Condens. Matter, vol. 5, pp. 7387–7396, 1993.

R. Ramirez, R. Gonzalez, and I. Colera, *Protons and Deuterons in Magnesium– Doped Sapphire Crystals*, Journal of American Ceramic Society, vol. 80, No. 4, pp. 847–850, 1997.

R.S. McDougall and S. Rudin, *Thermoluminescent dosimetry of aluminum oxide*, Health Physics, vol. 19, pp. 281–283, Aug. 1970.

S.K. Mehta and S. Sengupta, *Gamma dosimetry with Al2O3 thermoluminescent phosphor*, Phys. Med. Biol., vol. 21, No. 6, p. 955–964, 1976.

S. Lartigue Korinek and F. Dupau, *Grain Boundary Behavior in Superplastic Mg– Doped Alumina with Yttria Codoping*, Acta. Metall. Mater., vol. 42, No. 1, pp. 293–302, 1994.

S. Morita, H. Sekiwa, H. Toshima, and U. Miyazawa, *The Growth of $Al_2O_3$ Single Crystals by the Czochralski Method*, Journal of the Ceramic Society of Japan, vol. 101, No. 1, pp. 108–112, 1993.

S. Orlov, *Volume Holographic Data Storage*, Communications of the ACM, vol. 43, No. 11, pp. 47–54, Nov. 2000.

S.W.S. McKeever, M.S Akselrod and B.G. Markey, *Pulsed Optically Stimulated Luminescence Dosimetry Using a–$Al_2O_3$: C*, Radiat. Prot. Dosim., vol. 65, No. 1–4, pp. 267–272, 1996.

T. Wilson, Y. Kawata, and S. Kawata, *Readout of Three–Dimensional Optical Memories,* Optics Letters, vol. 21, No. 13, pp. 1003–1005, Jul. 1996.

V.S. Kortov, T.S. Bessonova, M.S. Akselrod, and I.I. Milman, *Hole–Induced Exoelectron Emission and Luminescence of Corundum Doped with Mg*, Phys. Stat. Sol. (a), vol. 87, pp. 629–639, 1985.

W.G. Buckman, *Aluminum oxide thermoluminescence properties for detecting radiation*, Health Phys., vol. 22, p. 402, 1972.

Y.A. Tatarchenko, *Shaped Crystal Growth*, Dordrecht/Boston/London: Kluwer Academic Publishers, pp. 2–5, 1993.

Y. Kawata, H. Ishitobi, and S. Kawata, *Use of two–photon absorption in a photorefractive crystal for three–dimensional optical memory*, Optics Letters, vol. 23, Issue 10, 756–758, May 1998.

Y. Kawata, M. Nakano, and Suk–Chun Lee, *Three–Dimensional Optical Data Storage Using Three–Dimensional Optics*. Optical Engineering, vol. 40, No. 10, 2247–2254, Oct. 2001.

Y. Shen, J. Swiatkiewicz, D.I Jakubczyk, F. Xu, P.N. Prasad, R.A. Vaia, and B.A. Reinhardt, *High–Density Optical Data Storage With One–Photon and Two–Photon Near–Field Fluorescence Microscopy*, Applied Optics, vol. 40, No. 6, 938–940, Feb. 2001.

Y. Zhang, T. D. Milster, J. Butz, W. Bletcher, K.J. Erwin, and E. Walker, *Signal, Cross Talk and Signal to Noise Ratio in Bit– Wise Volumetric Optical Data Storage*, Technical Digest of Joint International Symposium on Optical Memory and Optical Memory and Optical Data Storage, IEEE Catalog, No. 02EX552, pp. 246–248, 2002.

Yoshimasa Kawata, Takuo Tanaka, Satoshi Kawata. *Randomly accessible, multilayered optical memory with a $Bil_2SiO_2O$ crystal*, Applied Optics, vol. 35, Issue 26, pp. 5308–5311, Sep. 1996.

* cited by examiner

ALUMINUM OXIDE MATERIAL FOR OPTICAL DATA STORAGE

CROSS-REFERENCE TO RELATED APPLICATIONS

The present application claims the priority dates of the following co-pending U.S. Patent Applications: U.S. Provisional Application No. 60/417,153, entitled "Aluminum Oxide Material and Technique for Confocal One-Bit Fluorescent Optical Data Storage," filed Oct. 10, 2002; and U.S. Provisional Application No. 60/336,749, entitled "Aluminum Oxide Material and Technique for Rewritable Optical Data Storage." filed Dec. 4, 2001. The present application also makes reference to U.S. Utility Application No. 10/309,179, entitled "Method for Forming Aluminum Oxide Material Used in Optical Data Storage," filed concurrently with the present application. The entire disclosure and contents of the above applications are hereby incorporated by reference.

BACKGROUND OF THE INVENTION

1. Field of the Invention

The present invention relates to a doped aluminum oxide crystalline material intended for optical data storage applications.

2. Description of the Prior Art

Various attempts have been made to design higher density data storage media for computer devices to replace conventional storage media such as magnetic disks, CD-ROMs, DVDs, etc. Many of the obstacles faced with respect to developing improved storage media have been associated with inadequate material properties. For example, photopolymers have been investigated for use in one-bit or holographic data storage. However, photopolymers exhibit strong dimensional shrinkage. Also, most photo-sensitive polymers may be used only as WROM media (write once, read many times) and the rewritable photopolymers are still unstable and show significant fatigue when write-read cycles are repeated many times. Even write-once fluorescent photopolymers show strong reduction of fluorescent output signal when read repeatedly. An additional problem with most photopolymers, as well as for photorefractive crystals, another potential material for volumetric one-bit recording, is the necessity of using a femto-second high peak power Ti-sapphire laser to achieve efficient two-photon absorption. This type of laser is big, expansive and suitable only for laboratory demonstration.

Therefore, there exists a need for better materials for making high density data storage devices.

SUMMARY OF THE INVENTION

It is therefore an object of the present invention to provide a crystalline material that may be employed in a data storage method based on fundamentally very fast electronic processes vs. phase change transitions or photo-induced polymerization for well known techniques.

It is a further object of the present invention to provide a crystalline material that may be employed in a data storage method that is capable of achieving a write/read rate up to 1 Gbit per second.

It is yet another object of the present invention to provide a crystalline material that may be employed in a data storage method that provides the ability to perform parallel processing of multiple marks on the storage media for further increase of write/read rate.

It is yet another object of the present invention to provide a crystalline material that may be employed in a data storage method that provides high data storage density restricted only by diffraction limit and NA of the optical components.

It is yet another object of the present invention to provide a crystalline material that may be employed in a data storage method that provides the possibility of multilevel data storage due to linearity of luminescent response within 7 decades.

It is yet another object of the present invention to provide a crystalline material that may be employed in a data storage method that only requires low laser light energies for writing and reading of information (pJ and nJ range).

It is yet another object of the present invention to provide a crystalline material that may be employed in a data storage method that provides extremely high temperature and time stability of stored data (tested in radiation dosimetric application).

It is yet another object of the present invention to provide a crystalline material that may be employed in a data storage method that provides no degradation of material performance after millions of write/read cycles.

According to a first broad aspect of the present invention, there is provided a crystalline material comprising: a base material comprising $Al_2O_3$; a first dopant comprising magnesium; and a second dopant comprising carbon, wherein the crystalline material includes a plurality of at least one type of oxygen vacancy defect.

According to a second broad aspect of the present invention, there is provided a crystalline material comprising $Al_2O_3$, wherein the crystalline material includes a plurality of oxygen vacancy defects.

According to a third broad aspect of the present invention, there is provided a crystalline material comprising $Al_2O_3$, wherein the crystalline material includes at least one color center having: an absorption in the region of 435±5 nm, an emission in the region of 520±5 nm and a 9±3 ns fluorescence lifetime.

According to a fourth broad aspect of the present invention, there is provided a crystalline material comprising $Al_2O_3$, wherein the crystalline material includes at least one color center having: an absorption in the region of 335±5 nm, an emission in the region of 750±5 nm and a 80±10 ns fluorescence lifetime.

According to a fifth broad aspect of the present invention, there is provided a crystalline material comprising: a base material comprising $Al_2O_3$; a first dopant comprising magnesium; and a second dopant comprising carbon, wherein the crystalline material includes at least one color center having: an absorption in the region of 435±5 nm, an emission in the region of 520±5 nm and a 9±3 ns fluorescence lifetime.

According to a sixth broad aspect of the invention, there is provided a crystalline material comprising: a base material comprising $Al_2O_3$; a first dopant comprising magnesium; and a second dopant comprising carbon, wherein the crystalline material includes at least one color center having: an absorption in the region of 335±5 nm, an emission in the region of 750±5 nm and a 80±10 ns lifetime.

According to a seventh broad aspect of the invention, there is provided a crystalline material comprising: a base material comprising $Al_2O_3$; a first dopant comprising magnesium; and a second dopant comprising carbon, wherein the crystalline material includes at least one color center having: an absorption in the region of 435±5 nm, an emission in the region of 520±5 nm and a 9±3 ns fluorescence lifetime and at least one color center having: an absorption in the region of 335±5 nm, an emission in the region of 750±5 nm and a 80±10 ns lifetime.

According to an eighth broad aspect of the invention, there is provided a crystalline material comprising: a base material comprising $Al_2O_3$; a first dopant comprising magnesium, a second dopant comprising carbon, and a third dopant comprising hydrogen, wherein the crystalline material includes at least one color center having: an absorption in the region of 435±5 nm, an emission in the region of 520±5 nm and a 9±3 ns fluorescence lifetime and at least one color center having: an absorption in the region of 335±5 nm, an emission in the region of 750±5 nm and a 80±10 ns lifetime.

According to a ninth broad aspect of the invention, there is provided a crystalline material comprising a base material comprising $Al_2O_3$ and a dopant comprising Mg, wherein the crystalline material includes a plurality of aggregate oxygen vacancy defects.

According to a tenth broad aspect of the invention, there is provided a method for making a crystalline material comprising the steps of: (a) doping a base material comprising $Al_2O_3$ with a first dopant comprising magnesium to form a doped material; and (b) crystallizing the doped material in highly reducing atmosphere in order to form the crystalline material, wherein the crystalline material includes a plurality of at least one type of oxygen vacancy defect.

Other objects and features of the present invention will be apparent from the following detailed description of the preferred embodiment.

BRIEF DESCRIPTION OF THE DRAWINGS

The invention will be described in conjunction with the accompanying drawings, in which.

DETAILED DESCRIPTION OF THE PREFERRED EMBODIMENT

Figure 1:
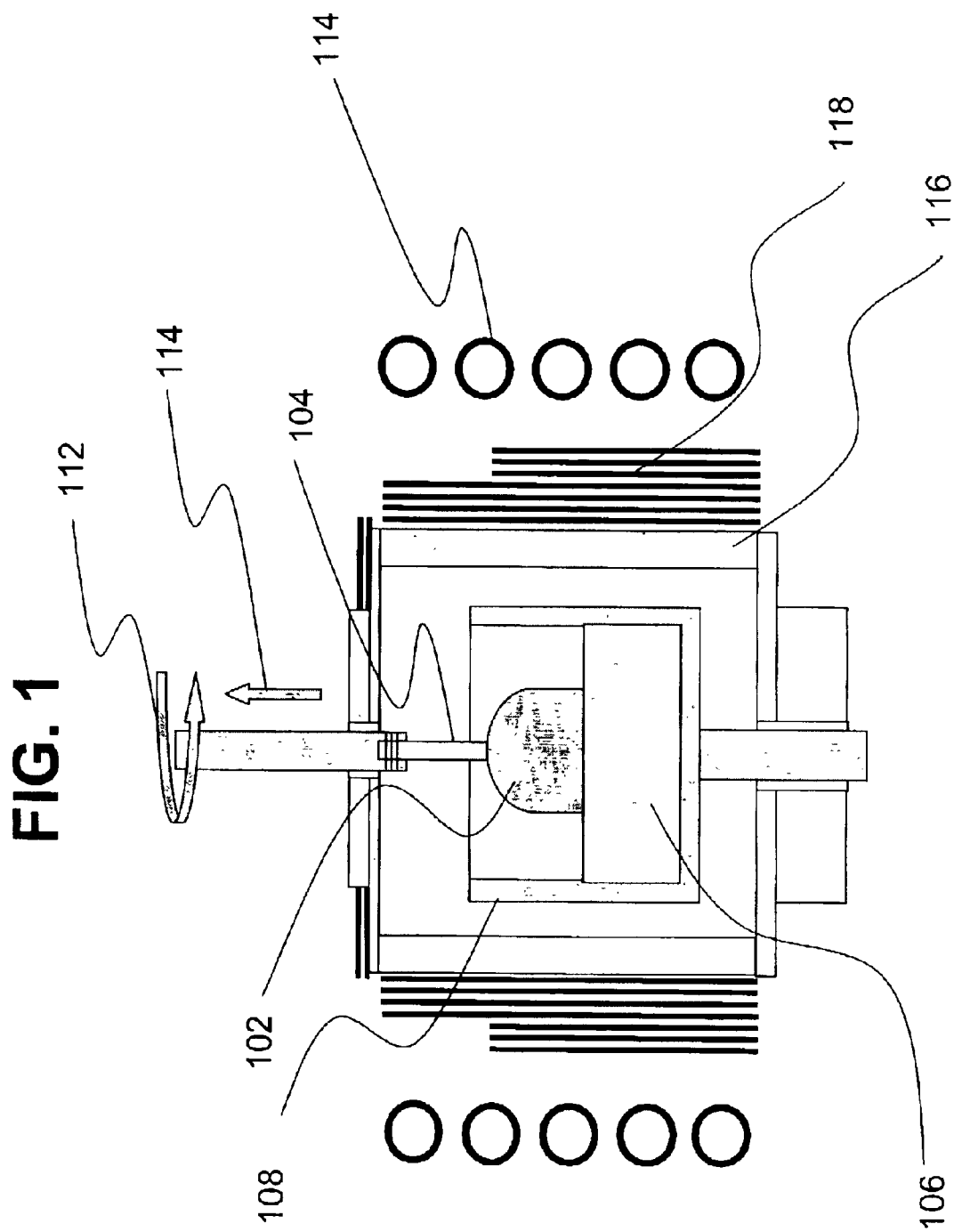
FIG. 1 is a schematic diagram of a Czochralski crystal growth method used in a preferred embodiment of the present invention for production of $Al_2O_3$ crystals.

It is advantageous to define several terms before describing the invention. It should be appreciated that the following definitions are used throughout this application.

Definitions

Where the definition of terms departs from the commonly used meaning of the term, applicant intends to utilize the definitions provided below, unless specifically indicated.

For the purposes of the present invention, the term "parts per million (ppm)" when referring to a compound that is part of a mixture prior to crystallization refers to the weight ratio of that compound to the weight of the mixture as a whole. For the purposes of the present invention, the term "parts per million (ppm)" when referring to an element present in a mixture prior to crystallization refers to the weight ratio of the compound or the molecule containing that element to the weight of the mixture as a whole. For example, if Mg is present in a mixture prior to crystallization at a concentration of 500 ppm and Mg is present in the mixture as MgO, MgO is present at a concentration of 500 ppm of the total weight of the mixture. For the purposes of the present invention, the term "parts per million (ppm)" when referring to an element present in a crystal refers to the weight ratio of the element to weight of the crystal as a whole. For example, if Mg is present in a crystal at 27 ppm, this indicates that the element Mg is present in the crystal at a concentration of 27 ppm of the total weight of the crystal.

For the purposes of the present invention, the term "absorption band in the region of" or "emission band in the region of" refers to an absorption or emission band having a peak in the appropriate region. Sometimes the region may be a particular wavelength and sometimes the region may include a range of wavelengths indicating a possible shift in a band peak position.

For the purposes of the present invention, the term "crystalline material" refers to the conventional meaning of the term "crystalline material", i.e. any material that has orderly or periodic arrangement of atoms in its structure.

For the purposes of the present invention, the term "defect" refers to the conventional meaning of the term "defect" with respect to the lattice of a crystal, i.e. a vacancy, interstitial, impurity atom or any other imperfection in a lattice of a crystal.

For the purposes of the present invention, the term "oxygen vacancy defect" refers to a defect caused by an oxygen vacancy in a lattice of a crystalline material. An oxygen vacancy defect may be a single oxygen vacancy defect, a double oxygen defect, a triple oxygen vacancy defect, or a more than triple oxygen vacancy defect. An oxygen vacancy defect may be associated with one or more impurity atoms or may be associated with an interstitial intrinsic defect such as misplaced interstitial oxygen atoms. Occupancy of an oxygen vacancy by two electrons gives rise to a neutral F-center, whereas occupancy of any oxygen vacancy by one electron forms an $F^+$-center. An $F^+$-center has a positive charge, with respect to the lattice. A cluster of oxygen vacancy defects formed by double oxygen vacancies is referred to as an $F_2$-type center. A cluster of oxygen vacancy defects formed by two $F^+$-centers and charge-compensated by two Mg-impurity atoms is referred to as a $F_2^{2+}$(2 Mg)-center.

For the purposes of the present invention, the term "F-type center" refers to any one of the following centers: F-center, $F^+$-center, $F_2^+$-center, $F_2^{++}$-center, $F_2^+$(2 Mg)-center, $F_2^{++}$(2 Mg)-center, etc.

For the purposes of the present invention, the term "color center" refers to the conventional meaning of the term "color center", i.e. a point defect in a crystal lattice that gives rise to an optical absorption of a crystal and upon light excitation produces a photon of luminescence. A color center, an impurity or an intrinsic defect in a crystalline material creates an unstable species. An electron localized on this unstable species or defect performs quantum transition to an excited state by absorbing a photon of light and performs quantum transition back to a ground state by emitting a photon of luminescence. In a preferred embodiment of the present invention, color centers are present in a concentration of about $10^{13}$ $cm^{-3}$ to $10^{19}$ $cm^{-3}$.

For the purposes of the present invention, the term "luminescence lifetime" or "fluorescence lifetime" refers to a time constant of an exponential decay of luminescence or fluorescence.

For the purposes of the present invention, the term "wide emission band" refers to an emission band that has full width at half maximum bigger than 0.1 eV and is a result of strong electron-phonon interaction. One example of a wide emission band is the wide emission band around 330 nm.

For the purposes of the present invention, the term "charge-compensated" refers to a defect in a crystal lattice that electro-statically compensates the electrical charge of another defect. For example, in a preferred embodiment of the present invention, Mg and C impurities may be used to charge-compensate one oxygen vacancy defect, two oxygen vacancy defects, a cluster of these defects, etc. comprising $F_2^{2+}(2\ Mg)$-centers.

For the purposes of the present invention, the term "substantially insensitive to room light" refers to a crystalline material that does not change significantly its coloration or concentration of electrons on traps (concentration of unstable species) under ambient light conditions.

For the purposes of the present invention, the term "capable of being used for long-term data storage" refers to a crystalline material that does not change significantly its coloration or concentration of electrons on traps (concentration of unstable species) at ambient temperatures.

For the purposes of the present invention, the term "photo-ionization cross-section" refers to a parameter having a dimension of $cm^2/J$ that determines how much light energy per unit area is required to perform photo-ionization of a color center. The larger the photo-ionization cross-section means less energy per unit area is required to perform ionization (recording of the bit).

For the purposes of the present invention, the term "fluorescence yield" refers to the parameter determined as a ratio of the number of photons emitted by a luminescent material to the number of photons absorbed by this fluorescent material.

For the purposes of the present invention, the term "highly reducing atmosphere" refers to the atmosphere with a low partial pressure of oxygen.

For the purposes of the present invention, the term "low partial pressure of oxygen" refers to the partial pressure of oxygen in the mixture of gases that is below $10^{-3}$ atm.

For the purposes of the present invention, the term "electron trap" refers to a structural defect in a crystal lattice able to create a localized electronic state and capable of capturing free electrons from a conduction band of the crystalline material.

For the purposes of the present invention, the term "hole trap" refers to a structural defect in a crystal lattice able to create a localized electronic state and capable of capturing free holes from a conduction band of the crystalline material.

For the purposes of the present invention, the term "deep trap" refers to an electron or hole trap having a thermal activation energy bigger than kT, where T is absolute temperature of the crystal and k is Boltzmann's constant.

For the purposes of the present invention, the term "efficient deep trap" refers to a deep trap which is capable of trapping electrons or holes and which has a sufficient capture cross-section.

For the purposes of the present invention, the term "multilevel optical data storage" or "multivalued optical data storage" refers to the ability of the data storage system to perform recording and reading of data from the same physical location in the media with a number of quantized data or signal levels more than two.

For the purposes of the present invention, the term "Czochralski method" refers to the well known Czochralski crystal growth technique described in such places as: Crystal Growth in Science and Technology, edited by H. Arendt and J. Hulliger, New York: Plenum Press, 1989; Y. A. Tatarchenko, Shaped Crystal Growth, Dordrecht/Boston/London: Kluwer Academic Publishers, 1993; the entire contents and disclosures of which are hereby incorporated by reference. The Czochralski method involves a formation of a single crystalline body by immersing a single crystal seed into a melt pool and then pulling it out of the melt with simultaneous rotation.

For the purposes of the present invention, the term "Stepanov method" refers to the well known Stepanov method described in such places as Crystal Growth in Science and Technology, edited by H. Arendt and J. Hulliger, New York: Plenum Press, 1989; Y. A. Tatarchenko, Shaped Crystal Growth, Dordrecht/Boston/London: Kluwer Academic Publishers, 1993; A. V. Stepanov, 1959, Zh. Tech. Fiz. 29, 339 (Transl. Soviet Phys.—JETP); and U.S. Pat. No. 4,915,773 to Kravetsky et al., the entire contents and disclosures of which are hereby incorporated by reference. The Stepanov method involves pulling a melt through the capillary channels of a shaping unit and solidifying it on the surface of the shaping unit to form single crystal fibers, rods, tubes or ribbons.

For the purposes of the present invention, the term "EFG method" or "Edge-defined Film-fed Growth method" refers to the well known EFG technique described in such places as: Crystal Growth in Science and Technology, edited by H. Arendt and J. Hulliger, New York: Plenum Press, 1989; Y. A. Tatarchenko, Shaped Crystal Growth, Dordrecht/Boston/London: Kluwer Academic Publishers, 1993; B. Chalmers, H. E. LaBelle, and A. J. Mlavsky, 1972, J. Crystal Growth 13/14, 84; U.S. Pat. No. 3,591,348 to LaBelle; and U.S. Pat. No. 3,915,662 to LaBelle; the entire contents and disclosures of which are hereby incorporated by reference. The EFG method is a variation of the Stepanov method, which may be used to grow shaped profiles (e.g., tubes, plates) from a thin film of a melt formed under an action of capillary forces.

For the purposes of the present invention, the term "directional freezing" refers to the well known directional freezing technique described in such places as Crystal Growth in Science and Technology, Edited by H. Arendt and J. Hulliger, New York: Plenum Press, 1989 Y. A. Tatarchenko, Shaped Crystal Growth, Dordrecht/Boston/London: Kluwer Academic Publishers, 1993, the entire contents and disclosures of which are hereby incorporated by reference.

Description

The need for high capacity and high transfer rate computer devices for massive data storage has stimulated a search for new types of media that are able to exist in two or more stable configurations. By transferring the storage media from one configuration into another, one may write and erase the bit of information, whereas by analyzing the configuration of the media the reading of the bit is realized. A large number of materials and techniques have been suggested for data storage and data processing, but only a few of these techniques have found a practical application. Because of the large number of requirements, it is extremely difficult to develop a media for optical data storage devices, which preferably meet all these requirements. The following articles, the contents and disclosures of which are hereby incorporated by reference, describe several of the techniques that have been attempted: International Symposium on Optical Memory and Optical Data Storage 2002, Technical Digest Publication of IEEE, Catalog #02EX552 (July 2002); Optical Data Storage 2001, Proceedings of SPIE, Vol. 4342 (2001); Optical Data Storage 2000, Proceedings of SPIE, Vol. 4090 (2000); International Symposium on Optical Memory and Optical Data Storage 1999, SPIE, Vol. 3864 (1999); Advanced Optical Data Storage: Materials, Systems, and Interfaces to Computers, Proceedings of SPIE, Vol.

3802 (1999); and K. Schwartz, The physics of optical recording, Springer-Verlag, Germany (1993), the entire contents and disclosures of which are hereby incorporated by reference.

Some of the most important requirements that data storage devices preferably meet are: an ability to repeatedly write, read, and erase the data ($>10^6$ cycles); a high density of bits per unit volume or area ($>10^{11}$ cm$^{-3}$); a high data transfer rate ($>10^7$ bit/s); a minimum access time ($<10^{-2}$ s); a long lifetime for the storage media and non-volatility of the information stored in the storage media; an environmental stability of media characteristics; safety of the stored data; and an ability to accomplish data error correction.

Several methods have been attempted to provide storage devices that might be able to compete with or replace conventional magnetic induction methods to achieve desirable characteristics. Among the methods attempted have been to use: magneto-optic and electro-optic effects (Pockels effect, Kerr effect, Faraday effect, photorefractive effect, etc.), the photochromic effect in dye polymers and inorganic crystals, and phase transformation in the storage media at the spot being heated with a laser beam. Some of these methods have been successfully realized and phase change media in the form of CD-RW and DVD-RW, and magneto-optical WREM discs and drives are already on the market, others like near-field, solid immersion lens recording, and atomic force microscopy are merely discussed, see Alternative Storage Technologies Symposium 2001, Monterey Calif., Jun. 26, 2001, the entire contents and disclosure of which is hereby incorporated by reference.

Most of the conventional techniques mentioned above that use 2D (thin film) media are approaching a fundamental limit of storage density caused by a minimum achievable focused laser light spot or in the case of magnetic recording by thermal instabilities of magnetic domain walls (super paramagnetic effect). The most promising way to overcome these limitations may be to use volumetric (3D-space) recording. Among 3D types of data storage, the types of data storage that have been investigated, most have been in the area of digital holography, see Holographic data storage, (eds.: H. J. Coufal, D. Psaltis, G. Sincerbox), Springer 2000, p. 488, and volumetric multilayer one-bit recording, see Confocal and Tow Photon Microscopy, Foundations, Applications, and Advances, (ed. Alberto Diaspro) Wiley-Liss, 2002, p. 567; the entire contents and disclosures of the above references are hereby incorporated by reference.

Several kinds of materials, such as photopolymers, photochromic materials and photorefractive crystals, have been proposed as possible recording media with a confocal detection scheme when one bit in the volume of the media may be written as a local refractive index change using two-photon absorption (2 PA) of a high peak-power short pulse laser beam and the recorded data is read by measuring the change in reflection of the read laser light, see U.S. Pat. No. 5,289,407 to Strickler, et al.; James H. Strickler, Watt W. Webb, Three-dimensional optical data storage in refractive media by two-photon point excitation, Optics Letters, Volume 16, Issue 22, 1780, November 1991; Y. Kawata, H. Ishitobi, S. Kawata, Use of two-photon absorption in a photorefractive crystal for three-dimensional optical memory, Optics Letters, Volume 23, Issue 10, 756–758, May 1998; A. Toriumi, J. M. Herrmann, S. Kawata, Nondestructive readout of a three-dimensional photochromic optical memory with a near-infrared differential phase-contrast microscope, Optics Letters, Volume 22, Issue 8, 555–557, April 1997; M. Ishikawa, Y. Kawata, C. Egami, O. Sugihara, N. Okamoto, M. Tsuchimori, O. Watanabe, Reflection-type confocal readout for multilayered optical memory, Optics Letters, Volume 23, Issue 22, 1781–1783, November 1998; A. Toriumi, S. Kawata, M. Gu, Reflection confocal microscope readout system for three-dimensional photochromic optical data storage, Optics Letters, Volume 23, Issue 24, 1924–1926, December 1998; Min Gu, Daniel Day, Use of continuous-wave illumination for two-photon three-dimensional optical bit data storage in a photo-bleaching polymer, Optics Letters, Volume 24, Issue 5, 288–290, March 1999; Yoshimasa Kawata, Takuo Tanaka, Satoshi Kawata. Randomly accessible, multilayered optical memory with a $Bi_{12}SiO_{20}$ crystal, Applied Optics-IP, Volume 35, Issue 26, 5308–5311, September 1996; Daniel Day, Min Gu, Andrew Smallridge, Use of two-photon excitation for erasable rewritable three-dimensional bit optical data storage in a photo-refractive polymer, Optics Letters, Volume 24, Issue 14, 948–950, July 1999; Y. Shen, J. Swiatkiewicz, D. I Jakubczyk, F. Xu, P. N. Prasad, R. A. Vaia, B. A Reinhardt, High-Density Optical Data Storage With One-Photon and Two-Photon Near-Field Fluorescence Microscopy, Applied Optics, Volume 40, No. 6, 938–940, February 2001; T. Wilson, Y. Kawata, S. Kawata, Readout of Three-Dimensional Optical Memories, Optics Letters, Volume 21, No. 13, 1003–1005, July 1996; H. Ueki, Y. Kawata, S. Kawata, Three-Dimensional Optical Bit-Memory Recording and Reading With a Photorefractive Crystal: Analysis and Experiment, Applied Optics, Volume 35, No. 14, 2457–2465, May 1996; Min Gu, Confocal Readout of Three-Dimensional Data Bits Recorded by the Photorefractive Effect Under Single-Photon and Two-Photon Excitation, Proceedings of the IEEE, Volume 87, No. 12, 2021–2029, December 1999, the entire contents and disclosures of which are hereby incorporated by reference.

One-bit micro-holograms were suggested as the way to increase bit reflectivity and signal-to-noise and carrier-to-noise ratio (SNR and CNR, respectively), see U.S. Pat. No. 6,322,931 to Cumpston, et al.; U.S. Pat. No. 6,322,933 to Daiber, et al.; H. J. Eichler, P. Kuemmel, S. Orlic, A Wappelt, High-Density Disk Storage by Multiplexed Microholograms, IEEE Journal of Selected Topics in Quantum Electronics, Volume 4, No. 5, 840–848, September/October 1998; Y. Kawata, M. Nakano, Suk-Chun Lee, Three-Dimensional Optical Data Storage Using Three-Dimensional Optics, Optical Engineering, Volume 40, No. 10, 2247–2254, October 2001, the entire contents and disclosures of which are hereby incorporated by reference.

Several types of photochromic materials have been proposed for 3D one-bit optical data storage: organic fluorescent dyes dispersed in a polymer matrix, which undergo chemical or structural conformation, diffusion and polymerization as a result of illumination. Two-photon absorption in fluorescent photopolymers and confocal detection schemes have also been used, see U.S. Pat. No. 5,325,324 to Rentzepis, et al.; D. A. Parthenopoulos and P. M. Rentzepis, Three-Dimensional Optical Storage Memory, Science, Vol. 245, pp. 843–845, 1989; Daniel Day, Min Gu, Effects of Refractive-Index Mismatch on Three-Dimensional Optical Data-Storage Density in a Two-Photon Bleaching Polymer, Applied Optics-IP, Volume 37, Issue 26, 6299–6304, September 1998; Mark M. Wang, Sadik C. Esener, Three-Dimensional Optical Data Storage in a Fluorescent Dye-Doped Photopolymer, Applied Optics, Volume 39, No. 11, 1826–1834, April 2000; E. P. Walker, X. Zheng, F. B. McCormick, H. Zhang, N.-H. Kim, J. Costa, A. S. Dvornikov, Servo Error Signal Generation for 2-Photon Recorded Monolithic Multilayer Optical Data Storage, Optical Data Storage 2000, Proceedings of SPIE Vol. 4090, pp.

179–184, 2000; H. Zhang, A. S. Dvornikov, E. P. Walker, N.-H. Kim, F. B. McCormick, Single Beam Two-Photon-Recorded Monolithic Multi-Layer Optical Disks, Optical Data Storage 2000, Proceedings of SPIE, Vol. 4090, pp. 174–178, 2000; Y. Zhang, T. D. Milster, J. Butz, W. Bletcher, K. J. Erwin, E. Walker, Signal, Cross Talk and Signal to Noise Ratio in Bit-Wise Volumetric Optical Data Storage, Technical Digest of Joint International Symposium on Optical Memory and Optical Data Storage, IEEE Catalog, No. 02EX552, pp. 246–248, 2002; E. P. Walker, W. Feng, Y. Zhang, H. Zhang, F. B. McCormick, S. Esener, 3-D Parallel Readout in a 3-D Multilayer Optical Data Storage System, Technical Digest of Joint International Symposium on Optical Memory and Optical Data Storage, IEEE Catalog, No. 02EX552, pp. 147–149, 2002; and Ingolf Sander (Constalation 3D, Inc.) Fluorescent multilayer technology, In: Alternative Storage Technologies Symposium 2001, Monterey Calif., Jun. 26, 2001, the entire contents and disclosures of which are hereby incorporated by reference.

Luminescent materials as data storage media are especially attractive because of their ability to realize multilevel (or multivalued) optical data storage. Luminescent response is proportional to the product of the energy deposited in the media during "writing" and "reading". If the concentration of defects undergoing electronic transition in the volume corresponding to one bit of information is large enough, then that element of the light-sensitive media may be used in a "gray scale" mode and the optical data storage system may be used as a multilevel (or multivalued) data storage system. The potential storage capacity is increased proportionally to the number of data levels reliably achieved. The total linearity of luminescent response may stretch over several orders of magnitude. Different logical states of the media may be represented by different intensities of the luminescent signal and digitized using thresholding electronic circuits. In practice, 10 levels of fluorescent intensity may be achieved by changing the energy or the time duration of the laser "writing" beam. An increased density of data storage is one of the main potential advantages of the luminescent techniques of the present invention.

Similar approaches to writing to and reading from a data storage media have been demonstrated in silver-doped photoluminescent glasses used in radiation dosimetry, see B. Lommler, E. Pitt, A. Scharmann, Optical creation of radio-photoluminescence centers in dosimeter glass by two photon absorption, Radiat. Prot. Dosim. Vol. 65, No. 1–4, pp. 101–104 (1996), the entire contents and disclosure of which is hereby incorporated by reference. Two-photon UV excitation ("writing") produced a photoluminescence signal that may be repeatedly "read" with the same laser, but at lower power, without measurable erasure of information. How to "erase" the data in this case without heating the media is not clear. Complications may also be caused by the long-term process of diffusion and luminescent center transformation that lead to a "build-up" of luminescent signal.

The probability of two-photon absorption is proportional to a square of laser light intensity. Two-photon absorption allows one to perform photo-ionization or photo-transformation of a photosensitive medium only in the vicinity of a tightly focused laser beam without affecting the surrounding volume of the material. The size of one three-dimensional bit or voxel written using 2 PA may be made as small as 1×1×3 $\mu$m. To read the recorded bits, one-photon-induced fluorescence or reflection of a CW laser beam having a much lower intensity and confocal detection scheme was used. Confocal detection allows one to significantly reduce cross-talk between adjacent bits and tracks and to achieve a desirable signal-to-noise ratio (SNR). Extremely high storage density of up to 10 Tbits/in$^3$ is expected.

Most of the problems with the various storage media described above have been related to inadequate material properties. Most of the photopolymers suggested for one-bit or holographic data storage show high sensitivity but exhibit strong dimensional shrinkage. Most of the photo-sensitive polymers may be used only as WROM media (write once, read many times), whereas rewritable photopolymers are still unstable and show significant fatigue when write-read cycles are repeated many times. Even write-once fluorescent photopolymers show strong reduction of fluorescent output signals when read repeatedly. An additional obstacle for most suggested photopolymers and photorefractive crystals tested for volumetric one-bit recording is a necessity of using a femto-second high peak power Ti-sapphire laser to achieve efficient two-photon absorption, because a Ti-sapphire laser is big, expansive and suitable only for laboratory demonstration.

Therefore, providing an efficient and stable inorganic photochromic fluorescent material that may be used for one-bit optical recording and reading is an objective of the present invention.

The low thermal energy depth of the traps responsible for capturing electrons produced by ionization with the laser light during writing causes thermally stimulated release of electrons from traps at ambient temperatures and fading of the stored data. This is generally not acceptable, especially for multivalued storage, which requires precise digitization of the analog luminescent signal. Furthermore, the chemical instability of some luminescent materials and their sensitivity to oxidization and humidity when contacted with air require the use of protective layers. In some organic fluorescent materials, dimensional stability is a significant problem because of material shrinkage as a result of photochemical transformation and polymerization.

Electronic transitions in solids caused by light excitation with relaxation times on the order of $10^{-12}$ to $10^{-9}$ s are fundamentally very fast and are considered among the most promising quantum systems for massive optical data storage. Luminescence decay time after a pulse of laser stimulation determines the time needed for retrieval of each bit of information and the maximum achievable data transfer rate.

To achieve more stable and reliable data storage and optical processing, one should use chemically, mechanically and thermally stable luminescent materials with deep traps and luminescent centers. To produce such deep centers, one needs to use a wide gap dielectric. Furthermore, these "thermally" and "optically" deep traps require a shorter wavelength of laser light for excitation ("writing"), stimulation ("reading") and restoration ("erasing"). For optical recording, the minimum light spot diameter is equal to: d≈0.5λ/NA, where NA is the numerical aperture of the optical head. Therefore, blue and UV lasers have a clear advantage against IR lasers for achieving higher storage densities. The latest developments in blue and UV solid state lasers, based on heterostructures of wide gap semiconductors like GaAlN create a real possibility for use of materials with wide energy gaps.

Electron trapping materials and the technique of optically stimulated luminescence (OSL) are considered among the most promising quantum systems for massive optical data storage and optical computing, for parallel image processing and realization of the artificial neural networks able to solve complex problems with simple algorithms.

The OSL materials to be used in optical data storage and optical processing should contain a high concentration of electron or hole traps and recombination centers with precisely desirable characteristics. An initial configuration of light sensitive media is considered as having been in a "ground" or logical "0" value. By illumination with the laser light ("write" beam") of the appropriate photon energy $hv_1$, that is high enough to ionize the crystal (band-to-band transition in narrow-gap semiconductors) or able to ionize only the impurity centers or the intrinsic defects, one may produce free charge carriers (electron or holes) to be trapped in pre-existing electronic defects. If the traps are deep enough to store the charge carriers for a long time at ambient temperature without being thermally released, one has the quantum system in the "exited" or "charged" metastable configuration (this state may be assigned to logical "1" value, where as an empty trap corresponds to a logical "0" value). To "read" the data, the stimulation light of another photon energy $hv_2$ is preferably applied. There are several options to "read" the data and these options depend on the type of the luminescent material.

The photon of energy $hv_2$ corresponds to the optical depth of the filled traps. The result is an ionization of the trap and creation of the free charge carrier that is able to recombine at one of the existing luminescent centers that were ionized during a "write" stage of the process. Luminescent photon of energy $hv_3$ may be detected, which indicates a "flip-flop" of the quantum system. Photon energy $hv_3$ in most cases is specific to particular type of the luminescent centers and corresponds to the radiative intracenter transitions. Radiative decay time of this transition is of great importance for the fast reading of data.

If the recombination centers in luminescent material are not radiatively efficient, additional luminescent centers (so called "co-activators") spatially correlated with the recombination centers may be introduced and resonant energy transfer followed by the radiative transitions in "co-activator" takes place. Ions of transition and rare earth metals are often used as the dopants to the luminescent materials.

The photon of energy $hv_2$ corresponds to the optical transition of the trapped electron into an excited state from which tunneling to the excited state of the nearest luminescent center may occur followed once again by the radiative transition with emission of the photon of energy $hv_3$. As in the previous case, traps and luminescent centers have to be spatial correlated and no free charge carriers are created during laser stimulation.

In general, the rise time of luminescence under pulse of stimulation light and luminescence decay time after the stimulation is off, will determine the time needed for retrieval of each bit of information. If the concentration of electrons in traps after application of the stimulation light remains large enough, then that element of the light-sensitive media may still be considered as an "excited", unerased state. To "erase" completely the information from the elementary volume, stimulation with light of higher energy or longer duration is necessary. By minimizing the volume of the media corresponding to one bit of information and by optimizing the light detection system one may achieve an extremely high density of data storage and a high data transfer rate.

Use of II–VI compounds such as CaS and SrS doped with rare earth elements like Ce, Sm, Eu and La has been described. These materials have a narrow energy gap (about 4.5 eV) and shallow traps with optical depths of 1–1.2 eV ($\lambda \approx 1$ $\mu$m). To fill the traps, blue "write" light with the wavelength 450–500 nm is used. To "read" the data, optical stimulation in broadband with the maximum near 1 $\mu$m is used. An emission band of luminescence of one of the best OSL materials, CaS:Sm,Ce, has a maximum at 630 nm and does not overlap with the excitation or stimulation bands. Sulfide based phosphors have a fast decay time of luminescence (5–50 ns) which allows one to achieve a data transfer rate of about 200 Mbit/s$^{-1}$, see P. Goldsmith, J. Lindmayer and C Wrigley. Electron trapping. A new approach to rewritable optical data storage, In: Optical Data Storage Meeting proceedings, SPIE Vol. 1316, 312–320, (1990), the entire contents and disclosure of which is hereby incorporated by reference. This is achieved with low laser powers for "writing" (0.1 mW), "reading" (0.2 mW) and "erasing" (2 mW) the data. The ionization of luminescent centers ("writing") may be produced with the visible wavelengths (450–520 nm). Stimulation of luminescence ("reading") may be produced with IR laser diodes ($\lambda$=830–1000 nm). The luminescent emission band matches well with the region of sensitivity of Si photodetectors and CCD cameras. Finally, the possibility of creating crystalline thin (1–5 $\mu$m) films of luminescent material on transparent substrates without considerable loss in luminescent output in comparison with the ceramic and powder-layer phosphors has been demonstrated.

Other electron trapping materials like alkaline halide KCl:Eu, BaFBr:Eu, KBr:In and LiF have been suggested for optical memory and optical computing utilizing OSL. Although various luminescent materials and their applications in radiation dosimetry, archeological and geological dating have been known for a long time, see Zhang, A. S. Dvornikov, E. P. Walker, N. H. Kim, F. B. McCormick, Single Beam Two-Photon-Recorded Monolithic Multi-Layer Optical Disks, Optical Data Storage 2000, Proceedings of SPIE, Vol. 4090, pp. 174–178, 2000, the properties of such materials prior to the present invention did not fit within applications for optical data storage.

Another approach to optical data storage was demonstrated in silver-doped photoluminescent glasses used for radiation dosimetry, see Zhang, T. D. Milster, J. Butz, W. Bletcher, K. J. Erwin, E. Walker, Signal, Cross Talk and Signal to Noise Ratio in Bit-Wise Volumetric Optical Data Storage, Technical Digest of Joint International Symposium on Optical Memory and Optical Data Storage, IEEE Catalog, No. 02EX552, pp. 246–248, 2002, the entire contents and disclosure of which is hereby incorporated by reference. Two-photon UV excitation ("writing") produces a photoluminescence signal that may be repeatedly "read" with the same laser, but at lower power, without measurable erasure of information. How to "erase" the data in this case without heating the media is not clear. Complications are also caused by the long-term process of diffusion and luminescent center transformation that lead to a "build-up" of luminescent signal.

3D holographic media promises an extreme density of data storage exceeding 1 TB per cm$^3$ and the highest possible data transfer rate in excess of 10 Gbit/s. Holographic data storage technology is under development already for 40 years, and the main obstacle is still the absence of a media that satisfies numerous important requirements. See S. Orlov, Volume Holographic Data Storage, Communications of the ACM, Vol. 43, No. 11, pp. 47–54, November 2000; M. A. Noginov, G. B. Loutts, S. W. Helzer, A. Booker, B. Lucas, D. Fider, R. M. Macfarlane, and R. M. Shelby, Two Color Holographic Recording Scheme Allowing Nonvolatile Reading in Mn:YAlO$_3$, Applied Optics, Vol. 40, No. 23, pp 3915–3921, August 2001; M. A. Noginov, N. Noginova, M. Curley, N. Kukhtarev, H. J. Caulfield, P. Venkateswarlu, Optical Characterization of Mn:YAlO$_3$: Material for Holographic Recording and Data Storage, Optical Society of America, Vol. 15, No. 5, pp. 1463–1468, May 1998; M. P. Bernal, H. Coufal, R. K. Grygier, J. A. Hoffnagle, C. M. Jefferson, R. M. Macfarlane, R. M. Shelby, G. T. Sincerbox, P. Wimmer, and G. Wittmann, A Precision Tester for Studies Of Holographic Optical Storage Materials and Recording Physics, Applied Optics, Vol. 35, No. 14, pp. 2360–2374, May 1996; H. Guenther, R. Macfarlane, Y. Furukawa, K. Kitamura, and R. Neurgaonkar, Two-Color Holography in Reduced Near-Stoichiometric Lithium Niobate, Applied Optics, Vol. 37, No. 32, pp. 7611–7623, November 1998; Mark D. R, David P. West, K. Khand, J. D. Shakos, and R. M. Shelby, Digital Holographic Data Storage in a High-Performance Photorefractive Polymer Composite, Applied Optics, Vol. 40, No. 20, pp. 3395–3401, July 2001; L. Hesselink, S. S. Orlov, A. Liu, A. Akella, D. Lande, R. R. Neurgaonkar, Photorefractive Materials for Nonvolatile Volume Holographic Data Storage, Science, Vol. 282, pp. 1089–1094, November 1998; J. F. Heanue, M. C. Bashaw, L. Hesselink, Volume Holographic Storage and Retrieval of Digital Data, Vol. 265, pp. 749–752, August 1994; H. Blume, T. Bader, and F. Luty, Bi-Directional Holographic Information Storage Based on the Optical Reorientation of F$_A$ Centers in KCl:Na, Optics Communications, Vol. 12, No. 2, pp. 147–151, October 1974; I. Schneider, W. C. Collins, M. J. Marrone, and M. E. Gingerich, Holographic Subtraction Using Anisotropic Centers in Alkali Halide Crystals, Applied Physics Letters, Vol. 27, No. 6, pp. 348–350, September 1975; K. E. Peiponen, P. Silfsten, and P. Raerinne, Ruby Laser-Induced Dichroism of F$_A$(II) Centers in KCl:Li Crystals, J. Appl. Physics, Vol. 70, No. 5, pp 2883–2884, September 1991; H. M. Smith, Holographic Recording Materials, Springer-Verlag Berlin Heidelberg, New York, 1977, the entire contents and disclosures of which are hereby incorporated by reference. Some of main requirements for holographic media are: high diffraction efficiency, high sensitivity to writing laser light, non-destructive reading, ability to perform optical erasure, thermal stability of information, low environmental light sensitivity, high optical quality and dimensional stability (no shrinkage). The Al$_2$O$_3$ material according to the current invention satisfies many of these requirements.

The low energy depth of the traps responsible for the accumulation of the charge carriers leads to the thermally stimulated release of electrons at ambient temperatures and to fading of the stored data. This is not acceptable, especially for multilevel data storage, which requires precise digitizing of the analog luminescent signal. Furthermore, the chemical instability and sensitivity to oxidization and humidity when contacted with air require the use of protection layers.

To achieve more stable and reliable data storage and optical processing, one should have luminescent materials with deeper traps and luminescent centers. To produce such deep traps, one needs to use wide gap dielectrics. Furthermore these "thermally" and "optically" deep traps require shorter wavelengths of laser light for excitation ("writing") and stimulation ("reading" and "erasing"). For optical recording, the minimum light spot diameter is equal to: d≈0.5λ/NA, where NA is the numerical aperture of the optical head. Therefore, blue and UV lasers have a clear advantage against IR lasers for achieving higher storage densities. The latest developments in blue and UV solid state lasers, based on heterostructures of wide gap semiconductors like GaAlN create a real possibility for use of materials with wide energy gaps.

Optically Stimulated Luminescence is initiated by the absorption of photons by the trapped charge carriers, with the subsequent recombination of the excited charge at recombination sites of opposite polarity. The intensity of the process depends on the fluence rate of the read light$\phi$, the concentration of trapped charge carriers n, and the photo-ionization cross-section $\sigma$ of the trapped electrons, thus:

$$I = \phi \sigma dn/dt$$

By increasing the concentration of filled traps and producing traps with large photo-ionization cross-sections, one may improve the light output of the luminescent media and decrease the power of the laser needed to "read" the stored information. Similarly, one may reduce the energy needed to "write" the signal by having a material with a large concentration of donors, which are easily ionized by the "write" beam because of a high absorption coefficient, and by dealing with a large concentration of traps with large capture cross-sections for efficient storage of information.

OSL is successfully used as a method of radiation dosimetry in geological and archeological dating of minerals and pottery, see D. J. Huntley, D. L. Godfrey-Smith and M. L. W. Thewalt, Optical Dating of Sediments, Nature, vol. 313, pp. 105–107 (1985), L. Botter-Jensen and S. W. S. McKeever, Optically stimulated Luminescence Dosimetry Using Natural and Synthetic Materials, Radiation Prot. Dosim., Vol. 65, No. 1–4, pp. 273–280 (1996), the entire contents and disclosures of which are hereby incorporated by reference. Recently a new pulsed-OSL technique for radiation dosimetry using anion deficient Al$_2$O$_3$ in which the laser stimulation is pulsed and the OSL is measured after each pulse has been developed and is commercially implemented in LUXEL technology by Landauer Inc. See, U.S. Pat. No. 5,892,234 to McKeever, et al., U.S. Pat. No. 5,962,857 to McKeever, et al., and International Publication Number WO 98/12575 Mar. 26, 1998, M. S. Akselrod and S. W. S. McKeever, A Radiation Dosimetry Method Using Pulsed Optically Stimulated Luminescence, Radiat. Prot. Dosim. v. 81, No 3, 167–176 (1999), S. W. S. McKeever, M. S. Akselrod and B. G. Markey, Pulsed Optically Stimulated Luminescence Dosimetry Using Alpha-Al$_2$O$_3$:C, Radiat. Prot. Dosim., 65(1–4), pp 267–272 (1996), M. S. Akselrod, A. C. Lucas, J. C. Polf and S. W. S. McKeever, Optically Stimulated Luminescence of Al2O3, Radiat. Measurements, v.5, p. 21 (1998), the entire contents and disclosures of which are hereby incorporated by reference.

Luminescent materials comprising Al$_2$O$_3$ and an OSL technique are also used for imaging of radiation fields. See U.S. Pat. No. 6,316,782 to Akselrod, et al., and M. S. Akselrod, N. Agersnap Larsen and S. W. S. McKeever, A procedure for the Distinction between Static and Dynamic Radiation Exposures of Personal Radiation badges Using Pulsed Optically Stimulated Luminescence, Radiat. Measurements, v. 32, p. 215–225 (2000), the entire contents and disclosures of which are hereby incorporated by reference.

Studies of the OSL signal from Al$_2$O$_3$:C have shown it to be thermally stable and reproducible, with the detection of radiation gamma doses of 1 $\mu$Gy possible. Optical bleaching may be used to "erase" the information from the material and to make it ready for the next use.

Corundum or sapphire ($\alpha$-Al$_2$O$_3$) is an important technological material in many optical and electronic applications. It is used as a host material for solid-state lasers, as optical windows, as a substrate material in semiconductor epitaxial growth and, more recently, as a radiation detector. These principles have been exploited in the various forms of α-$Al_2O_3$, which was introduced as thermoluminescent dosimeter (TLD) of radiation since the early 1950's, including Ti-doped $Al_2O_3$, see J. K. Rieke and F. Daniels, Health Phys., Vol. 13, p. 798 (1954), W. G. Buckman, Aluminum oxide thermoluminescence properties for detecting radiation, Health Phys. Vol. 22 p. 402, (1972), R. S. McDougall and S. Rudin, Thermoluminescent dosimetry of aluminum oxide, Health Physics, Vol. 19, pp. 281–283, (1970), and $Al_2O_3$ doped with Si and Ti, see W. G. Buckman, Aluminum oxide thermoluminescence properties for detecting radiation, Health Phys. Vol. 22, p. 402, (1972), Mg and Y, see R. S. McDougall and S. Rudin, Thermoluminescent dosimetry of aluminum oxide, Health Physics, Vol. 19, pp. 281–283, (1970), Cr, see S. K. Mehta and S. Sengupta, Gamma dosimetry using $Al_2O_3$:Si,Ti thermoluminescent phosphor, Phys. Med. Biol., 1976, Vol. 21, No 6, p. 955, or Cr and Ni, see M. Osvay and T. Biro, Nucl. Instr. Meth., Vol. 175, p.60 (1980); D. Lapraz, P. Iacconi, Y. Sayady, P. Keller, J. Barthe and G. Portal, Some thermoluminescence of an α-$Al_2O_3$ sample, Phys. Stat. Sol. (a), Vol. 108, pp. 783–794, (1988), the entire contents and disclosures of all the above documents are hereby incorporated by reference.

However, aluminum oxide was not sensitive enough as a luminescent material until the introduction of carbon-doped α-$Al_2O_3$:C. $Al_2O_3$:C was developed first as an ultra-sensitive TLD in the late 1980's, see M. S. Akselrod, V. S. Kortov, D. J. Kravetsky, V. I. Gotlib, Highly Sensitive Thermoluminescent Anion-Defective α-Al2O3:C Single Crystal Detectors, Radiat. Prot. Dosim., Vol. 32(1), pp. 15–20 (1990), M. S. Akselrod and V. S. Kortov, Thermoluminescent and Exoemission Properties of New High-Sensitivity TLD α-$Al_2O_3$:C Crystals, Radiat. Prot. Dosim., Vol. 33 No. 1–4, pp. 123–126 (1990), M. S. Akselrod, V. S. Kortov, and E. A. Gorelova, Preparation and properties of $Al_2O_3$:C, Radiat. Prot. Dosim., Vol. 47, No. 1–4, pp. 159–164 (1993), Akselrod M. S. and Gorelova E. A., Deep Traps in Highly Sensitive α-$Al_2O_3$:C TL Crystals, Nucl. Tracks Radiat. Meas., Vol. 21, No. 1, pp. 143–146 (1993), the entire contents and disclosures of which are hereby incorporated by reference, and is considered as the most sensitive dosimetric material used with newly developed optically stimulated luminescent (OSL) technology, see U.S. Pat. No. 5,892,234 to McKeever, et al., U.S. Pat. No. 5,962,857 to McKeever, et al., U.S. Pat. No. 6,316,782 to Akselrod, et al., U.S. Pat. No. 6,414,324 to Colyott, et al. and S. W. S. McKeever, M. S. Akselrod and B. G. Markey, Pulsed Optically Stimulated Luminescence Dosimetry Using Alpha-$Al_2O_3$:C, Radiat. Prot. Dosim. 65(1–4), pp. 267–272 (1996), the entire contents and disclosures of which are hereby incorporated by reference. It has the linearity of light output as a function of radiation dose of 7 orders of magnitude with no fading of the information due to the respectively deep traps and extremely good environmental stability. In spite of excellent dosimetric properties of carbon-doped $Al_2O_3$ with oxygen vacancies, the luminescent centers in this material (F-centers) have a very long luminescence lifetime (35 ms). It is unacceptable for OSL or fluorescent one-bit recording applications requiring a high data transfer rate. Known $Al_2O_3$ materials also do not have absorption bands that may undergo photochromic transitions suitable for holographic data storage applications.

With respect to $Al_2O_3$ crystalline material of the present invention, important features of the present invention are the electronic and optical properties of a storage phosphor, its defect structure and technology of its production in the form of single crystals, thin films or powders. The $Al_2O_3$ crystalline material of the present invention has color centers absorbing light, stable traps of electrons and holes and its luminescent centers have a short luminescence lifetime. The material claimed in the present invention is formed during a crystal growth process or other high temperature synthesis in a highly reducing atmosphere and is facilitated by doping of aluminum oxide with magnesium (Mg), carbon (C), and hydrogen (H) impurities.

In one preferred embodiment of the present invention, the crystal growth of an $Al_2O_3$ crystal is performed using Czochralski method. The crystal growth of an $Al_2O_3$ material of the present invention also may be performed using any other standard method of crystal pulling from the melt, like the Stepanov technique, EFG or directional freezing, etc. The Czochralski method, as used in a preferred embodiment of the present invention, as shown in FIG. 1, involves the formation of a single crystalline body 102 by immersing a single crystal seed 104 into a melt pool 106 contained in crucible 108 and then pulling crystal seed 104 out of a melt 110 with simultaneous rotation 112. Heating of crucible 108 is performed using induction heating though direct electro-magnetic coupling of crucible 108 to an inductor coil 114 or by heating the conductive susceptor 116 isolated from the inductor coil 114 by heat isolation 118.

The crystal growth of $Al_2O_3$ is performed at the temperature around the crystallization point of about 2010 to 2090° C. Exact crystallization temperature depends on impurity content of the melt and of the crystal. Preferably the crystal growth is performed at 2050° C.

Crystal growth of $Al_2O_3$ crystals with oxygen vacancy defects is performed in a highly reducing atmosphere in the presence of hot graphite with the purpose of obtaining low partial pressure of oxygen in the range of $10^{-3}$–$10^{-20}$ Pa in the atmosphere of the furnace. To obtain a high concentration of oxygen vacancy defects in the $Al_2O_3$ crystal structure, the preferred partial pressure of oxygen should be below $10^{-10}$ Pa and even more preferred to be below $10^{-15}$ Pa.

Preferably, the crystallization of the $Al_2O_3$ crystal is conducted at a pulling rate of about 0.1 mm/hour to 600 mm/hour and more preferably at a pulling rate of about 1 to 10 mm/hour. Preferably the crystallization is performed with the seed rotation about 1 to 50 rpm. In a particularly preferred embodiment of the present invention, the crystallization is performed at a temperature of 2050° C. with a pulling rate of 5 mm/hour and seed rotation of 10 rpm.

Preferably, the Mg doping material added to the $Al_2O_3$ base material is a Mg compound. One preferred Mg compound is MgO, which may be added to the $Al_2O_3$ base material in the form of MgO powder or as a single crystal of MgO. When MgO is used as the Mg doping material, the amount of MgO adding to the $Al_2O_3$ base material comprises 2 ppm to 5,000 ppm of the amount of $Al_2O_3$ base material by weight, with the preferred concentration between 100 and 1000 ppm and even more preferred concentration of 550 ppm. Another preferred Mg compound is $MgAl_2O_4$, which may be added to the $Al_2O_3$ base material as $MgAl_2O_4$ spinel polycrystalline powder or as a $MgAl_2O_4$ crystal. Preferably, when $MgAl_2O_4$ is used as the Mg doping material, the $MgAl_2O_4$ doping material comprises 4 ppm to 10,000 ppm of the amount of $Al_2O_3$ base material by weight with a more preferred amount from 200 to 2000 ppm and even more preferred amount of 800 ppm.

Figure 2:
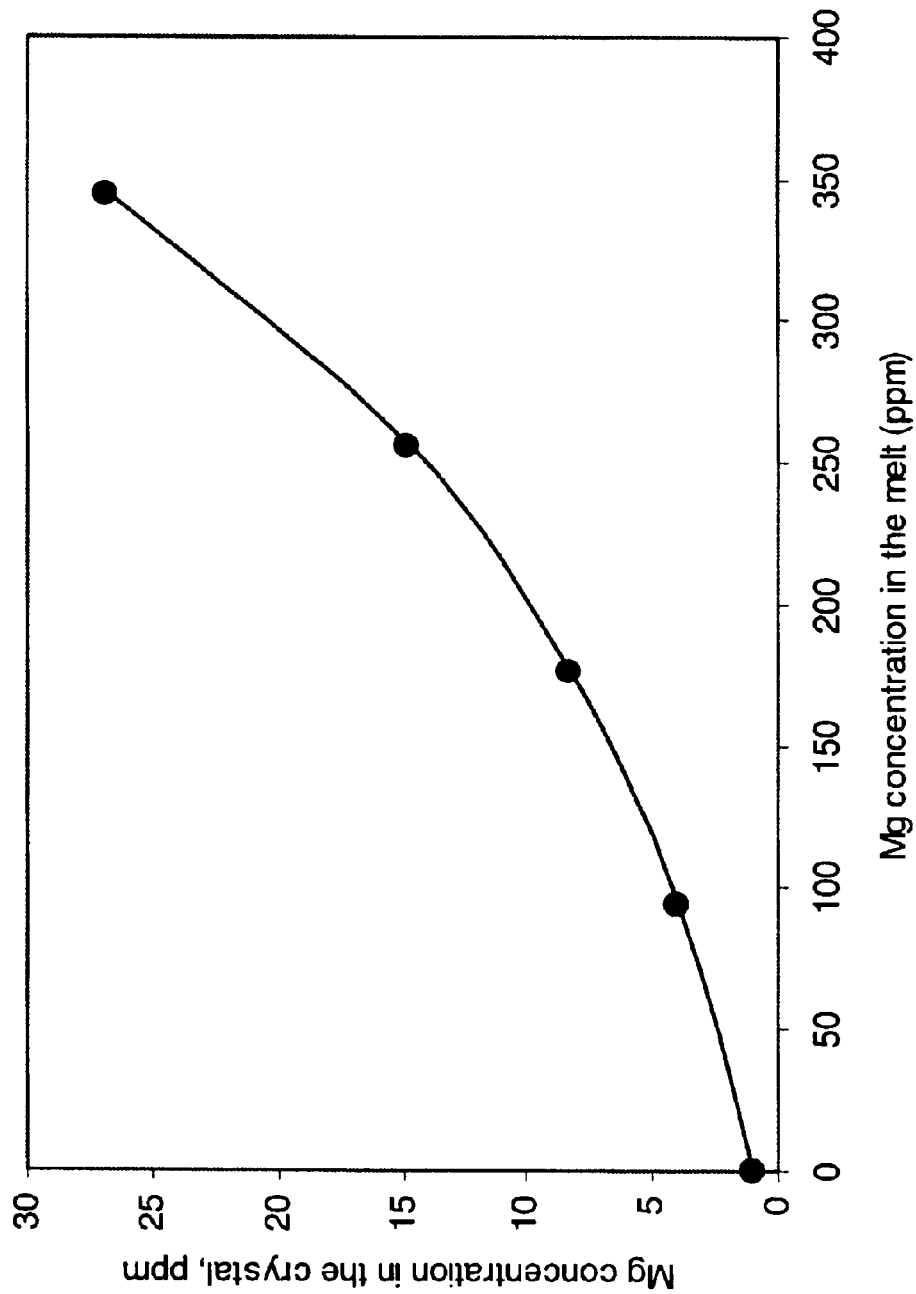
FIG. 2 is a graph illustrating the difference between the concentration of Mg impurity in the doped $Al_2O_3$ melt and in the grown crystal.

The concentration of Mg dopant in a grown $Al_2O_3$ crystal according to an embodiment of the present invention is different from the concentration of a Mg-containing compound added to the mixture before the process and from the concentration of Mg in the melt. The results of chemical analysis performed using an atomic absorption technique of several $Al_2O_3$:C,Mg crystals grown with different amounts of Mg added to the mixture are shown in FIG. 2. The coefficient of segregation that is the ratio of concentrations of impurity in the melt and in the grown crystal varies from 12 to 25. It is important to emphasize the big difference between the concentration of the Mg in the melt and in the grown crystal. The useful range of concentration of Mg-impurity in the crystal that allows one to obtain $Al_2O_3$ single crystals of acceptable optical quality is between 1 and 100 ppm. The preferred range of Mg concentration is about 10 to 40 ppm with an even more preferred concentration of 27 ppm.

A second dopant, carbon, is preferably added into the $Al_2O_3$ melt before starting the pulling process by dissolving carbon monoxide in the $Al_2O_3$ melt. Carbon stimulates creation of oxygen vacancy defects and deep traps. Carbon impurity is also believed to be responsible for the formation of electron traps that are used in the present invention to store the information.

A third dopant, hydrogen, is preferably added into the $Al_2O_3$ melt before starting the pulling process by dissolving hydrogen gas in the $Al_2O_3$ melt. Additional doping with hydrogen minimizes the concentration of shallow traps in the material of the present invention and improves the speed and efficiency of write/read operations.

Carbon monoxide gas, hydrogen gas or both carbon monoxide gas and hydrogen gas may be added sequentially to argon or any other inert gas atmosphere of the crystal growth furnace. The amount of carbon monoxide added to the furnace is preferably in the range from 2 ppm to 50,000 ppm based on the amount of argon in the gas atmosphere of the furnace. The preferred range of carbon monoxide is in the range of 1000 ppm and 15,000 ppm with a more preferred value of 8800 ppm. The amount of hydrogen added to the atmosphere of the furnace is usually in the range from 100 ppm to 10,000 ppm with the preferred range from 500 to 2,000 ppm and even more preferred value of 1,200 ppm.

In a preferred embodiment of the present invention, carbon is present in the crystalline material after the crystallization is complete in a quantity of between 0.5 to 20 ppm of the base material by weight, more preferably between 1 to 10 ppm of the base material by weight and even more preferably at 6 ppm.

In yet another preferred embodiment of the present invention, H is present in the crystalline material after crystallization in a quantity of between 1 to 100 ppm of the base material by weight, more preferably between 5 to 20 ppm of the base material by weight, and even more preferably at 8 ppm.

Mg and C may be added to the $Al_2O_3$ base material either sequentially or simultaneously. In a preferred embodiment, Mg is added to an $Al_2O_3$ base material to form a Mg—$Al_2O_3$ mixture, a Mg—$Al_2O_3$ melt from the Mg—$Al_2O_3$ mixture; and CO is dissolved in the melt to form the twice doped material.

In a preferred embodiment, the crystallization step of a method of the present invention is carried out in an induction heating furnace using a hot graphite succeptor coupled to an inductor of the induction-heating furnace to melt $Al_2O_3$:C, Mg mixture and to solidify the $Al_2O_3$—Mg.C mixture using one of the known crystal growth techniques.

In one preferred embodiment, the present invention provides a method for making an $Al_2O_3$:C,Mg crystalline material comprising the steps of: doping a base material comprising $Al_2O_3$ with a first dopant comprising magnesium and a second dopant comprising carbon to form a twice doped material; and crystallizing the twice doped material in a highly reducing atmosphere in order to form the crystalline material. The crystalline material so formed includes a number of one or more types of oxygen vacancy defects.

In another preferred embodiment, the present invention provides a method for making an $Al_2O_3$:C,Mg,H crystalline material comprising the steps of: doping a base material comprising $Al_2O_3$ with a first dopant comprising magnesium, a second dopant comprising carbon to form a twice doped material; doping the twice doped material with hydrogen to form a thrice doped material; and crystallizing the thrice doped material in a highly reducing atmosphere in order to form the crystalline material. The crystalline material so formed includes a number of one or more types of oxygen vacancy defects.

Preferably, the crystallization of the thrice doped material of $Al_2O_3$:C,Mg,H with 800 ppm of $MgAl_2O_4$ spinel added to the starting mixture and with 8,800 ppm of carbon monoxide and 1200 ppm of hydrogen added to the argon atmosphere of the furnace. In a particularly preferred embodiment of the present invention, the crystallization of the thrice doped material may be performed at an oxygen partial pressure of $10^{-20}$ atm, at a temperature of 2050° C. with a pulling rate of 5 mm/hour and seed rotation of 10 rpm.

Preferably the crystalline material so formed has optical absorption bands at 205, 230, 255 and 335 and 435 nm. Preferably the crystalline material emits luminescent light in the wide emission bands around 330±5 nm with a luminescent lifetime shorter than 5 ns, in yet another emission band around 520±10 nm with a luminescence lifetime of 9±1 ns, and yet another emission band around 750±10 nm with a luminescence lifetime of 80±10 ns.

A preferred compound for use as the second dopant for the thrice doped material is CO, preferably CO gas.

A preferred material for use as the third dopant for the thrice doped material is hydrogen gas.

Yet another way of obtaining $Al_2O_3$ material with oxygen vacancy defects, for example in thin film form, is realized by thermal treatment of $Al_2O_3$ material in a highly reducing atmosphere. The thin films are obtained first by electron beam sputtering of an $Al_2O_3$ target on molybdenum substrate and the oxygen vacancy defects are obtained by heating of a thin film on the substrate in a highly reducing atmosphere at a partial oxygen pressure of $10^{-10}$–$10^{-20}$ Pa and temperature above 1200° C. The preferred temperature for creation of oxygen vacancies is from 1900 to 2000° C. Time for thermal treatment may vary from 1 s during a laser heating procedure up to several hours in the radiative type furnace depending on the thickness of processed material. The preferred time for a film having 10 $\mu$m thickness is from 2 to 30 min.

Figure 3:
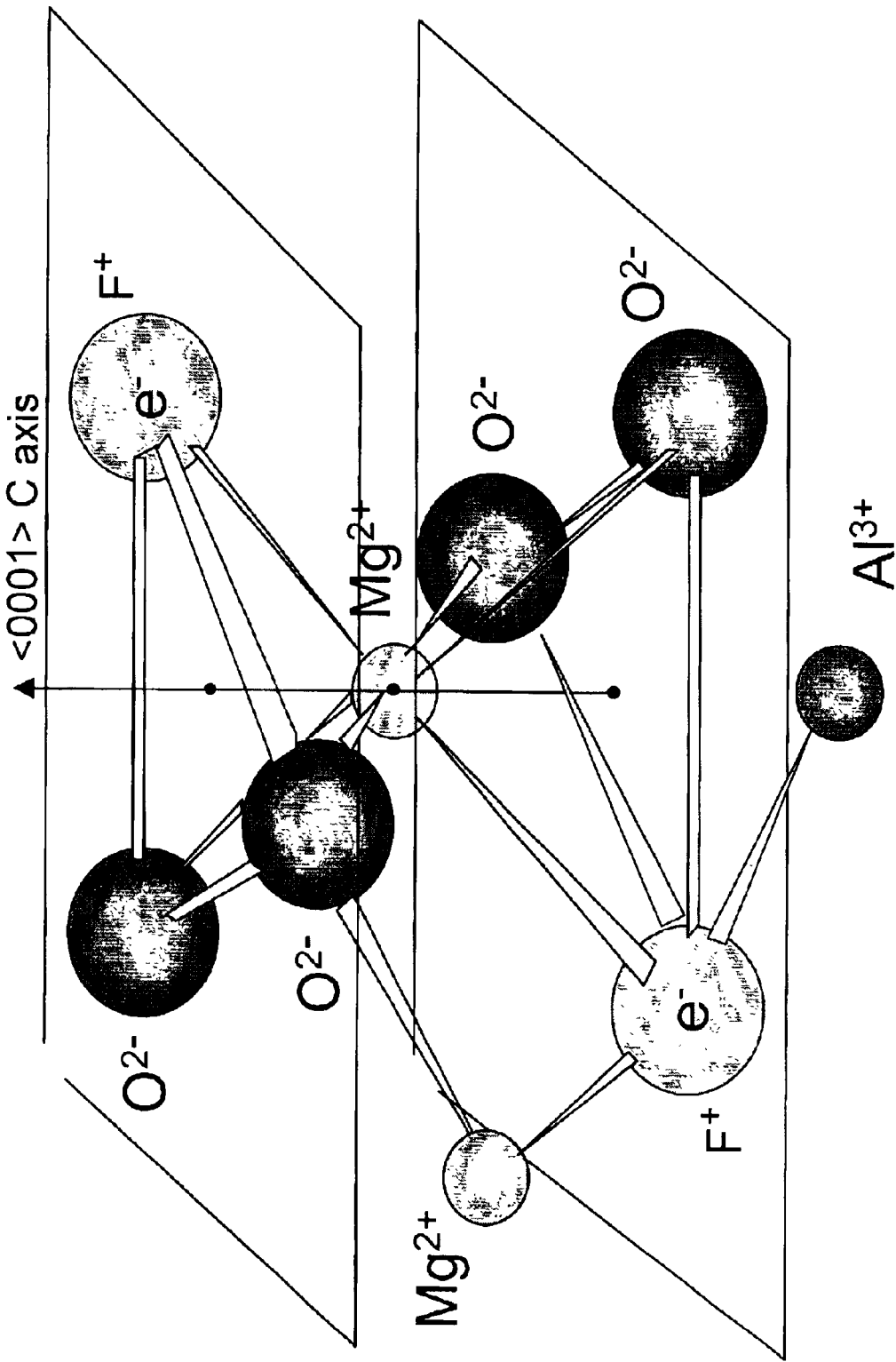
FIG. 3 is a partially three dimensional and partially schematic representation of $Al_2O_3$ crystal structure and an aggregate oxygen vacancy defect, $F_2^{2+}$(2 Mg)-center comprising: two oxygen vacancies, two Mg impurity atoms and two localized electrons according to a preferred embodiment of the present invention.

$\alpha$-$Al_2O_3$ has a rigid, slightly distorted, hexagonal-close-packed $O^{2-}$ sublattice with $Al^{3+}$ ions occupying two out of every three octahedral interstices (see FIG. 3). Each $O^{2-}$ ion is surrounded by four tetrahedral nearest-neighbor $Al^{3+}$ ions. The primary information storage process in $Al_2O_3$ is that of electronic ionization, followed by the subsequent capture of the excited electronic charge by trapping centers. Thus, for the efficient storage of information, it is necessary that $Al_2O_3$ crystals contain defects capable of trapping electrons. The efficient production of luminescence, however, requires not just a high concentration of trapping sites, but also requires existence of efficient luminescent centers.

Figure 5:
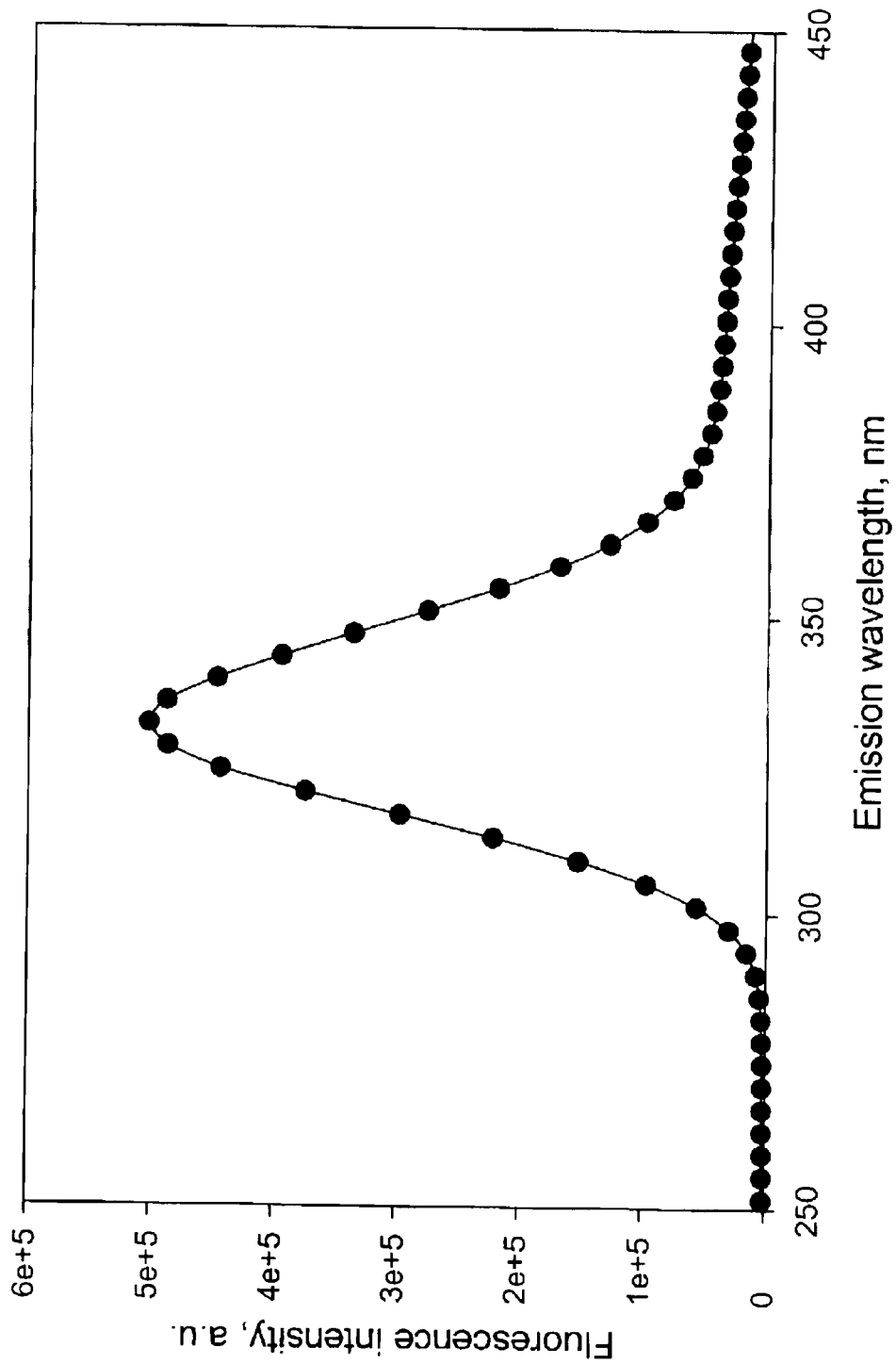
FIG. 5 is a graph showing an emission band of $F^+$-centers at 330 nm as a result of excitation with 255 nm laser light of an $Al_2O_3$:C,Mg,H crystalline material of a preferred embodiment of the present invention.
Figure 6:
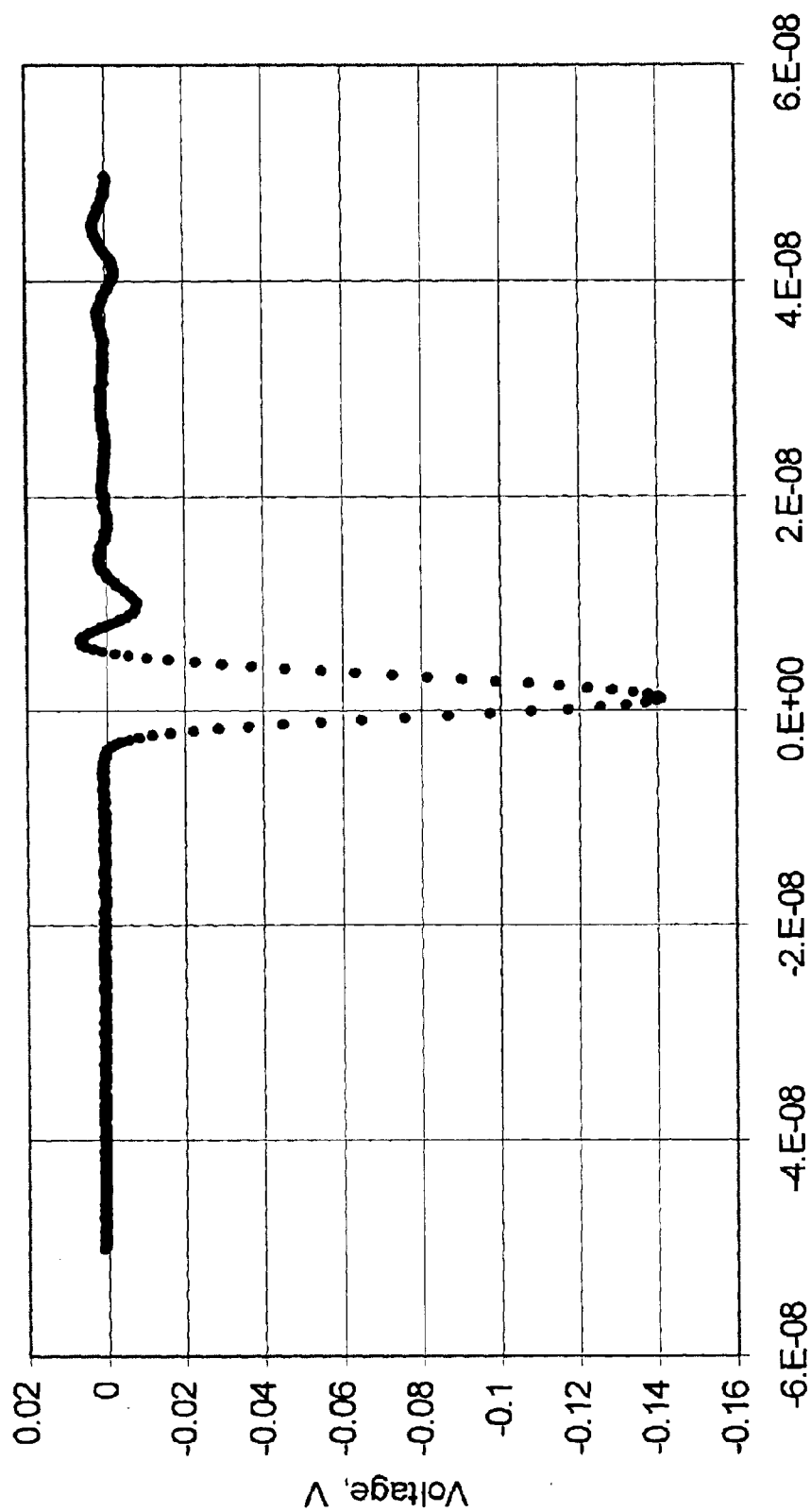
FIG. 6 is a graph illustrating the pulse of an OSL data signal in an $F^+$-center emission at 330 nm having a full width at half maximum equal to 4.7 ns for an $Al_2O_3$:C,Mg,H crystalline material according to a preferred embodiment of the present invention.

One important feature of the aluminum oxide material of one preferred embodiment of the present invention is a high concentration of single and double oxygen vacancies in the form of F$^+$ centers charge-compensated by the nearby Mg-impurity atoms. An F$^+$-center, charge-compensated by a Mg$^{2+}$-ion is denoted as an F$^+$(Mg)-center. This center is characterized by at least two absorption bands at 230 and 255 nm (see FIG. 4) and has a luminescence band at 330 nm (see FIG. 5) with a lifetime of less than 5 ns (see FIG. 6). Clustering of two of these defects form an aggregate vacancy defect composed of two F$^+$-centers and two Mg-impurity atoms which causes creation of the defect that is critical for the current invention. This defect is denoted here as F$_2^{2+}$(2 Mg) and has two localized electrons. The aggregate oxygen vacancy defects according to the present invention are responsible for a blue absorption-excitation band in the region of 435 nm (see FIG. 4 and FIG. 7). It is characterized by a green fluorescence band in the region of 520 nm (see FIG. 7) and exhibits a lifetime equal to 9±3 ns (see FIG. 8). The Al$_2$O$_3$:C,Mg crystals exhibiting this fast green luminescence were grown in a highly reducing atmosphere according to a preferred method of the present invention, described in more detail above, and are characterized by several UV absorption bands with a blue absorption band giving visible green coloration to a crystal.

Figure 9:
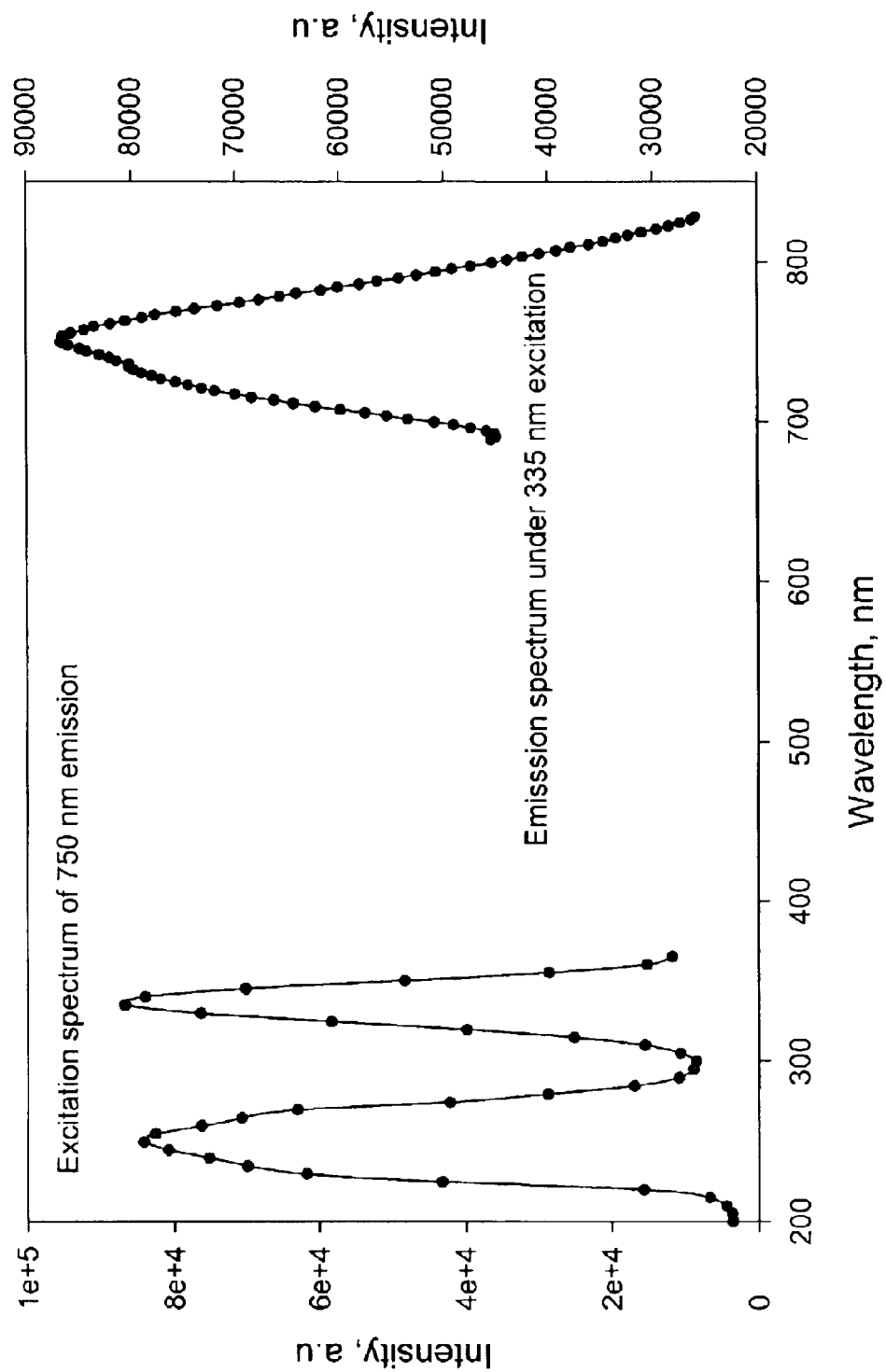
FIG. 9 is a graph showing the excitation and emission spectra of $F_2^+$(2 Mg)-centers obtained as a result of photo-conversion of an $F_2^{2+}$(2 Mg)-center ("write" operation) in $Al_2O_3$:C,Mg crystals using pulsed blue laser light with a wavelength of 430 nm.
Figure 10:
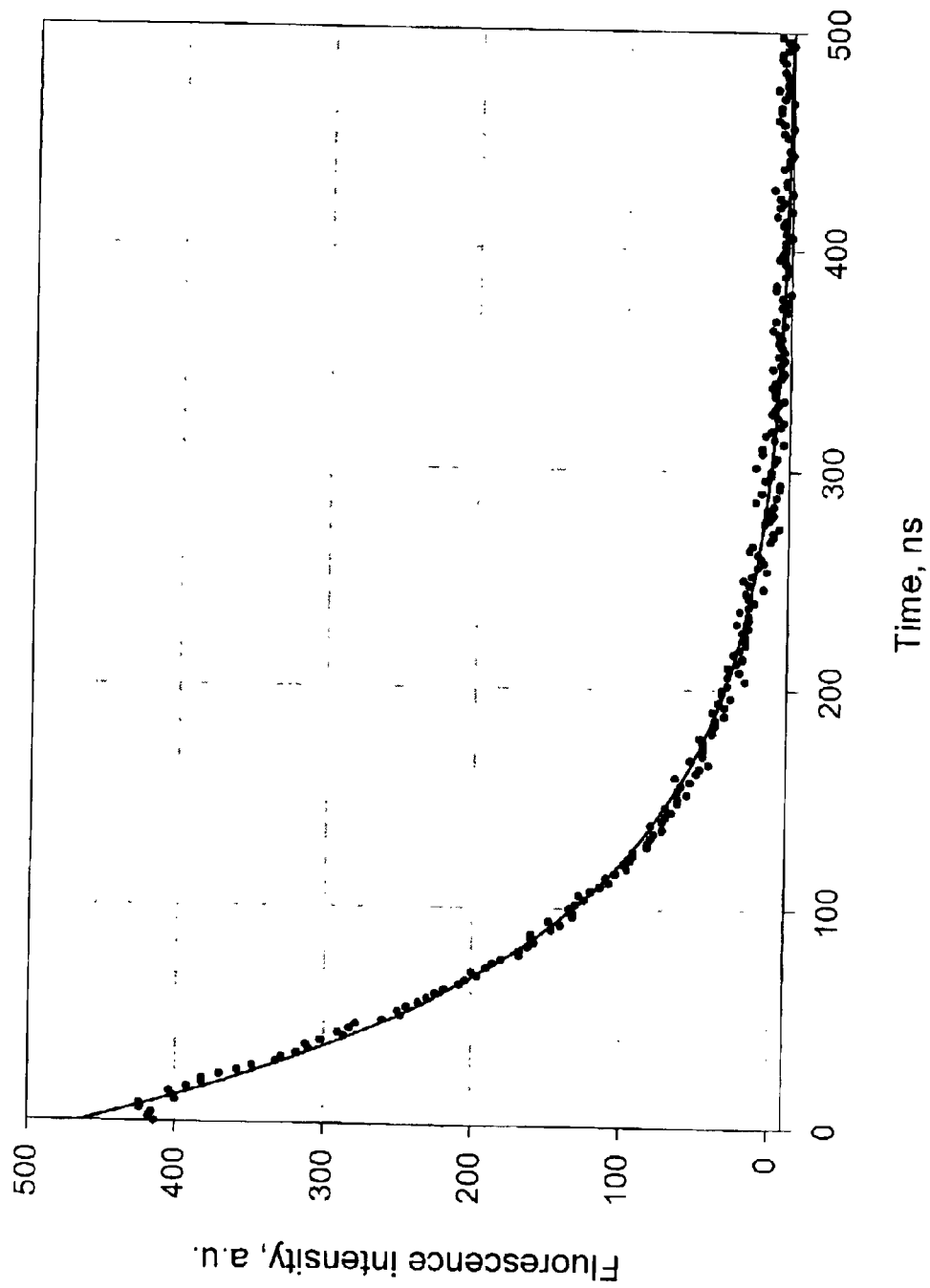
FIG. 10 is a graph showing the lifetime measurement of $F_2^+$(2 Mg)-center emission at 750 nm equal to 80±5 ns for an $Al_2O_3$:C,Mg crystalline material according to a preferred embodiment of the present invention.
Figure 11:
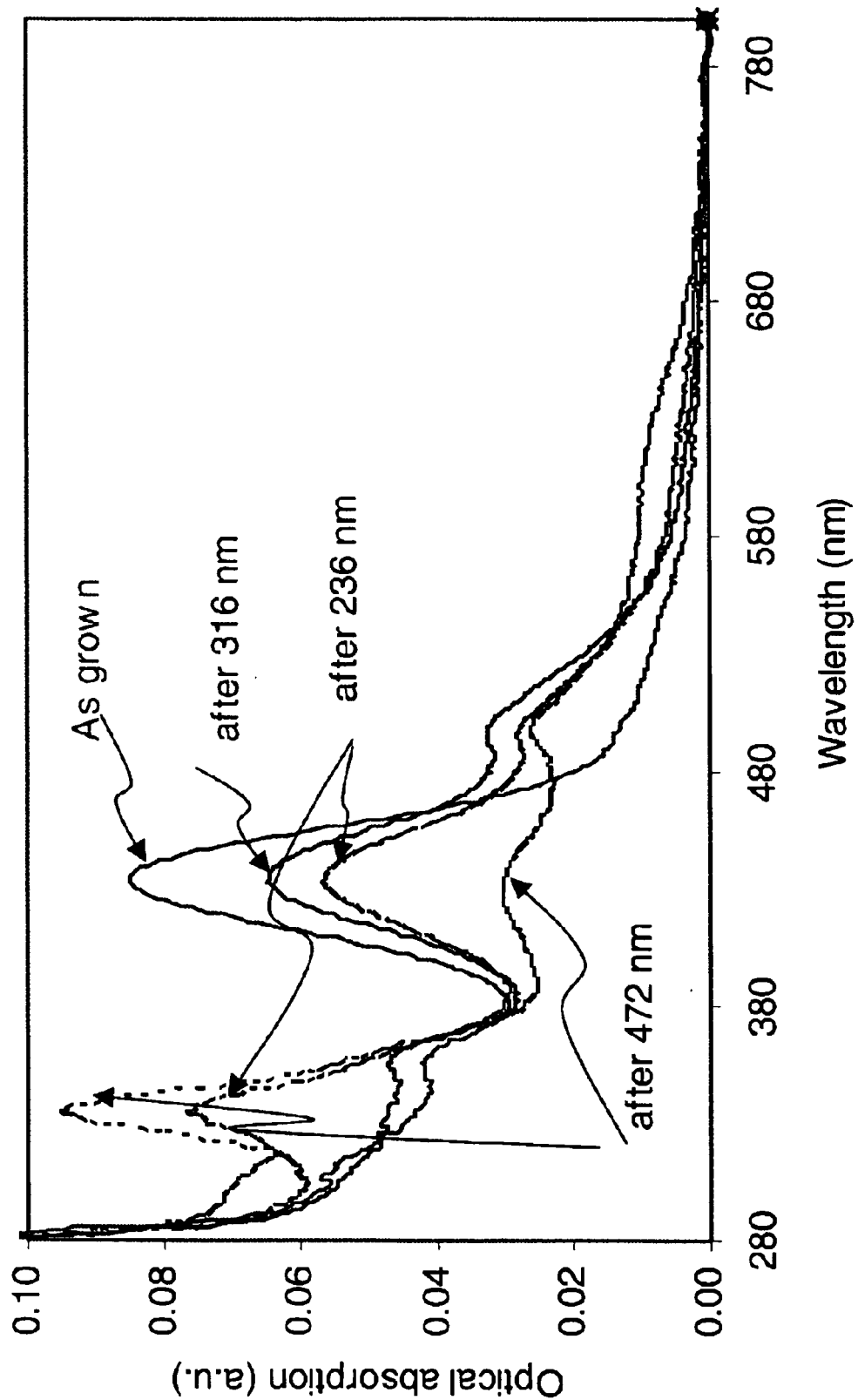
FIG. 11 is a graph illustrating the possibility of write and erase operations as a process of photo-conversion of $F_2^{2+}$(2 Mg) and $F_2^+$(2 Mg)-centers using three laser wavelengths that may be generated by one Nd:YAG laser with a fundamental harmonic at 946 nm; pulsed laser light at 472 nm (2nd harmonic) was used to "write" on an $Al_2O_3$ crystal (to bleach blue absorption band), whereas laser beams having wavelengths of 216 and 316 nm were used to "erase" (to restore a blue absorption band)

In another particularly preferred embodiment, the Al$_2$O$_3$:C,Mg crystalline material of the present invention exhibits a fluorescent emission band in the region of 750±5 nm (see FIG. 9), a fluorescent decay time of 80±10 ns (see FIG. 10), and an absorption/excitation band in the region of 335±5 nm (see FIG. 9 and FIG. 11).

With respect to an Al$_2$O$_3$ crystalline material of the present invention, the creation of a high concentration of oxygen vacancy defects like F and F$^+$-centers and aggregate centers like F$_2^+$(2 Mg) and F$_2^{2+}$(2 Mg) is important for the present invention. Doping the aluminum oxide with Mg stimulates the creation of oxygen vacancy defects and their aggregates. Mg$^{2+}$ ions substitute only a very small portion of Al$^{3+}$ ions in the crystal structure of Al$_2$O$_3$. Acceptor centers [Mg]$^-$ formed by magnesium impurity are negatively charged with respect to the crystal lattice and require for their charge compensation the formation of positively charged F$^+$-centers.

Furthermore, aggregation of single oxygen vacancies and impurity/vacancy clustering is feasible. FIG. 3 depicts one of the possible configurations of the aggregate defect defined above as an F$_2^{2+}$(2 Mg)-center. This aggregate defect according to the present invention comprises two oxygen vacancies and two Mg-ions. For charge compensation of two atoms of heterovalent impurity, two electrons are localized near oxygen vacancies. These two electrons have deep localized energy states and are responsible for the blue absorption band of Al$_2$O$_3$:Mg crystal.

Oxygen vacancy defects in Al$_2$O$_3$ crystals may be obtained in a highly reducing atmosphere at a low partial pressure of oxygen. Under such conditions, stable oxygen vacancies are created by the process of, so-called, "subtractive coloration". Another way to create oxygen vacancy defects is irradiation of Al$_2$O$_3$ crystals with neutrons or high energy electrons. Occupancy of an oxygen vacancy by two electrons gives rise to a neutral F-center, whereas occupancy by one electron forms a positive charge, with respect to the lattice, F$^+$-center. These centers may be identified by strong absorption bands at 205 nm assigned to F-centers, see K. H. Lee and J. H. Crawford, Electron centres in single crystal Al$_2$O$_3$, Phys. Rev. B, Vol. 15, pp. 4065–4074 (1977), and two overlapping absorption bands at 230 and 255 nm assigned to transitions in F$^+$-centers, see B. D. Evans and M. Stapelbroek, Optical properties of the F+ centre in crystalline Al$_2$O$_3$, Phys. Rev. B, Vol. 18, pp. 7089–7098 (1978), the entire contents and disclosures of which are hereby incorporated by reference. Strong photo-induced conductivity under the illumination in F-band was observed and is an indication of an efficient creation of free charge carriers under UV illumination, see B. J. Jeffries, J. D. Brewer and G. P. Summers, Photoconductivity and charge trapping in α-Al$_2$O$_3$, Phys. Rev. B, Vol. 24, No. 10, pp. 6074–6082 (1981), the entire contents and disclosures of which are hereby incorporated by reference.

Figure 4:
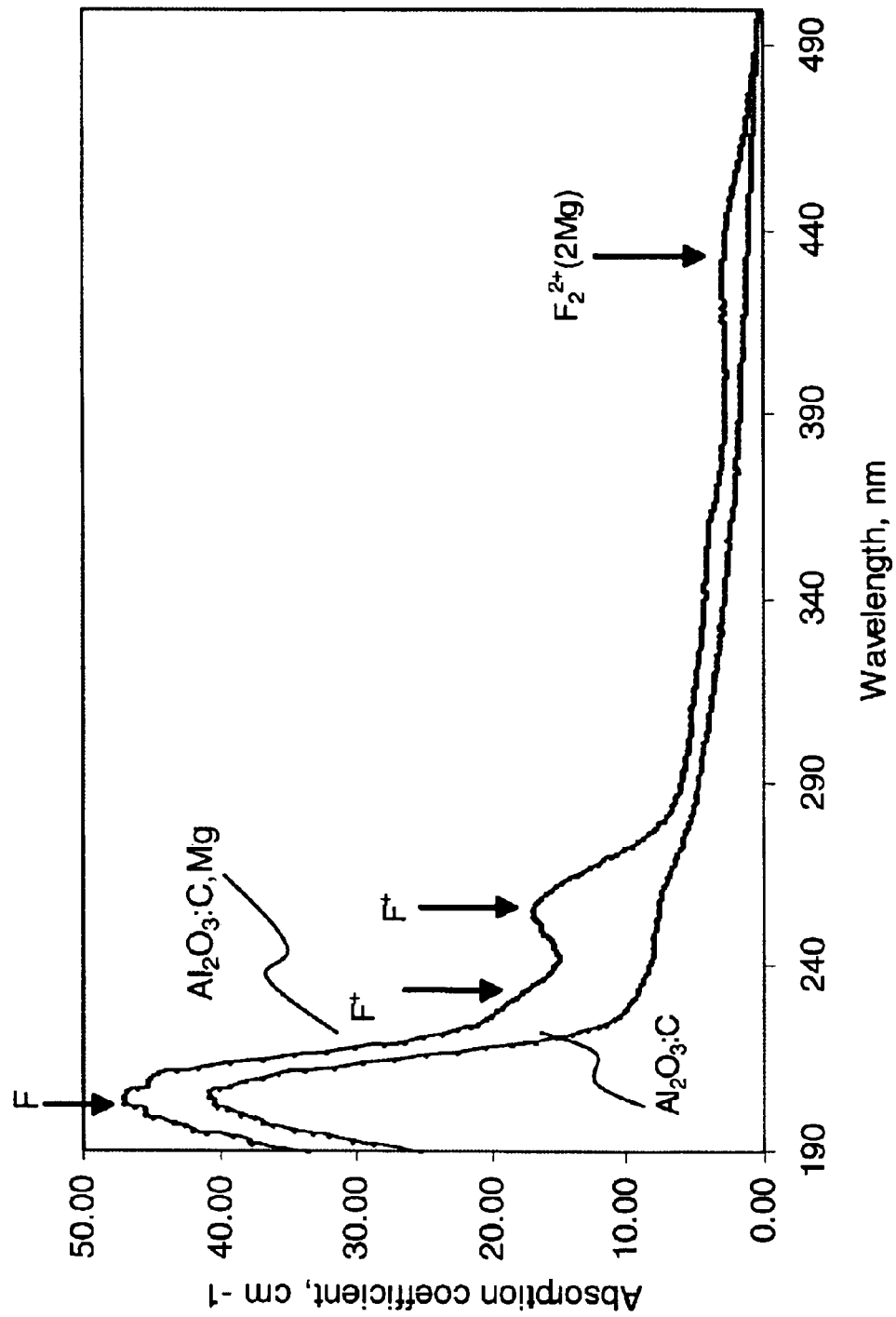
FIG. 4 shows an optical absorption spectra of two crystals: (a) of a known $Al_2O_3$:C crystal used in radiation dosimetry and (b) of an $Al_2O_3$:C,Mg single crystal according to a preferred embodiment of the present invention with a higher concentration of $F^+$-centers (absorption at 255 nm) and new absorption bands corresponding to $F_2^+$(2 Mg)- and $F_2^{2+}$(2 Mg)-centers clearly distinguishing a new material.

The defect structure of an Al$_2$O$_3$ material according to the present invention may be characterized by distinctive bands in an optical absorption spectrum (see FIG. 4). Absorption in the F- and F$^+$-bands is very strong (up to 70 cm$^{-1}$ for F-band, up to 20 cm$^{-1}$ for the F$^+$-band, and up to 3 cm$^{-1}$ for F$_2^{2+}$(2 Mg) band) and the concentration of F-, F$^+$- and F$_2^{2+}$(2 Mg)-centers in the crystals calculated in accordance with Smakula's formula is up to 5×10$^{18}$ cm$^{-3}$ for F-centers, is up to 5×10$^{17}$ cm$^{-3}$ for F$^+$-centers and up to 10$^{17}$ cm$^{-3}$ for F$_2^{2+}$(2 Mg)-centers.

Preferably the oxygen vacancy defects are present in an Al$_2$O$_3$ crystalline material according to the present invention at a concentration of about 10$^{13}$–10$^{19}$ cm$^{-3}$. The oxygen vacancy defects present in the Al$_2$O$_3$ crystalline material may include F-centers and the F-centers may be present in the Al$_2$O$_3$ crystalline material at a concentration of about 10$^{16}$–10$^{19}$ cm$^{-3}$. The oxygen vacancy defects present in the Al$_2$O$_3$ crystalline material may include F$^+$-centers and the F$^+$-centers may be present in the Al$_2$O$_3$ crystalline material at a concentration of about 10$^{15}$×5.10$^{17}$ cm$^{-3}$. The oxygen vacancy defects present in the Al$_2$O$_3$ crystalline material may include F$_2^{2+}$-centers and the F$_2^{2+}$-centers may be present in the Al$_2$O$_3$ crystalline material at a concentration of about 10$^{15}$ to 10$^{17}$ cm$^{-3}$. The oxygen vacancy defects are generally a mixture of different types of F-type centers. Exposure of an Al$_2$O$_3$ crystal having the oxygen vacancy defects with laser light, UV light or ionizing radiation may result in conversion of the same structural defect from one charged state into another. For example, F$_2^{2+}$(2 Mg)-centers were converted into F$_2^+$(2 Mg)-centers and may be converted back (see FIG. 11). In yet another preferred embodiment of the present invention, F$^+$-centers were converted into F-centers and F-centers were converted back into F$^+$-centers.

In a preferred embodiment of the present invention, the Al$_2$O$_3$:C,Mg crystalline material comprises color centers present in a concentration of about 10$^{13}$ to 10$^{19}$ cm$^{-3}$.

In a preferred embodiment of the present invention, the Al$_2$O$_3$:C,Mg crystalline material comprises combinations of several types of oxygen vacancy defects, preferably F-centers at a concentration of about 5×10$^{17}$ to 5×10$^{18}$, and F$^+$(Mg) color centers present in a concentration of about 5×10$^{16}$ to 5×10$^{17}$ cm$^{-3}$ and F$_2^{2+}$(2 Mg) color centers present in a concentration of about 10$^{16}$ to 10$^{17}$ cm$^{-3}$.

In various preferred embodiments of the present invention, the Al$_2$O$_3$:C,Mg crystalline material of the present invention has an absorption band in one or more of the following regions: 205±5 nm, 230±5 nm, 255±5 nm, 335±5 nm, 435±5 nm, 500±15 nm and 630±15 nm (see FIG. 4 and FIG. 11). In various preferred embodiments of the present invention, the Al$_2$O$_3$:C,Mg crystalline material of the present invention has a fluorescent emission band in one or more of the following regions: 330±5 nm, 420±5 nm, and 520±5 nm, and 750±5 nm. In a particularly preferred embodiment, the Al$_2$O$_3$:C,Mg crystalline material of the present invention has a fluorescent emission band in the region of 520±5 nm, a fluorescent decay time of 9±3 ns, and an absorption band in the region of 435±5 nm. In another particularly preferred embodiment, the $Al_2O_3$:C,Mg crystalline material of the present invention has a fluorescent emission band in the region of 750±5 nm, a fluorescent decay time of 80±10 ns, and an absorption band in the region of 335±5 nm.

In another particularly preferred embodiment, the $Al_2O_3$:C,Mg crystalline material of the present invention has an absorption band in the region of 255±5 nm and a fluorescent decay time of 4±3 ns. In another particularly preferred embodiment, the $Al_2O_3$:C,Mg crystalline material of the present invention has an absorption band in the region of 205±5 nm and a fluorescent decay time of 35±3 ms. In another particularly preferred embodiment, the $Al_2O_3$:C,Mg crystalline material of the present invention has an absorption band in the region of 500±15 nm. In another particularly preferred embodiment, the $Al_2O_3$:C,Mg crystalline material of the present invention has an absorption band in the region of 630±15.

In a preferred embodiment of the present invention, the crystalline material of the present invention has a photo-ionization cross-section of at least 0.01 $cm^2/J$. In another preferred embodiment of the present invention, the crystalline material of the present invention has a fluorescence yield of at least 0.1. In another preferred embodiment of the present invention, the crystalline material of the present invention requires laser energy of no greater than 1 $\mu J$ per bit of information stored in the material.

Figure 12:
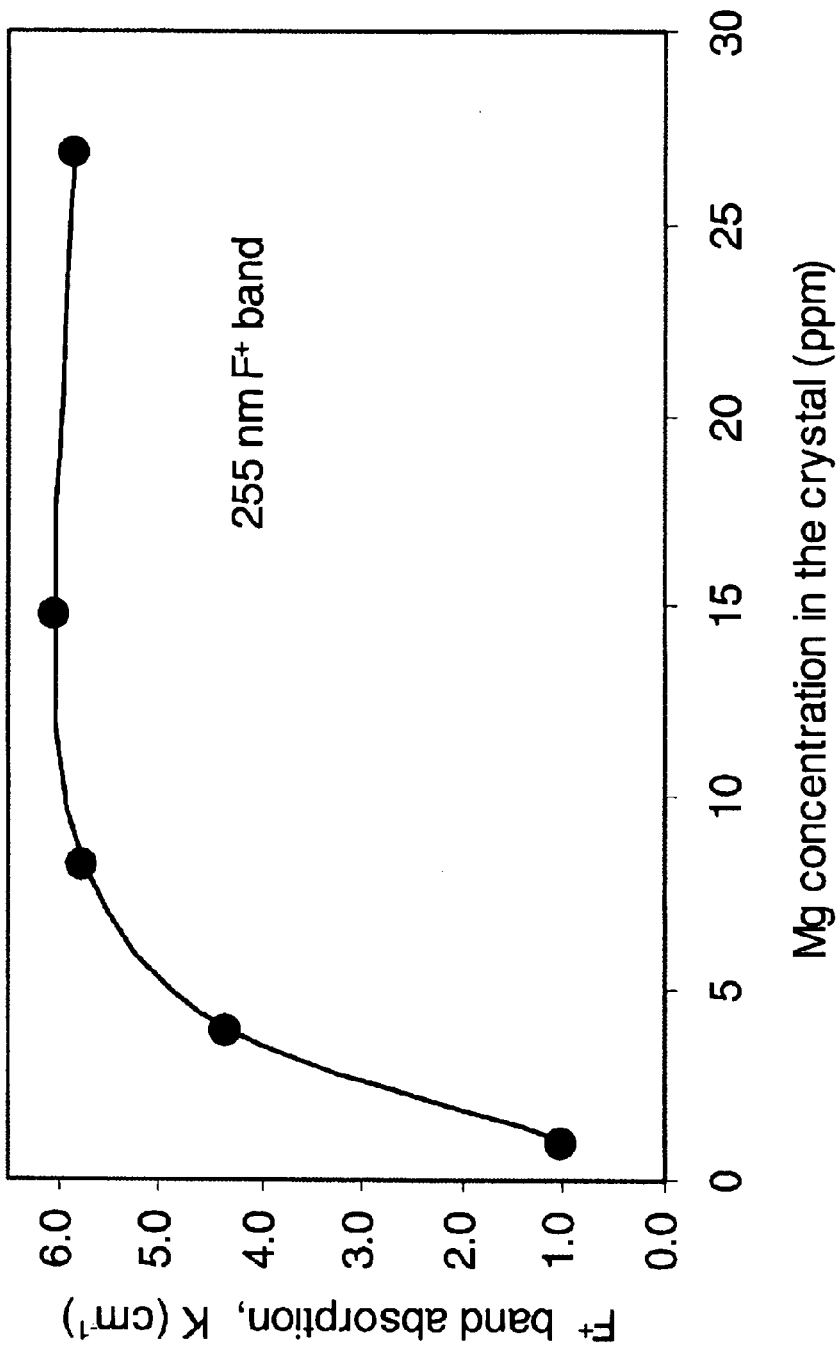
FIG. 12 is a graph showing the dependence of optical absorption in the 255 nm band assigned to $F^+$(Mg)-centers on Mg-impurity concentration in $Al_2O_3$ crystals.
Figure 13:
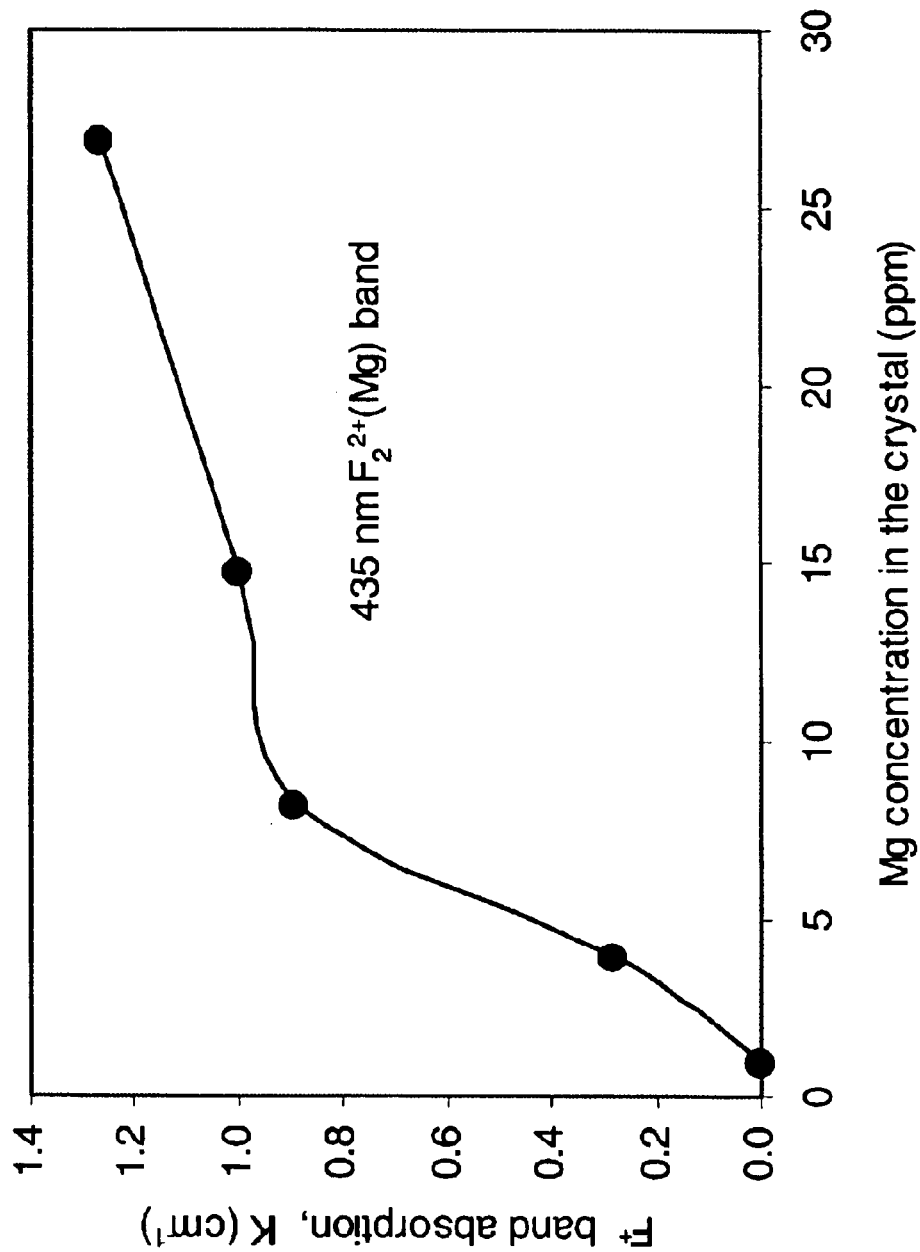
FIG. 13 is a graph showing the dependence of optical absorption in the 435 nm band assigned to $F_2^{2+}$(2 Mg)-centers on Mg-impurity concentration in $Al_2O_3$ crystals.
Figure 14A:
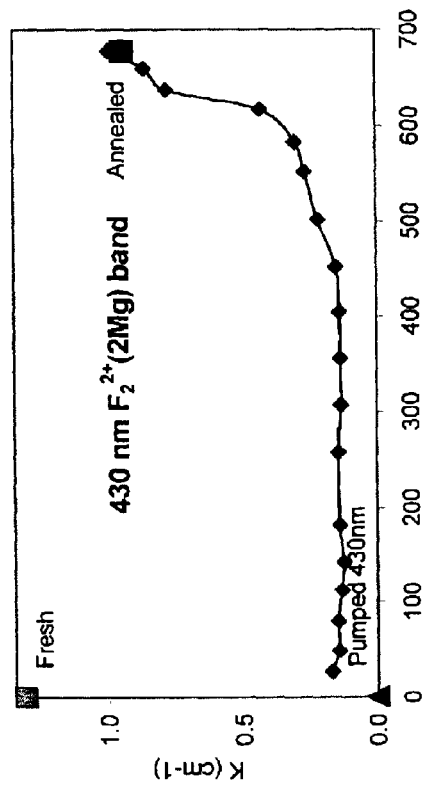
FIG. 14A is a graph showing temperature dependence of an optical absorption band at 255 nm ($F^+$-centers) and illustrates high thermal stability of trapped charge up to 650° C.
Figure 14B:
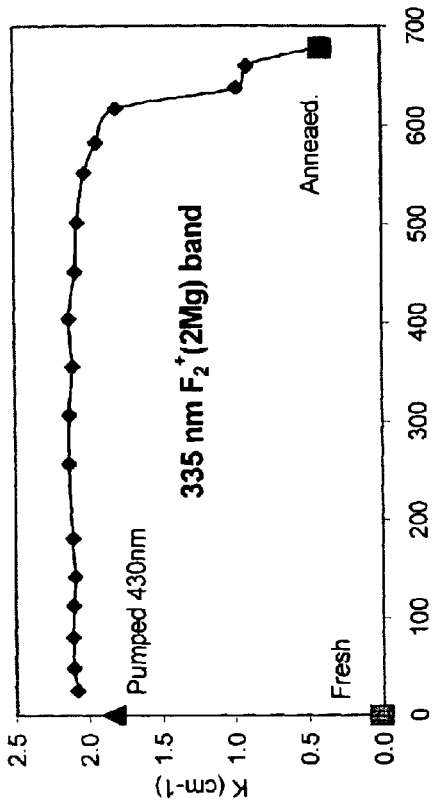
FIG. 14B is a graph showing temperature dependence of an optical absorption band at 335 nm ($F_2^+$(2 Mg)-centers) and illustrates high thermal stability of trapped charge up to 650° C.
Figure 14C:
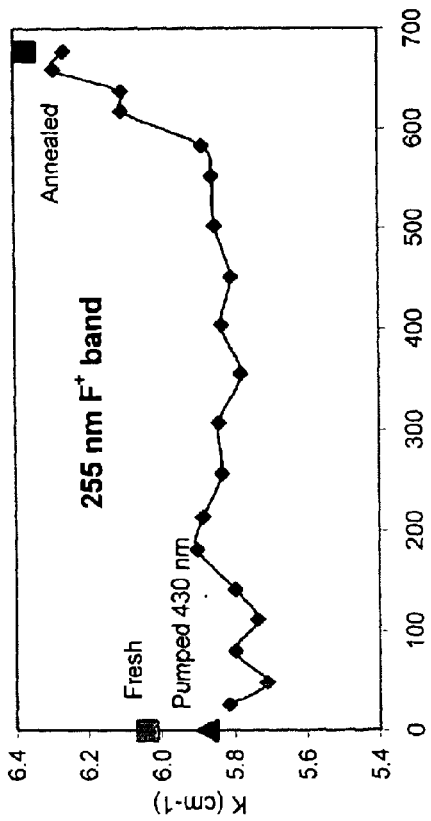
FIG. 14C is a graph showing temperature dependence of an optical absorption band at 435 nm ($F_2^{2+}$(2 Mg)-centers) and illustrates high thermal stability of trapped charge up to 650° C.
Figure 14D:
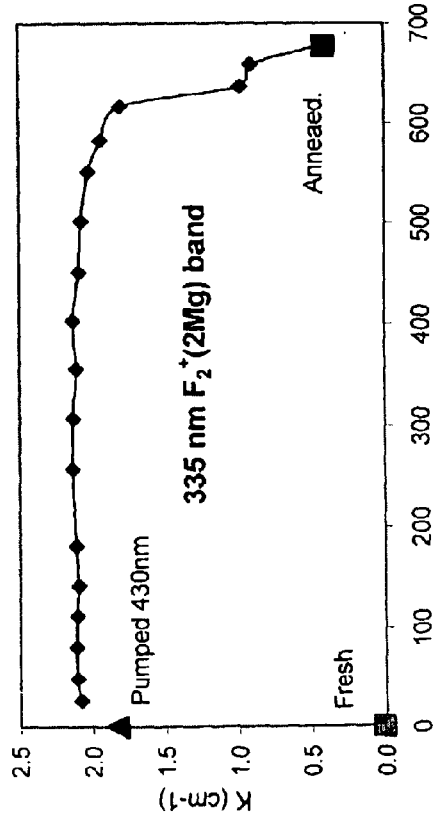
FIG. 14D is a graph showing temperature dependence of an optical absorption band at 630 nm ($F_2^{3+}$(2 Mg)-centers) and illustrates high thermal stability of trapped charge up to 650° C.

According to the present invention, involvement of Mg atoms in creation of color centers assigned to $F^+$(Mg)- and $F_2^{2+}$(2 Mg)-centers and associated with 255 nm and 435 nm absorption bands is supported by strong dependence of these bands' intensities on Mg concentration (see FIG. 12 and FIG. 13).

Magnesium impurity in several forms of $Al_2O_3$ crystals and ceramics were reported to benefit some optical and mechanical characteristics of the material in different applications, see U.S. Pat. No. 5,702,654, W. W. Chen and N. H. Harris, Method of Making Thermal Shock Resistant Sapphire for IR Windows and Domes, (Dec. 30, 1997); S. Morita, H. Sekiwa, H. Toshima, and U. Miyazawa, The Growth of $Al_2O_3$ Single Crystals by the Czochralski Method, Journal of the Ceramic Society of Japan, Vol. 101, No. 1, pp. 108–112, 1993; S. Lartigue Korinek and F. Dupau, Grain Boundary Behavior in Superplastic Mg-Doped Alumina with Yttria Codoping, Acta. Metall. Mater., Vol. 42, No. 1, pp. 293–302, 1994; C. A. Handwerker, P. A. Morris, and R. L. Coble, Effects of Chemical Inhomogeneities on Grain Growth and Microstructure in $Al_2O_3$, Journal of American Ceramic Society, Vol. 72, No. 1, pp. 130–136; L. R. Brock, K. C. Mishra, M. Raukas, W. P. Lapatovich, and G. C. Wei, Color Centers in Magnesium Doped Polycrystalline Alumina, Mat. Res. Soc. Symp. Proceedings, Vol. 667, pp. G7.1.1–G7.1.11, 2001; R. Ramirez, R. Gonzalez, and I. Colera, Protons and Deuterons in Magnesium-Doped Sapphire Crystals, Journal of American Ceramic Society, Vol. 80, No. 4, pp. 847–850, 1997; K. P. D. Lagerlof and R. W. Grimes, The Defect Chemistry of Sapphire ($\alpha$-$Al_2O_3$), Acta Mater., Vol. 46, No. 16., pp. 5689–5700; M. Yasuto, M. Shoji, S. Hideyuki, Production of Aluminum Oxide Single Crystal, Japanese Patent Application #04303103, Filed Oct. 15, 1992, Publication #06199597, Jul. 19, 1994, the entire contents and disclosures of which are hereby incorporated by reference. But, never before the present invention has doping of $Al_2O_3$ with Mg impurity stimulated creation of aggregate oxygen vacancy defects having particular optical properties suitable for optical data storage application.

$F^+$-center emission observed simultaneously with F-center emission has been reported in Mg-doped crystals, see V. S. Kortov, T. S. Bessonova, M. S. Akselrod, and I. I. Milman, Hole-Induced Exoelectron Emission and Luminescence of Corundum Doped with Mg., Phys. Stat. Sol. (a), Vol. 87, pp. 629–639 (1985) and P. A. Kulis, M. J. Springis, I. A. Tale, V. S. Vainer and J. A. Valbis, Impurity-associated colour centers in Mg- and Ca-doped $Al_2O_3$ single crystals, Phys. Stat. Sol. (b), Vol. 104, pp 719–725, (1981), the entire contents and disclosures of which are hereby incorporated by reference. Some optical properties of aggregate defects formed by two oxygen vacancies were reported for neutron-irradiated $Al_2O_3$ crystals, see B. D. Evans, G. J. Pogatshnik and Y. Chen, Optical properties of lattice defects in $\alpha$-$Al_2O_3$, Nucl. Instrum. and Methods in Phys. Res. B, Vol. 91, pp. 258–262 (1994), the entire contents and disclosure of which is hereby incorporated by reference. According to Evance, et al., $F_2$-centers in neutron irradiated $Al_2O_3$ crystals absorb light in the region of 300 nm and emit light in the regions of 322 nm and 515 nm. $F_2^{2+}$-centers absorb light in the region of 458 nm and emit in the region of 560 nm. $F_2^+$-centers absorb at 360 nm and emit at 380 nm. But, never before the present invention have $Al_2O_3$ crystals with the aggregate defects formed both by two oxygen vacancies (intrinsic defect) and two Mg impurity atoms (extrinsic defect) been reported as a material for optical data storage.

Optical characteristics of oxygen vacancy defects claimed in the present invention are illustrated by FIGS. 5–11. It is important to emphasize that optical absorption and luminescent characteristics of the aggregate defects in the $Al_2O_3$ material according to the present invention is very different from that reported in the literature and described above. $F_2^{2+}$-centers in neutron irradiated $Al_2O_3$ crystals absorb at 458 nm and emit at 560 nm, whereas Mg-compensated $F_2^{2+}$(2 Mg)-centers absorb at 435 nm and have wide fluorescence bands centered at 520 nm (see FIG. 7). A significant difference in optical parameters is measured also between $F_2^+$-centers in neutron-irradiated crystals, which absorb at 360 nm and emit at 380 nm and $F_2^+$(2 Mg)-centers in Mg-doped crystals (see FIG. 9), which have absorption and excitation bands at 335 nm and a wide fluorescence band peaked at 750 nm.

In a preferred embodiment of the present invention, the $Al_2O_3$:C,Mg crystalline material of the present invention comprises color centers formed by a cluster of defects comprising $F_2^{2+}$-centers charge-compensated with Mg and C impurities. Preferably the color centers have a concentration of about $10^{13}$ to $10^{17}$ $cm^{-3}$.

In another preferred embodiment of the present invention, the $Al_2O_3$:C,Mg crystalline material includes deep traps of charge. Preferably, the deep traps of charge have a delocalization temperature about 600° C. to 700° C. and have a concentration about $10^{13}$ to $10^{17}$ $cm^{-3}$. The delocalization temperature of the deep traps was found from the optical absorption experiment (see FIGS. 14A, 14B, 14C and 14D) with step annealing of the crystal grown according to the present invention and illuminated with a 430 nm pulsed laser light that is equivalent to a "write" operation in the optical data storage system. Optical absorption bands of $F^+$-centers at 255 nm and $F_2^{2+}$(2 Mg)-centers at 435 nm increase their intensities and restore their original intensity in the temperature region between 600 and 700° C. The opposite trend may be seen in the same temperature range for 335 nm band of $F_2^+$(2 Mg)-centers and 630 nm band of $F_2^{3+}$(2 Mg)-centers indicating that these centers convert into $F_2^{2+}$(2 Mg)-centers during annealing.

In another preferred embodiment of the present invention, the $Al_2O_3$:C,Mg crystalline material is substantially insensitive to room light in both written and erased states.

In another preferred embodiment of the present invention, the $Al_2O_3$:C,Mg crystalline material is capable of being used for long-term data storage.

Figure 7:
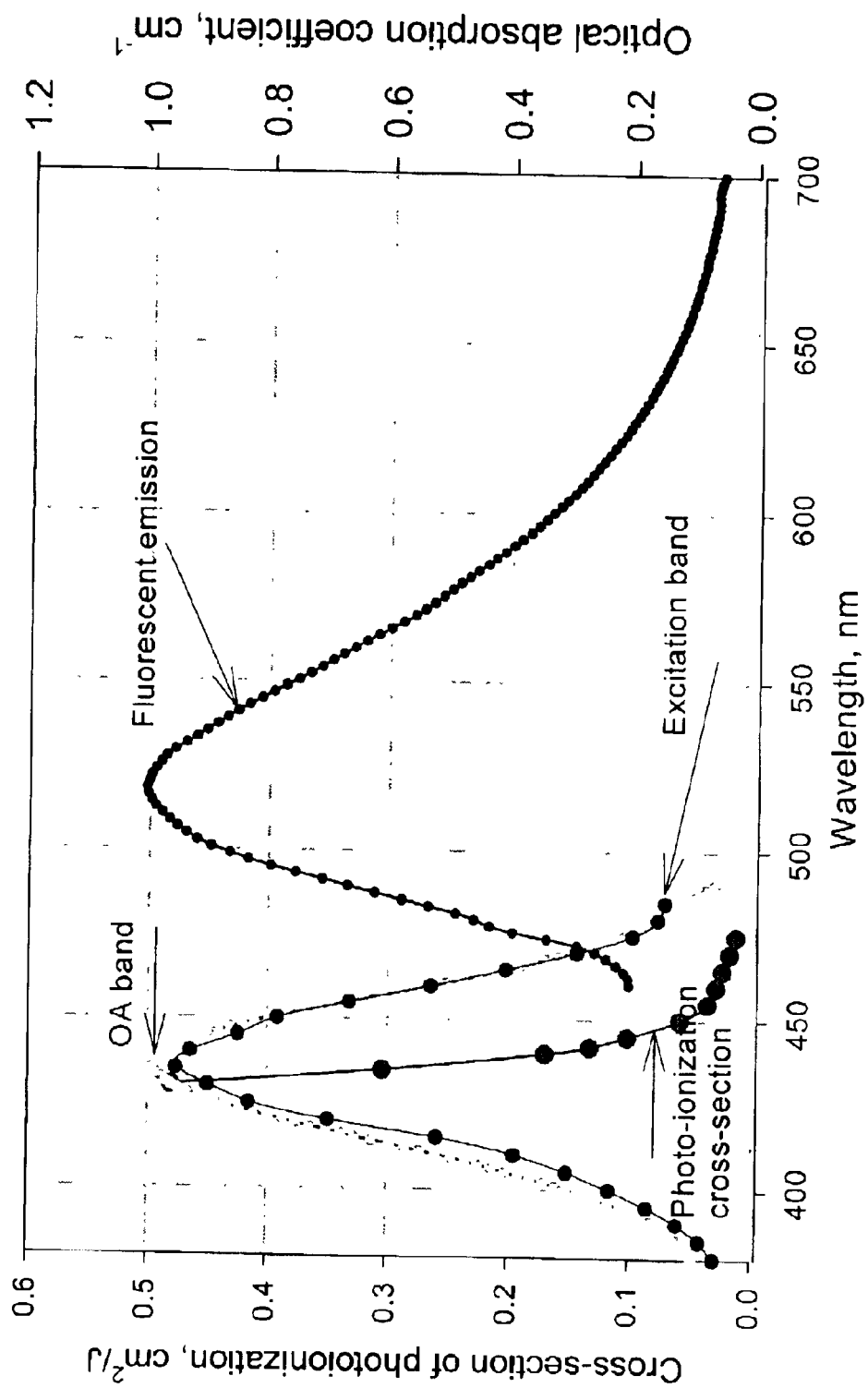
FIG. 7 is a graph showing the absorption, excitation and emission spectra of $F_2^{2+}$(2 Mg)-centers created in $Al_2O_3$:C, Mg in an as-received or erased state, with an excitation spectrum of 520 nm emission band coinciding well with the absorption band at 435 nm assigned to the same defect, and showing the wavelength dependence of a two-photon photo-ionization cross-section for $F_2^{2+}$(2 Mg)-centers.
Figure 8:
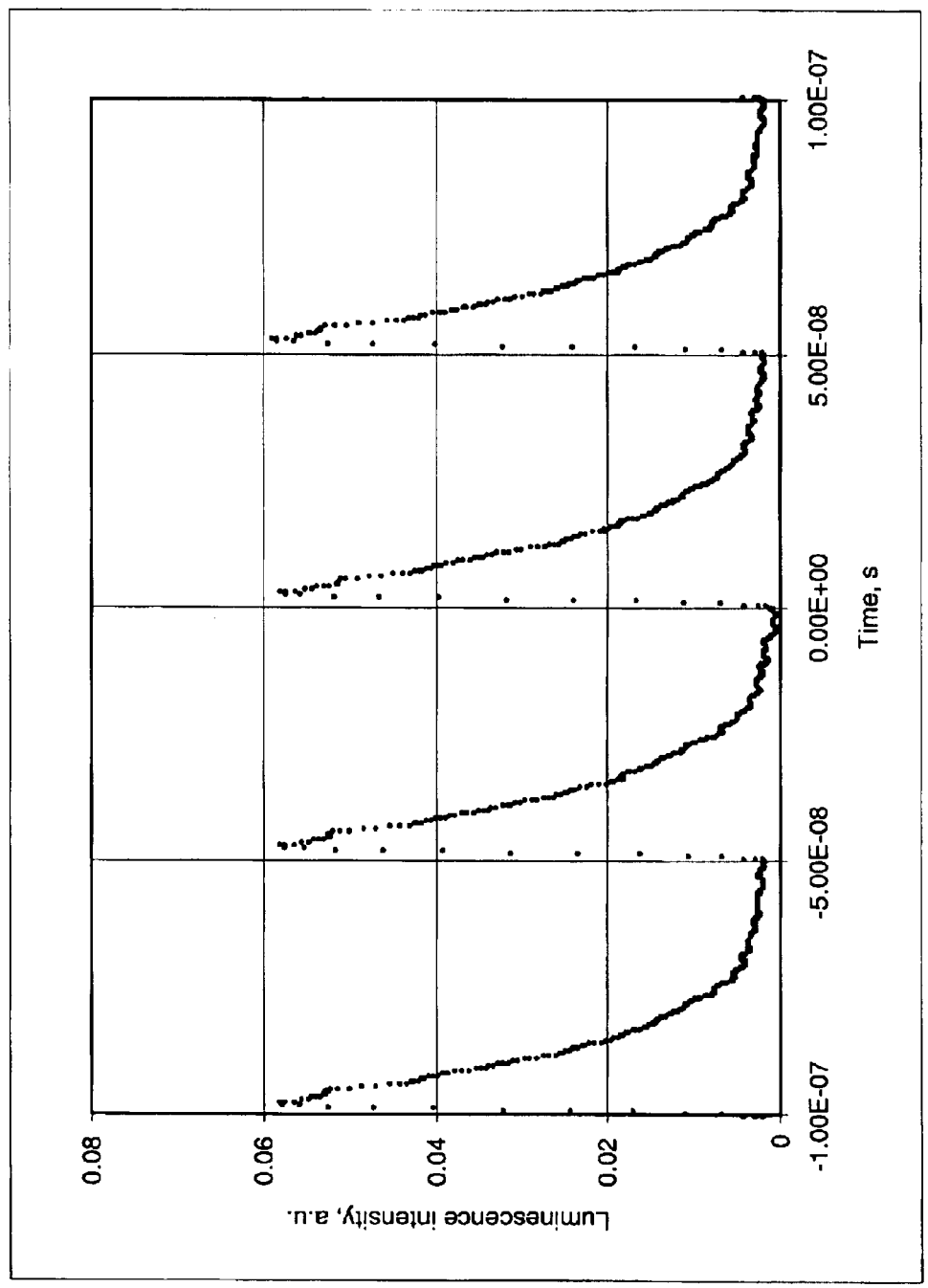
FIG. 8 is a graph showing a continuous readout of fluorescent signal at a 20 MHz repetition rate with the lifetime of $F_2^{2+}$(2 Mg)-center emission at 520 nm equal to 9±3 ns for an $Al_2O_3$:C,Mg crystalline material according to a preferred embodiment of the present invention.

In another preferred embodiment of the present invention, the $Al_2O_3$:C,Mg crystalline material has a photo-ionization cross-section of at least 0.01 $cm^2$/J (see FIG. 7).

In another preferred embodiment of the present invention, the $Al_2O_3$:C,Mg crystalline material has a fluorescence yield of at least 0.1.

In another preferred embodiment of the present invention, the $Al_2O_3$:C,Mg crystalline material requires a laser energy of no greater than 1 $\mu$J per bit of information stored in the material.

Figure 15:
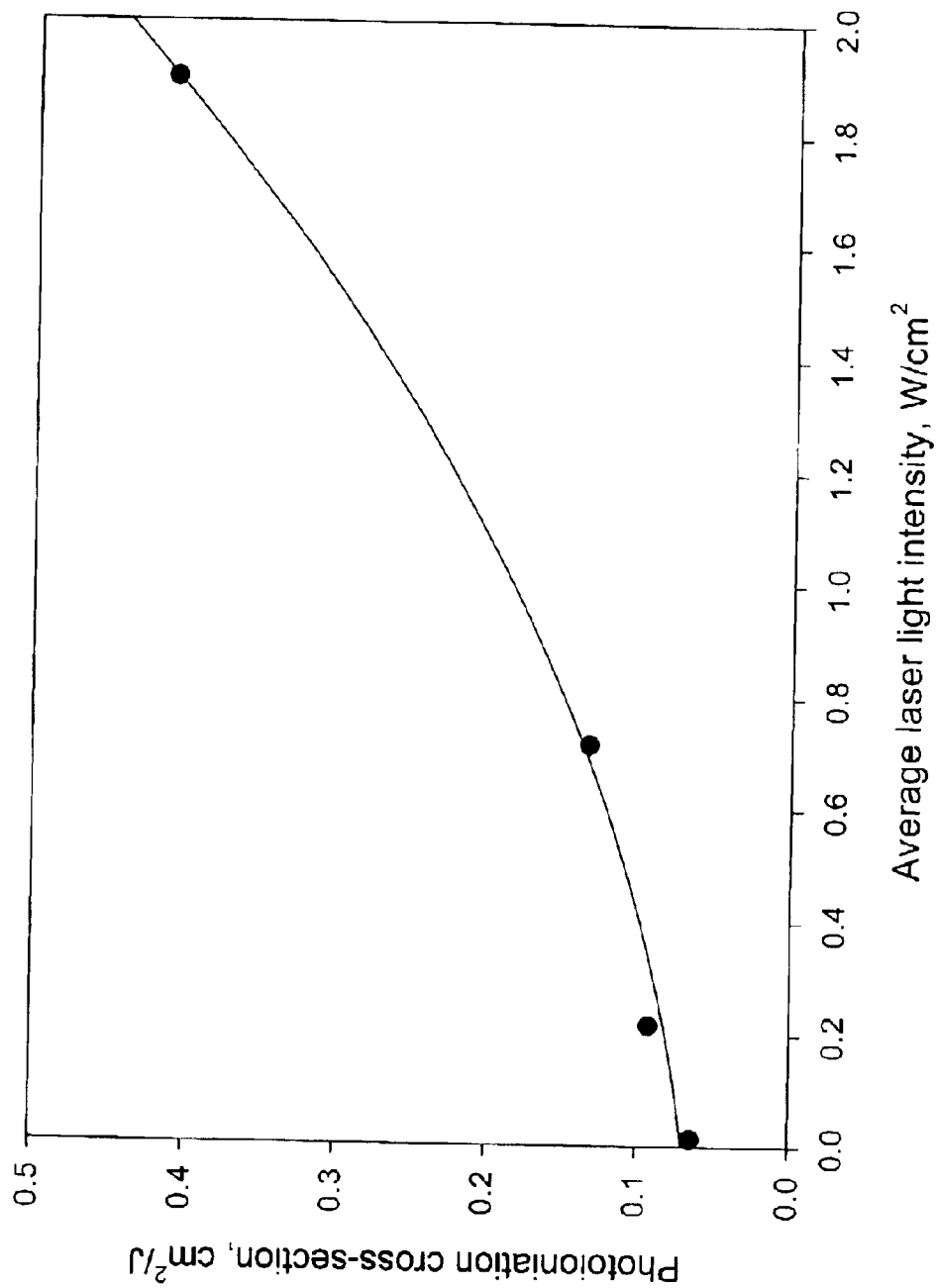
FIG. 15 is a graph show quadratic dependence of a photo-ionization cross-section of $F_2^{2+}$(2 Mg)-centers on average laser light intensity illustrating high probability of a two-photon absorption process in $Al_2O_3$:C,Mg crystals.

Preferred electronic processes during "write" and "read" operation in the $Al_2O_3$:C,Mg material of the present invention are explained using a band diagram as in FIG. 15. A preferred doped $Al_2O_3$ material of the present invention for use as data storage media may be formed to contain a high concentration of trapping sites and fluorescent centers with precisely desirable characteristics. Data storage media generally exist in at least two stable physical states assigned correspondingly to "0" and "1" states. An initial configuration (logical 0 state) of as-received or erased $Al_2O_3$ media has a high concentration of $F_2^{2+}$(2 Mg)-centers, characterized by an intensive absorption band in the region of 435±5 nm. By illumination with the writing laser light ("write" beam") of the appropriate photon energy $hv_1$ (or wavelength $\lambda_1$) and intensity, which is high enough to ionize the above described crystal defects, one may produce free electrons to be trapped in pre-existing electronic defects. The traps in $Al_2O_3$:C,Mg are deep enough to keep the charge carriers for a long time at ambient temperature without being thermally released. This second state of a quantum system is now in a metastable "charged" configuration (logical "1" state). To "read" the state of the media, the stimulation light of the same as writing light or another photon energy $hv_2$ (or wavelength $\lambda_2$) is applied and fluorescent photon of energy $hv_3$ (or wavelength $\lambda_3$) is detected. In case of fluorescent one-bit recording, a written bit produces reduced fluorescence intensity whereas an unwritten spot produces original intensive fluorescence.

Electronic defects in wide gap dielectrics like $Al_2O_3$ are characterized by the energy levels of their ground and excited states. If the excited state of the electronic defect is located close or within the conduction band, the defect may be ionized by one-photon absorption. A different situation takes place when the excited state is located deep within the energy gap of the crystal. Absorption of one photon corresponding to the energy transition between ground and excited states of the electronic defect results in a localized transition followed by non-radiative and radiative decay (fluorescence). This one-photon absorption process is non-destructive and may be used for reading information.

To remove an electron from such a deep defect and to change the luminescent properties of the particular defect in the crystal, simultaneous absorption of two photons is used in the present invention. The first absorbed photon excites the electron of the above described electronic defect into its excited state, whereas the second photon transfers the electron from the above described excited state within the energy gap into the conduction band. An electron in the conduction band is now delocalized (removed from its original defect site) and may be trapped by another defect.

Usually two-photon absorption (2 PA) is considered a process of simultaneous absorption by the luminescence center of two photons. The sum of energies of these two photons is preferably enough to perform excitation of the luminescent center whereas energy of only one photon is not sufficient for the excitation transition. 2 PA is performed through the virtual (non-existing) quantum energy state of defect and the probability of it is very low. To perform 2 PA, femto- or picosecond laser pulses with a power density on the order of 100 MW/$cm^2$ are required. A very important advantage of 2 PA in an $Al_2O_3$ material described in the current invention is the fact that defects that absorb laser light and produce fluorescence have an excited state deep in the gap with the life-time long enough to significantly increase the probability of a second photon absorption needed for data recording and at the same time short enough to allow fast reading of a fluorescent signal to achieve a high data transfer rate. The evidence of preferred two-photon absorption in aggregate oxygen vacancy defects is provided by quadratic dependence of the photo-ionization cross-section of these centers versus laser light intensity (see FIG. 15). The test was performed with 430 nm, 4.5 ns laser pulses of an optical parametric oscillator illuminating a thin $Al_2O_3$:C,Mg crystal and recording the decay constant of fluorescence as a function of laser energy density.

Writing the data may be performed (see FIG. 16) using two-photon absorption of 435±40 nm blue laser light by the $F_2^{2+}$(2 Mg)-centers described above. The first photon excites one of the two electrons localized on the center to its excited state while the second photon performs the second transition between the excited state and the conduction band, thus performing photo-ionization of the center. The final stage of the writing process is localization (or trapping) of the above described photoelectron by another defect, namely by another $F_2^{2+}$(2 Mg)-center, or by $F^+$(Mg)-center or by carbon impurity. The result of these photochromic transformations is (a) creation of another charged state of the aggregate defect, $F_2^+$(2 Mg)-center, having three localized electrons and characterized by a UV absorption band at 335 nm, or (b) creation of a neutral F-center with a UV absorption band at 205 nm, or (c) a carbon related trap responsible for 190° C. TL peak. All three processes result in formation of optically deep and thermally stable electronic states and may be used in a preferred embodiment of the present invention for long-term data storage. The first process (a) has a higher probability that was determined from the efficiency of photo-conversion of optical absorption bands. As a result of photo-ionization, an $F_2^{2+}$(Mg)-center converts into $F_2^{3+}$(Mg) that has an absorption band at 620 nm and the released electron is trapped by another $F^-_2{}^{2+}$(Mg)-center converting it into an $F_2^+$(Mg)-center having three localized electrons and characterized by an absorption band at 335 nm and an emission band at 750 nm.

Figure 16:
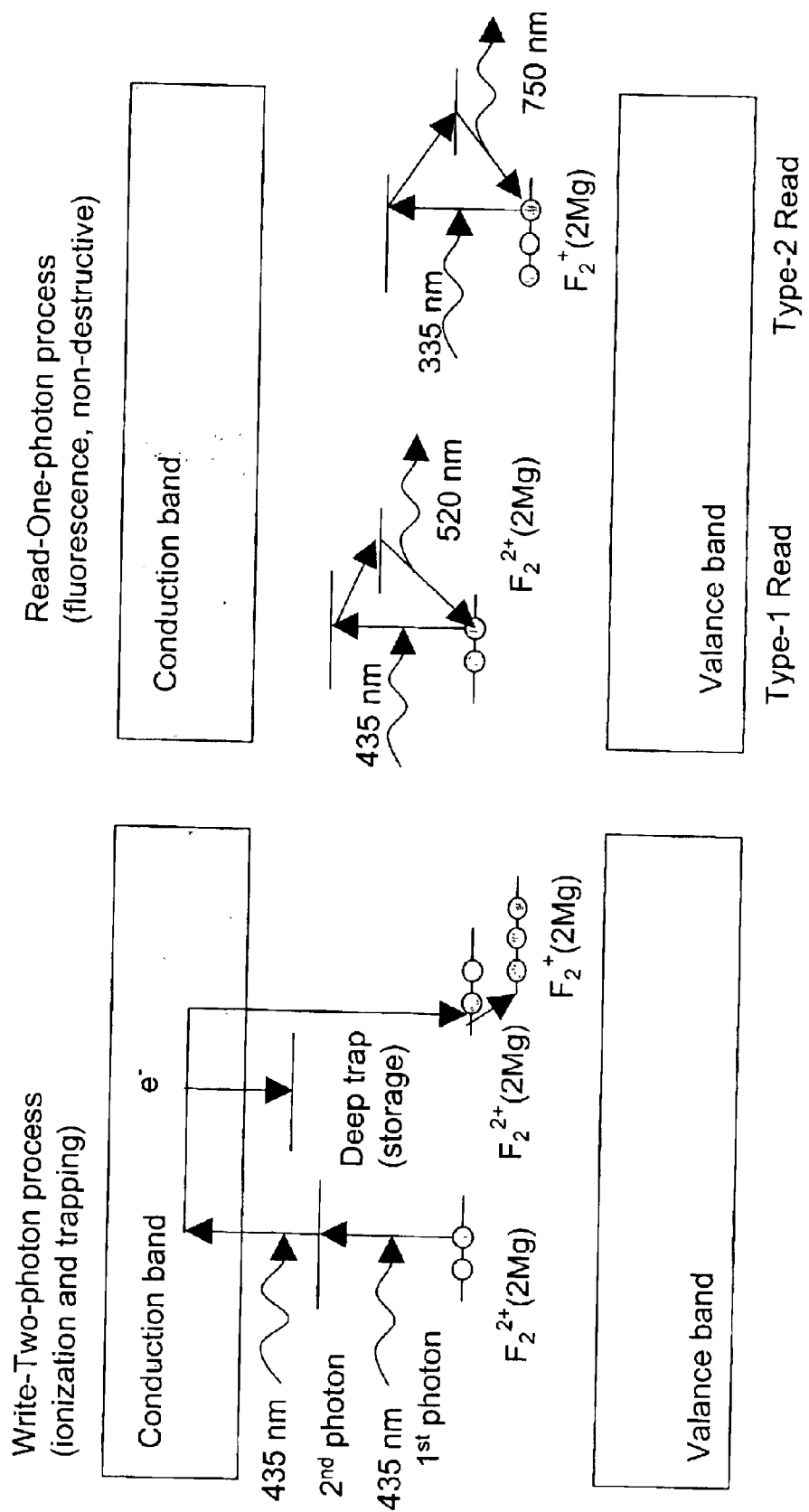
FIG. 16 is a band diagram illustrating electronic processes in an $Al_2O_3$ crystal doped with Mg impurity during "write" and "read" operations.

The present invention provides two types of fluorescent processes for reading data (see FIG. 16). The Type 1 or "negative" process involves stimulation of original green fluorescence of $F_2^{2+}$(2 Mg)-centers using blue laser light excitation at 435±40 nm. The intensity of this excitation is preferably significantly reduced to avoid two-photon absorption, but sufficient to generate green fluorescence enough for the reliable detection of information. Small volumes of $Al_2O_3$ crystal (voxels) subjected to two-photon ionization during writing show reduced or no fluorescence, whereas the unwritten voxels show high intensity of green fluorescence.

A type 2 readout process of the present invention for reading data, the so-called, "positive" readout process, involves using laser excitation at 335±40 nm to stimulate the fluorescence of $F_2^+$(2 Mg)-centers created during recording. The intensity of this excitation also is preferably significantly reduced to avoid two-photon absorption. The intensity of fluorescence of $F_2^+$(2 Mg)-centers in the region of 750 nm having an 80 ns lifetime is used as a measure of data during a "readout" process for binary or multilevel data storage.

Writing the data on the aluminum oxide media of the present invention using 2 PA and reading of data from the same media may be performed by means of laser induced fluorescence (LIF) and is preferably achieved through electron motion and electronic transitions. No phase transformation or other structural changes happen during "write" or "read" operations. This makes the process extremely fast and reproducible.

A process of writing data according to a preferred embodiment of the present invention will now be described. First the data storage media in the form of a Mg-doped anion-deficient $Al_2O_3$ single crystal is moved to a desired position with respect to the diffraction limited laser "write" beam, focused on a predetermined depth of the media by means of mechanical motion of the media or the adjustable components of the optical head.

Then, the data storage media is illuminated with the above-described focused beam of writing laser light having wavelength $\lambda_1$ for the period of time equal to a write time $t_1$. The above described "write" wavelength $\lambda_1$ is in the range of 380–480 nm with the most preferred wavelength equal to 405 nm. The two-photon absorption process usually may be achieved at laser intensity of not less than 10 MW/m². The above described "write" time $t_1$ is in the range of 0.01 ns to 1 ms with the most preferred time equal to 10 ns. The result of the writing operation is ionization and photo-conversion of $F_2^{2+}$(2 Mg)-centers into $F_2^{3+}$(2 Mg)-centers:

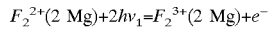

$F_2^{2+}(2\ Mg)+2h\nu_1=F_2^{3+}(2\ Mg)+e^-$

Electrons released from $F_2^{2+}$(2 Mg)-centers as a result of the photo-ionization process are captured by deep traps and other nearby $F_2^{2+}$(2 Mg)- and $F^+$-centers:

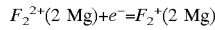

$F_2^{2+}(2\ Mg)+e^-=F_2^+(2\ Mg)$

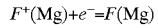

$F^+(Mg)+e^-=F(Mg)$

The above-described deep trapping sites are able to store information almost indefinitely.

The present invention provides three preferred modes of reading data using a confocal laser induced fluorescent detection scheme. The first mode reads the same writing laser beam of wavelength $\lambda_1$, corresponding to an absorption band of $F_2^{2+}$(2 Mg)-centers, but with significantly reduced intensity and time of illumination to avoid two-photon absorption and erasure of stored data. The second mode of operation the reading laser beam has a wavelength $\lambda_2$ longer than $\lambda_1$, but it is still within the absorption band of $F_2^{2+}$(2 Mg)-centers. For example, wavelength $\lambda_2$ is selected to be 440 nm. A longer wavelength further reduces the probability of 2 PA and allows one to use higher laser light intensity for excitation of fluorescence and to achieve a better signal-to-noise ration (SNR). These two modes of reading operation utilize a fluorescent emission band of $F_2^{2+}$(2 Mg)-centers in the region of 520 nm. Lifetime of this fluorescence is 9±2 ns and is fast enough to achieve a 100 Mbit/s data transfer rate. A strong fluorescence signal corresponding to a 0 binary state indicates that no writing operation was performed on the particular voxel. Reduced fluorescence may be digitized for binary or multilevel types of data. These two modes of reading may be referred to as "negative" types of operation. The third mode of reading operation utilizes fluorescence of $F_2^+$(2 Mg)-centers (three electrons occupying the aggregate defect) created as a result of trapping the electron by the $F_2^{2+}$(2 Mg)-centers during writing operation:

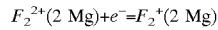

$F_2^{2+}(2\ Mg)+e^-=F_2^+(2\ Mg)$ $F_2^+$(2 Mg)-centers may be excited in their absorption band in the region of 335 nm or in $F^+$-center absorption band at 255 nm. Emission of these centers is in the infrared region and is in the region of 750 nm (see FIG. 9 for details of excitation and emission spectra). The lifetime of the 750 nm emission is 80±10 ns (see FIG. 10) and is short enough for a data transfer rate up to 10 Mb/s.

A preferred reading operation of the present invention will now be described. First, the above described data storage media is moved to a desired position with respect to a focused "read" laser beam of the same wavelength $\lambda_1$ or another wavelength $\lambda_2$. The above-described wavelength $\lambda_2$ is in the range of 420–480 nm with the most preferred wavelength equal to 440 nm. Then, the above described data storage media are illuminated with the above described focused beam of "read" light for the period of time equal to a "read" time $t_2$. The above described "read" time $t_2$ is in the range of 0.1 ns to 1 ms with the most preferred time equal to 5 ns. The laser-induced fluorescence produced by the $Al_2O_3$ data storage media is then measured using a photodetector. The above-described LIF is the "data" light at the third wavelength $\lambda_3$ in the region of 750 nm and is in the range from 620 nm to 880 nm. The above-described fluorescent signal is then processed to obtain the value of the stored data.

Figure 17:
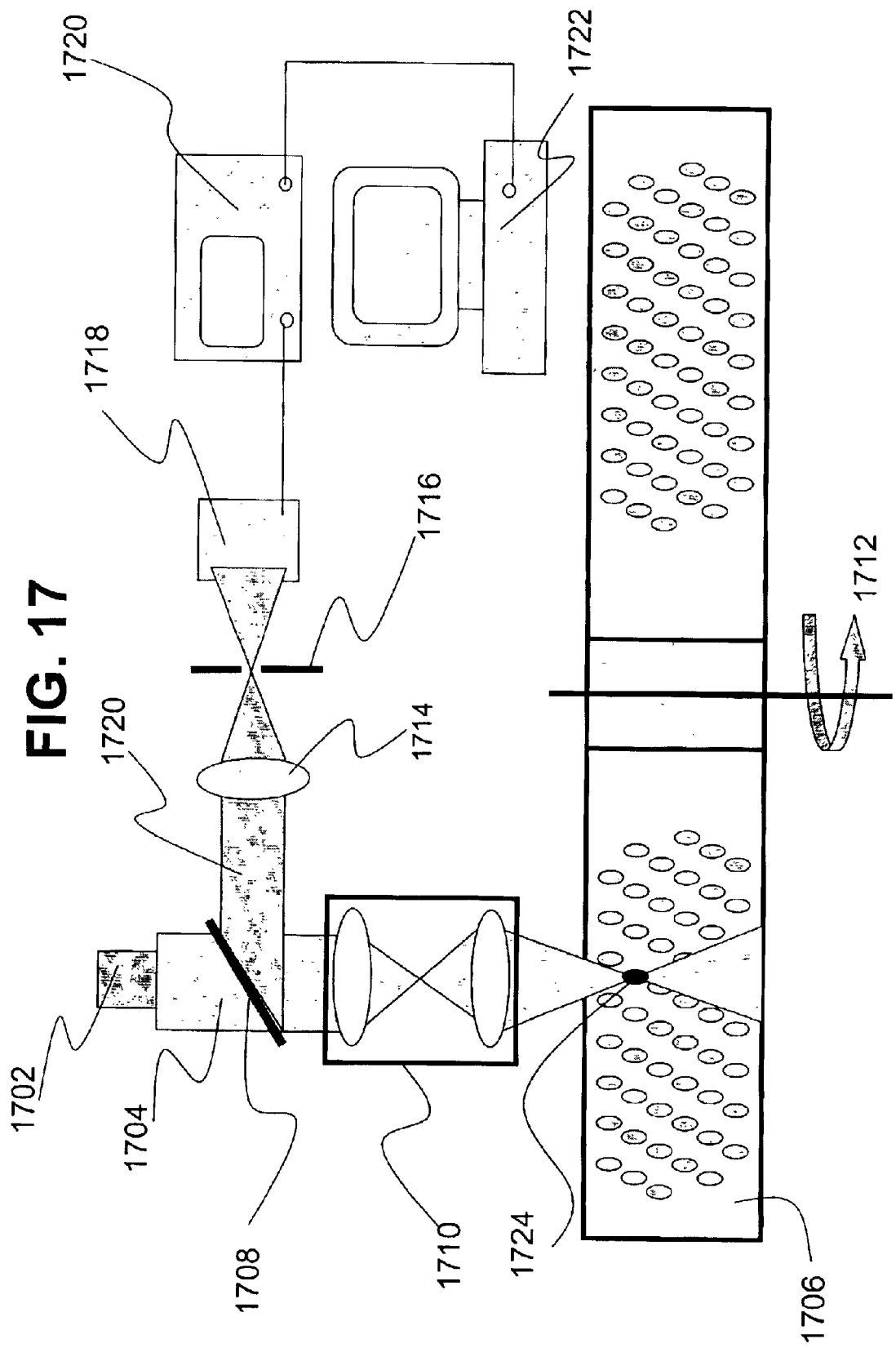
FIG. 17 is a schematic diagram of an optical data storage drive according to a preferred embodiment of the present invention with removable $Al_2O_3$ crystal media, writing using two-photon absorption and reading using laser-induced fluorescence with a confocal detection scheme.

A simplified scheme illustrating how the crystalline material may be used in an optical data recording and retrieving drive is illustrated by FIG. 17. In scheme 1700, a 405 nm "write" laser beam 1702 and 440 nm "read" laser beam 1704 are produced by two Nichia diode lasers (not shown). Laser beams 1702 and 1704 are directed on a single crystalline disk 1706 through a dichroic mirror 1708 and a high NA focusing objective lens 1710. A single crystal disk made of $Al_2O_3$:C,Mg crystal 1706 spins, as shown at 1712, and an optical pick-up head that combines objective lens 1710, dichroic mirror 1708, focusing lens 1714, a confocal pinhole 1716 and a photodetector 1718 slides along the radius of the disk. Selection of the focus depth (or certain data layer within 3D volume of the disk) and correction of spherical aberrations are performed by moving an additional optical component of an optical pick-up head (not shown). A photodetector 1718 is used to monitor laser-induced fluorescence during writing and reading. A green fluorescence 1720 reflected by dichroic mirror 1708, is focused by lens 1714 on confocal pinhole 1716, and detected by custom-made electronics or a digital oscilloscope 1720 interfaced with a computer 1722. Two-photon absorption during a "write" operation allows for very tight localization of the photo-ionization process in the focal spot of the laser beam and 3D confinement of the written bit 1724. One-photon excitation of the fluorescent media 1706 using "read" laser light 1704 of a longer wavelength and a confocal fluorescence detection scheme allows one to perform non-destructive reading of bits multiple times.

3D holographic data storage promises an extreme density of data storage exceeding 1 TB per cm³ and the highest possible data transfer rate in excess of 10 Gbit/s. Holographic data storage technology is under development already for 40 years, and the main obstacle is still the absence of a media that satisfies numerous important requirements. Some of them are: high diffraction efficiency, high sensitivity to writing laser light, non-destructive reading, ability to perform optical erasure, thermal stability of information, low environmental light sensitivity, high optical quality and dimensional stability (no shrinkage).

Contrary to so-called photorefractive crystals like $LiNbO_3$, $Al_2O_3$ is considered to be a photochromic material, in which the change of absorption coefficient causes a certain change in refraction index. A holographic grating has to be written using two intersecting coherent laser beams (an object beam and a reference beam) with a wavelength corresponding to the maximum absorption band in the photochromic material. The main problem for most photo-refractive crystals is thermal instability of traps (fading of information at ambient temperatures) and relatively low sensitivity to recording laser light and difficulty to achieve optical erasure and non-destructive reading.

$Al_2O_3$:C,Mg crystalline materials of the present invention have a definite advantage for holographic recording and reading information due to high concentration of color centers, efficient photochromic transition under 2-photon absorption, ability to perform non-destructive reading using 1-photon absorption, ability to perform optical erasure of information and existence of deep traps tested for their thermal stability.

In one preferred embodiment, the present invention utilizes holographic recording and reading photochromic transition of absorption bands centered at 435 nm and 335 nm associated with the aggregate oxygen vacancy defects and Mg ions and denoted here as $F_2^{2+}(2\ Mg)$ and $F_2^+(2\ Mg)$ centers, respectively. These bands appear in $Al_2O_3$ crystals doped with Mg impurity and grown in a highly reducing atmosphere in the presence of graphite. The major positive feature of these color centers is that their excited state is located deep in the energy gap of $Al_2O_3$ and that they have a relatively large photo-ionization cross-section.

As in the case of confocal fluorescent one-bit data storage, to perform recording of a holographic grating, two photons preferably arrive with a relatively short interval of time and are absorbed by the center. The first photon performs excitation of the center from the ground state into the excited state having a lifetime on the order of 9 ns and the second photon performs photo-ionization of the center with the electron transition from the excited state into the conduction band. A two-photon absorption-ionization process is followed by trapping of a released electron on one of the deep traps. One of the possible traps is another $F_2^{2+}(2\ Mg)$ center, which, after capturing an electron, converts into $F_2^+(2\ Mg)$ center.

One of the preferred techniques for optical data storage utilizing the $Al_2O_3$ material of the present invention is the technique of optically stimulated luminescence (OSL). This technique is different from laser-induced fluorescence described above. In a preferred OSL "write"-process, free charge carriers are generated by photo-ionization of color centers in storage media using UV light and are trapped by relatively deep trapping centers. Visible laser light stimulation releases charge carriers from traps followed by their radiative recombination with the luminescent centers. Luminescence detected during the laser stimulation is a data signal. A high efficiency OSL process requires a high concentration of both the traps and the luminescent centers. The electron traps in $Al_2O_3$ that may be used for information storage were investigated and monitored using thermoluminescent (TL) techniques or using optical absorption spectroscopy combined with isothermal step-annealing procedures after charge carrier generation caused by gamma-irradiation or light excitation at room temperatures. Several deep traps were identified in anion deficient $Al_2O_3$ using these two techniques, see Akselrod M. S. and Gorelova E. A., Deep Traps in Highly Sensitive $\alpha$-$Al_2O_3$:C TL Crystals, Nucl. Tracks Radiat. Meas., Vol. 21, No. 1, pp. 143–146 (1993), the entire contents and disclosure of which is hereby incorporated by reference. An electron trap responsible for the TL peak at about 450 K is known as a main dosimetry trap used in TL and OSL dosimetry. Several other efficient deep traps with a delocalization temperature at approximately 670, 900 and 1200 K were also identified using methods of photo-transferred thermoluminescence, Akselrod M. S. and Gorelova E. A., Deep Traps in Highly Sensitive $\alpha$-$Al_2O_3$:C TL Crystals, Nucl. Tracks Radiat. Meas., Vol. 21, No. 1, pp. 143–146 (1993), high temperature TL, see G. Molnar, M. Benabdesselam, J. Borrosay, D. Lapraz, P. Iacconi, and M. Akselrod, Influence of the Irradiation Temperature on TL Sensitivity of $Al_2O_3$:C, Radiat. Measurements, v. 33, 619–623 (2001), the entire contents and disclosures of which are hereby incorporated by reference. Three shallow traps with the temperature of TL peaks at 220, 260 and 310 K were also reported, see M. S. Akselrod and V. S. Kortov, Thermoluminescent and Exoemission Properties of New High-Sensitivity TLD $\alpha$-$Al_2O_3$:C Crystals, Radiat. Prot. Dosim., Vol. 33, No. 1–4, pp. 123–126 (1990), S. Kortov, T. S. Bessonova, M. S. Akselrod, and I. I. Milman, Hole-Induced Exoelectron Emission and Luminescence of Corundum Doped with Mg, Phys. Stat. Sol. (a), Vol. 87, pp. 629–639 (1985), and P. A. Kulis, M. J. Springis, I. A. Tale, V. S. Vainer and J. A. Valbis, Impurity-associated colour centers in Mg- and Ca-doped $Al_2O_3$ single crystals, Phys. Stat. Sol. (b), Vol. 104, pp 719–725, (1981), the entire contents and disclosures of which are hereby incorporated by reference. The effect of these shallow traps may be significant because of their thermal instability causing capture and release of electrons thus delaying the electronic processes. According to a preferred embodiment of the present invention, additional doping of $Al_2O_3$:C,Mg with H ions decreases the concentration of the shallow traps and makes the luminescent material for optical data storage application faster to respond to laser stimulation.

Writing the data on and reading of data from the $Al_2O_3$ crystalline material of the present invention may be performed using an optically stimulated luminescence process and is achieved by transport of electrons and holes and by electronic transitions. No phase transformation or other major structural changes are performed during write/read operation. Slight local crystal lattice deformation and relaxation is possible as a result of electronic transition and charge redistribution around oxygen vacancy defects. This makes the process extremely fast and reproducible. The $Al_2O_3$ crystalline material of the present invention may be written utilizing UV light or two-photon absorption of more intensive blue laser light, and the information stored on the traps may be retrieved using light of another wavelength (green-blue) or two-photon absorption of IR laser light around 800 nm. The information is retrieved from the storage media in the form of luminescent light within the emission band in the region of 330 nm.

In a preferred embodiment of the present invention employing the $Al_2O_3$ crystalline material of the present invention, the data write process includes the following steps: moving the data storage media in the form of a doped $Al_2O_3$ single crystal or doped $Al_2O_3$ thin film deposited on a substrate to a desired position with respect to a focused spot of the "write" beam and illuminating the data storage media with the above described focused beam of "write" light (write wavelength 1) for the period of time equal to a write time. The above described "write" wavelength 1 is in the range of 180–460 nm with the most preferred wavelength equal to 205 nm. A two-photon "writing" process may be achieved at 410 nm. The above described "write" time is in the range of 0.1 ns to 1 s with the most preferred time equal to 1 ns.

In a preferred embodiment of the present invention employing the $Al_2O_3$:C,Mg,H crystalline material of the present invention, the data "read" process includes the following steps: moving the above described data storage media to a desired position with respect to a focused spot of the "read" beam, illuminating the above described data storage media with the above described focused beam of "read" light (wavelength 2) for the period of time equal to a "read" time (time 2). The above described "read" wavelength 2 is in the range of 460–900 nm with the most preferred wavelength equal to 532 nm. The above described "read" time 2 is in the range of 0.1 ns to 1 s with the most preferred time equal to 1 ns. The above-described OSL is the "data" light at the third wavelength 3 and is in the range from 250 nm to 600 nm with the most preferred wavelength at 330 nm. In all cases, the above-mentioned three types of light ("write"-light, "read"-light and "OSL data"-light) have different wavelengths and are optically separated using different lasers and optical filters.

Compared with known materials and technologies for optical data storage, the present invention provides several advantages. Utilization of fundamentally very fast electronic processes vs. comparatively slow phase change transitions and photo-induced polymerization for well known techniques provides a data transfer rate for one channel of up to 100 Mb/s. High data storage density is achieved due to 3D capability of the proposed materials and confocal detection schemes restricted only by the blue laser light diffraction limit and NA of the optical head. Multiple data layers may be accessed in the bulk of the media during writing and reading operations using two-photon absorption techniques and confocal detection schemes. Non-volatile reading is achieved using one-photon excitation of fluorescent centers causing no degradation of stored information. Multilevel (multivalue) data storage may further increase data storage density due to linearity of luminescent response. Low average laser light intensities required for "writing" and "reading" of information (mW range) allows one to preferably use compact blue laser diodes. Well-established and efficient crystal growth technology produces $Al_2O_3$ crystals of high optical quality.

The present invention also allows parallel processing of multiple marks on the storage media for further increase of "write" or "read" rate and data storage density. Parallel processing is one of the main advantages of optical data recording. One may use one-dimensional or two-dimensional arrays of lasers and photo-detectors (CCD chips or CMOS detectors). The storage media of the present invention also provides thermal, temporal and environmental stability of the media and stored data. The common problem for fluorescent and photorefractive data storage media is the thermal instability and result in thermal erasure of stored information. $Al_2O_3$ doped with carbon and magnesium exhibits extremely good thermal and temporal stability of information stored as electrons trapped on localized states formed by oxygen vacancy defects in the crystal structure. Lifetime of the charge carriers on traps depends on storage temperature. The higher the temperature, the smaller the lifetime. The deeper the traps—the longer the storage time. Most of the trapped electrons are associated with a 650° C. trap that has extremely high thermal and optical depth. $Al_2O_3$ crystals are very mechanically, chemically and optically stable and do not show degradation of performance for years. It was also shown that the recorded data is not erased by conventional room light illumination and the media does not require light protection.

Massive data storage is not the only goal of the present invention. Classic computer architecture, based on sequential processing, severely limits computation speed. New architectures using multiprocessors may solve this problem to some extent. Complex interconnection among processors is difficult to realize using traditional wires or planar microcircuits in an electronic machine. The limitation factor in ultimate speeding up of conventional computers does not arise from the inadequate speed of basic elements. Rather, interconnections are the limiting factor. New concepts of optical computing, see for example D. G. Feitelson, Optical computing. Pub. MIT Press, USA (1988), the entire contents and disclosure of which is hereby incorporated by reference, may have some essential advantages in image processing and some fields of computer simulations involving great masses of computation. Optical processing allows millions of data channels to operate in parallel with a bandwidth much greater than that of any electronic link. Parallelism gives rise to high-speed data processing. Optical links are not subject to electromagnetic interactions, and, finally, researchers believe that optical systems would be smaller, lighter and simpler than equivalent electronic computers.

The present invention will now be described by way of example. The example experiments described below are meant to be illustrative of the material and procedure described above and should not be considered to be definitive descriptions of the invention.

EXAMPLE I

A crystal of $Al_2O_3$:C,Mg made according to a preferred embodiment of the present invention was grown using a Czochralski crystal growth technique (illustrated by FIG. 1) in argon atmosphere with added doping gases of carbon monoxide in the amount 8800 ppm (0.88%). Magnesium impurity in the amount of 550 ppm (0.055%) was added as $MgAl_2O_4$ spinel crystal loaded to the stock of $Al_2O_3$ crystals loaded into the crucible. The amount of the Mg impurity measured in the grown crystal using spectral analysis was equal to 27 ppm. A highly reducing atmosphere and low partial pressure of oxygen that stimulates the creation of oxygen vacancies in the $Al_2O_3$ crystal structure was obtained using a hot graphite susceptor coupled to the inductor of an induction-heating furnace. Crystal growth was performed at 2050° C. with a pulling rate of 5 mm/min and 10 revolutions of the seed per minute. The crystals in the shape of a boule having a 45 mm diameter were obtained. Crystals were then cut in to 1 mm thick disks and polished on both sides to obtain optical quality surfaces. The grown crystal had 30 $cm^{-1}$ of absorption in the F-center band at 205 nm and an absorption coefficient of 10 $cm^{-1}$ in the $F^+$-centers absorption band at 255 nm and 1.2 $cm^{-1}$ of absorption at 435 nm corresponding to absorption of $F_2^{2+}$(Mg)-center (see FIG. 4). All absorption coefficients are presented after subtraction of the background pedestal. According to Smacula's formula, an absorption coefficient may be converted into a concentration of F-centers equal to $8.6 \cdot 10^{17}$ $cm^{-3}$ and concentration of $F^+$-centers equal to $2.6 \cdot 10^{17}$ $cm^{-3}$ and $1.7 \cdot 10^{16}$ $cm^{-3}$ of $F_2^{2+}$(Mg)-centers. The later number indicates that there are 17,000 fluorescent centers per cubic micron of a storage media.

EXAMPLE II

Optical absorption spectra of the new crystalline material of the present invention tested as described above and of a known $Al_2O_3$:C crystal are illustrated in FIG. 4. The intensity of $F^+$-bands at 230 and 255 nm is significantly higher in Mg-doped crystals. That indicates higher concentration of $F^+$-centers charge compensated by the $Mg^{2+}$-ions. A new blue absorption band at 435 nm indicates the creation of aggregate $F_2^{2+}(2\ Mg)$ defects used in the current invention.

The evidence of the importance of Mg-impurity in production of $F^+(Mg)$ and $F_2^{2+}(2\ Mg)$ centers is the dependence of corresponding absorption band intensity on the impurity concentration introduced into the crystal during crystal growth (FIG. 12 and FIG. 13). The dependence is characteristic of the concentration dependence of a luminescence output on impurity content in laser host crystals and TLD phosphors.

EXAMPLE III

To justify the appropriate wavelength range of excitation and emission light, the emission-excitation spectra of aggregate centers in $Al_2O_3$ doped with Mg and C in two different states were obtained (FIG. 7 and FIG. 9). The spectra were obtained using a spectrofluorimeter equipped with pulsed Xe-lamp, two scanning Acton Research spectrographs and a cooled CCD from Princeton Instruments. It was shown that a fresh (or erased) crystal shows an intense green luminescence band in the region of 520 nm with the excitation band corresponding to the blue absorption band at 435 nm shown also earlier in FIG. 4. After a writing (bleaching) operation, the green emission band disappears almost completely and the crystal shows an intensive emission band in the region of 750 nm with excitation bands at 255 nm and 335 nm corresponding to $F^+(Mg)$- and $F_2^+(2\ Mg)$ absorption bands respectively. Both emission bands: green band at 520 and IR band at 750 nm corresponding to $F_2^{2+}(2\ Mg)$- and $F_2^+(2\ Mg)$-centers have a short lifetime of about 9 and 83 ns respectively (see FIGS. 8 and 10).

EXAMPLE IV

A crystal of $Al_2O_3$:C,Mg,H made according to a preferred embodiment of the present invention was grown using a Stepanov crystal growth technique in argon atmosphere with added doping gases of carbon monoxide in the amount 8800 ppm (0.88%) and hydrogen in the amount of 1300 ppm (0.13%). 400 ppm of magnesium impurity in the form of MgO powder was added to the stock of $Al_2O_3$ crystals loaded into the crucible. A highly reducing atmosphere and low partial pressure of oxygen below $10^{-15}$ atm that stimulated creation of oxygen vacancies in the $Al_2O_3$ crystal structure was obtained using a hot graphite susceptor coupled to the inductor of an induction heating furnace. Crystal growth was performed at 2050° C. with a pulling rate of 60 mm/hour. The crystal in the shape of a rod having 12.5 mm in diameter was obtained. The crystal was then cut into 1 mm thick disks and polished on both sides to obtain optical quality surfaces.

Optical absorption and fluorescent study of the $Al_2O_3$:C, Mg,H crystal grown according to the above-described Stepanov method showed optical properties similar to that described for the Czochralski grown crystal and illustrated by FIGS. 4–11. The tested crystal had an absorption coefficient of 47 $cm^{-1}$ in the absorption band of F-center at 205 nm and an absorption coefficient of 17 $cm^{-1}$ in the $F^+$-centers absorption band at 255 nm and an absorption coefficient of $F_2^+(2\ Mg)$-centers at 435 nm equal to 0.9 $cm^{-1}$.

The maximum of OSL output in the $F^+$-emission band was observed at the optimum concentration of Mg equal to 27 ppm. According to Smacula's formula, an absorption coefficient may be converted into a concentration of F-centers equal to $2.6 \cdot 10^{17}$ $cm^{-3}$ and a concentration of $F^+$-centers equal to $1.06 \cdot 10^{17}$ $cm^{-3}$. A strong emission band of $F^+$-centers at 330 nm (see FIG. 5) was detected using Acton Research Spectrograph equipped with a cooled CCD from Princeton Instruments.

A fast PIN photodetector from ThorLabs and 4.5 ns, 255 nm laser pulses from the Continuum Panther laser system consisting of Nd:YAG pumping laser equipped with the 355 nm third harmonic generator and an optical parametric oscillator and storage oscilloscope Tektronix TDS-3054 were used to measure the lifetime time of $F^+$-center luminescence. It was shown that $F^+$-band emission has a short lifetime that is less 5 ns (see FIG. 6).

EXAMPLE V

A "write" operation was performed on $Al_2O_3$:C,Mg crystal sample produced as described in the Example I and the Continuum Panther laser system described above in Example IV. The laser system was tuned to generate a signal beam at 430 nm with the pulse duration of 4.5 ns and 60 $\mu J/mm^2$ of energy density per pulse at the sample location. Reading of the written areas using Type 1 (or negative operation) was performed with the blue laser diode from PicoQuant (0.6 mW of average power, 60 ps pulses with repetition rate of 20 MHz). Fluorescence at 520 nm was detected using a long pass glass filter OG515, Hamamatsu PMT H5783-06 and Tektonix TDS-3054 oscilloscope. A fluorescent signal with decay time of 9 ns is presented in FIG. 8. The amplitude of the pulsed fluorescent signal did not show any decrease for several hours indicating that there is only one-photon absorption that takes place during reading operation. A short lifetime of the above-described green luminescence allows one to achieve up to 100 Mbit/s data transfer rate.

EXAMPLE VI

The "write" operation was performed using the same crystal sample as described in Example I and the same laser system described in Example IV. Reading of the written areas using Type 2 (or "positive" type of operation) was performed with the 335 nm UV beam from the same OPO laser system (100 nJ/pulse, 4.5 ns pulse duration and 10 Hz repetition rate). Fluorescence at 750 nm was detected using a long pass glass filter RG610 and a silicon photodiode DET-110 from ThorLabs, Inc. and Tektronix TDS-3054 oscilloscope. A fluorescent signal with decay time of 80±10 ns is presented in FIG. 10. An infrared fluorescence band at 750 nm of a bleached (written) crystal (see FIG. 9) has a longer lifetime than 520 nm green fluorescence of erased crystal media but it is still fast enough for the data transfer rate operation of up to 10 Mb/s.

EXAMPLE VII

Figure 18:
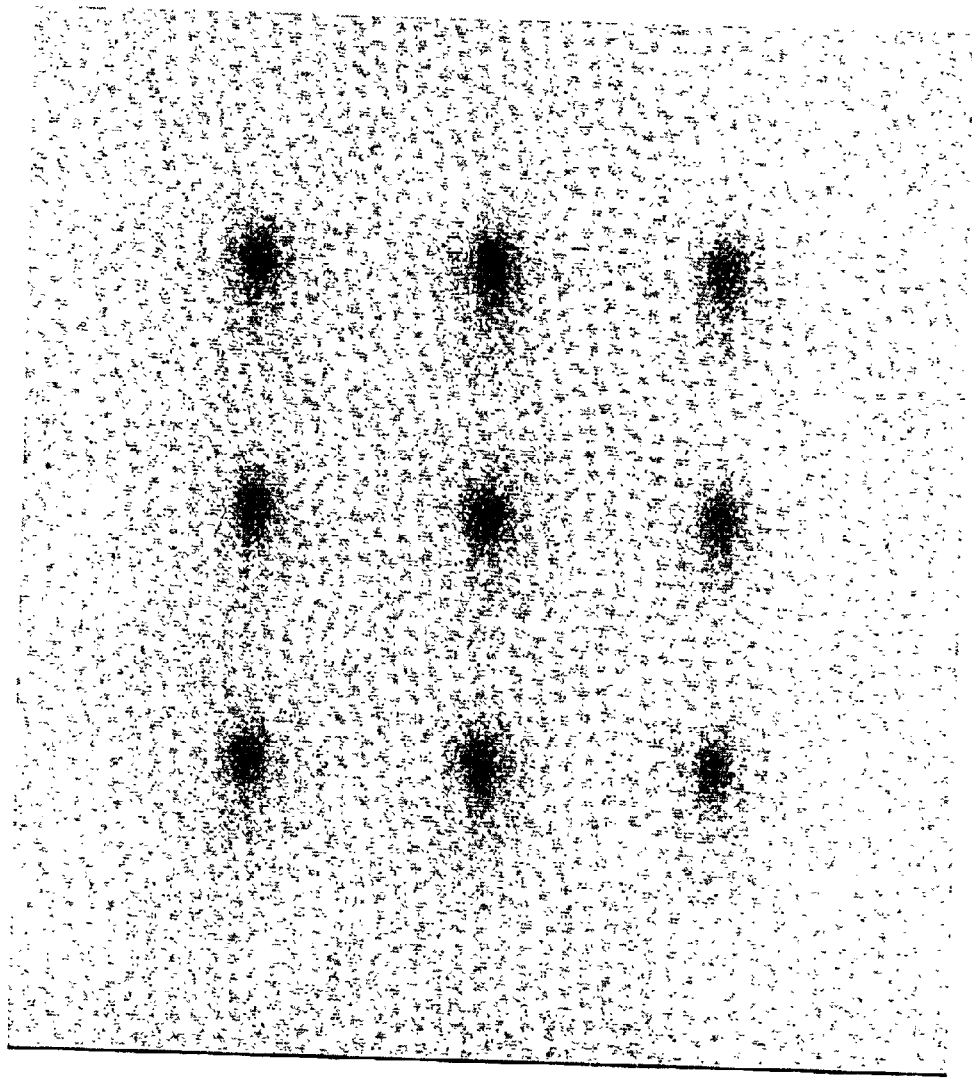
FIG. 18 is a graph illustrating use of an $Al_2O_3$:C,Mg crystalline material according to a preferred embodiment of the present invention for high density optical data storage in which a matrix of 3 by 3 bits spaced by 5 μm increments was recorded and read as an image in fluorescent contrast.

High density of data storage in $Al_2O_3$:C:Mg utilizing two-photon absorption during one-bit recording and confocal fluorescent detection scheme for reading is illustrated by the image of FIG. 18. A test of the material synthesized according to the present invention was performed using an apparatus similar to that described above and depicted in FIG. 17 in the following sequence. The "write" operation was done with a 405 nm diode laser beam at full power and the laser pulse duration was controlled with TTL pulses from the computer interface board. Decay of the fluorescent signal during writing operation was detected by the PMT and the oscilloscope and it was an indication of the successful writing. During reading operations, a CW low power blue diode laser (0.1 mW, 440 nm) modulated by another sequence of TTL pulses from a computer was used and green fluorescence separated by the dichroic mirror and the confocal pinhole was detected by the PMT and the photon counter. Matrix of 3 by 3 bits spaced 5 $\mu$m apart was recorded and read as an image in fluorescent contrast. Nine bits were written with 405 nm laser light and with recording energy of just 25 nJ per bit. The "read" operation was performed by scanning of the recorded area of the crystal storage media with the modulated CW laser diode having a wavelength at 440 nm that is longer than that of the "write beam" to prevent erasure of the information. To obtain the image of the written bits (see FIG. 18), scanning of the storage media was performed with piezo-actuated 3D stage from Polytec PI. The single photon pulses of the fluorescent signal were detected using PMT and a multichannel photon counter Stanford Research SR430 interfaced with a personal computer. Scanning of the crystal was performed at 0.2 $\mu$m increments and with a 153 $\mu$m/s scan rate. The modulation depth of the recorded bits was about 40% and a full width at half maximum for a single bit was equal to about 1 $\mu$m. Several layers of recorded bits were obtained with the separation between layers of about 10 $\mu$m.

EXAMPLE VIII

Figure 19:
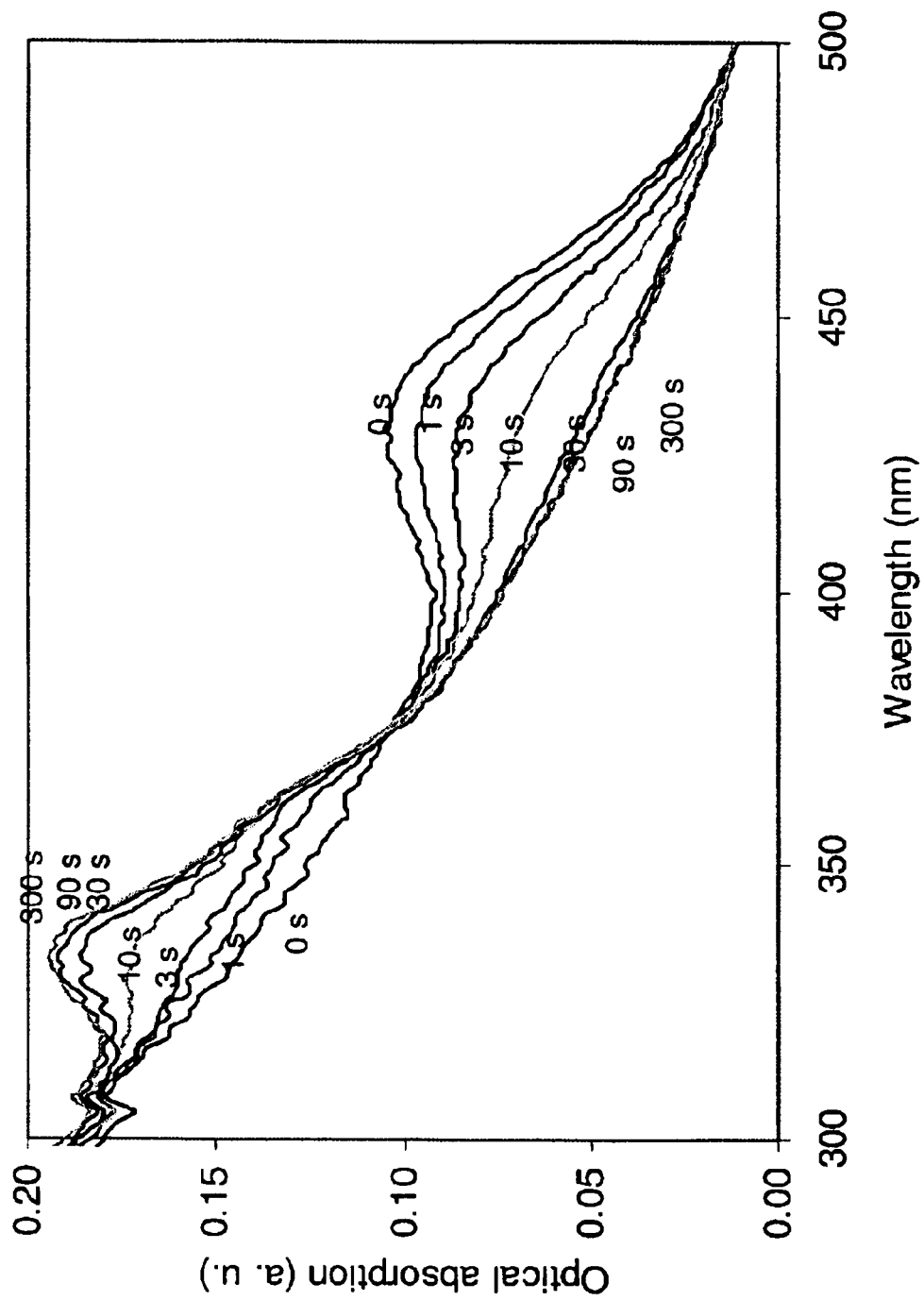
FIG. 19 is a graph illustrating the multilevel data storage principle based on the proportionality between 435 and 335 nm absorption band intensity and the "write" time for a $Al_2O_3$:C,Mg crystalline material of a preferred embodiment of the present invention.

FIG. 19 illustrates the multilevel data storage capabilities of the suggested optical storage media based on the inverse proportionality between 435 and 335 nm absorption band intensity as a function of writing time using 430 nm writing beam. The $Al_2O_3$:C,Mg crystal produced according to the Example I was subjected to an incrementing number of 430 nm "writing" laser pulses of the OPO laser system described in Example V. Each second of illumination corresponds to 10 laser pulses. Absorption at a 435 nm band associated with the 520 nm fluorescent signal reduces as a function of number of writing laser pulses whereas the absorption of 335 nm band associated with $F_2^+(2$ Mg) and infrared luminescence at 750 nm increases at the same time. Intensity of fluorescence corresponding to the excitation of these centers was proportional to the intensity of the above described absorption bands and was digitized onto several data values.

EXAMPLE IX

Erasing of written data from an $Al_2O_3$:C,Mg crystal was performed by illumination of an $Al_2O_3$:C,Mg crystal with incoherent UV light having 205±20 nm followed by pulsed illumination with laser light of 335 nm. An original strong absorption at 435 nm and fluorescence at 520 nm was restored.

The following demonstrates a write-erase cycle utilizing wavelengths corresponding to the wavelengths that may be generated by just one solid state laser: Nd:YAG with fundamental $1^{st}$ harmonic at 946 nm, $2^{nd}$ harmonic at 473 nm, $3^{rd}$ harmonic at 315 nm and $4^{th}$ harmonic at 237 nm. Tests were performed with a pulsed OPO system described in Example V. Photochromic transitions were monitored by a spectrophotometer and presented in FIG. 11. Initial absorption at 435 nm of the color centers was reduced by illumination with 472 nm laser light converting a 435 nm absorption band into a 335 nm absorption band. Part of the charge carriers was trapped by the $F^+$-centers converting them into F-center. Using the sequence of two illuminations: with a 236 nm laser light followed by a 316 nm laser light absorption of a 435 nm band was partially restored. It is impossible to completely restore an absorption band at 435 nm to the value of an as-grown crystal, but in a few write-read erase cycles, optical absorption stabilizes to the level of 70% of the original as-grown crystal.

EXAMPLE X

Figure 20:
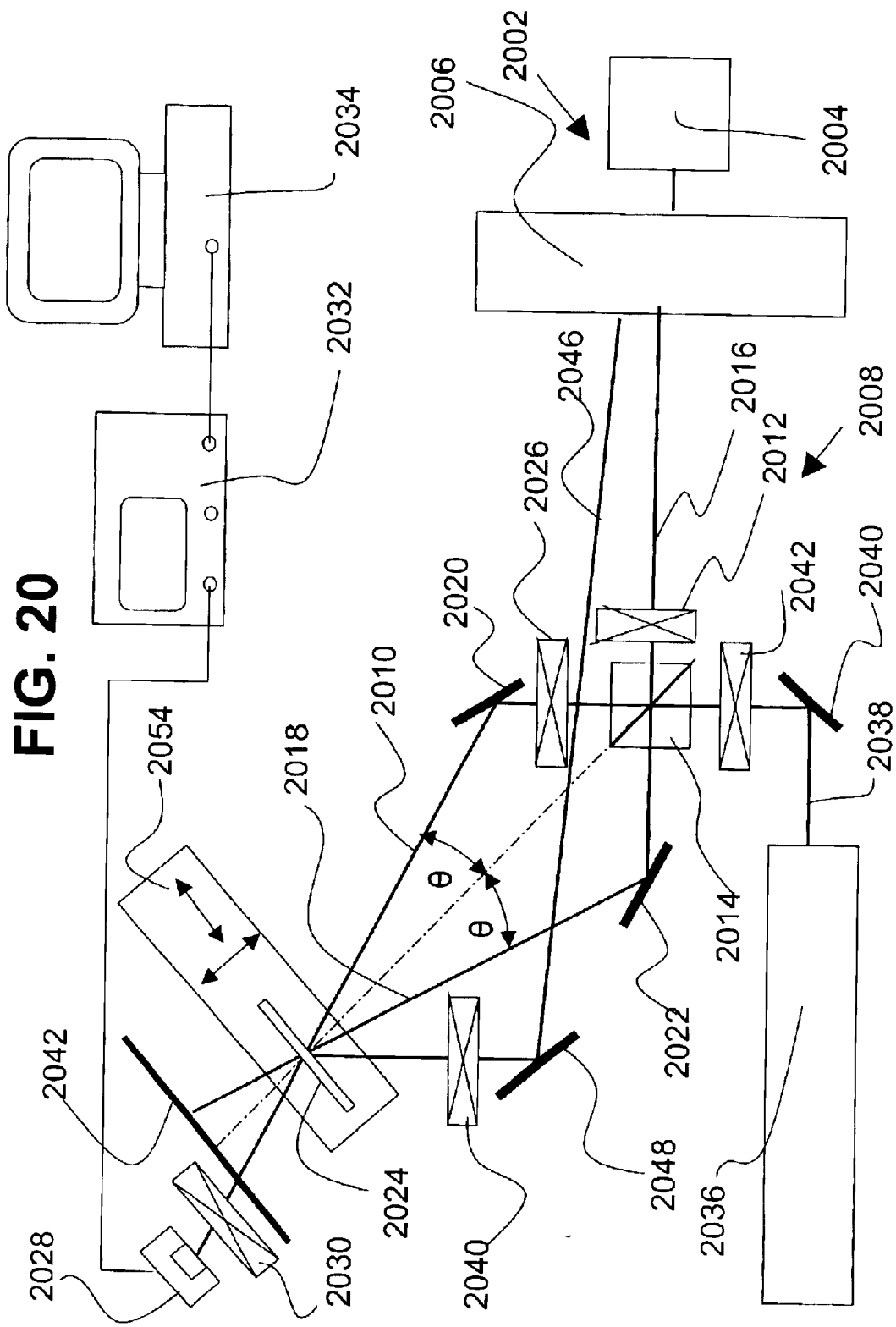
FIG. 20 is a schematic diagram of an experimental setup used for recording and reading of the holographic gratings in $Al_2O_3$:C,Mg material of a preferred embodiment of the present invention.

Holographic recording on $Al_2O_3$:C,Mg crystals was tested using a tunable pulsed laser system 2002 as shown in FIG. 20. Laser system 2002 included a Nd:YAG laser 2004 with a $3^{rd}$ harmonic generator as a pump source and an optical parametric oscillator (OPO) 2006 capable of producing 4.5 ns laser pulses in the wavelength range from 215 nm to 1200 nm. For this test, the laser system was tuned to a 442 nm wavelength that matches the wavelengths of a CW He—Cd laser that was used for non-destructive reading of a diffraction grating written with a pulsed laser.

FIG. 20 also depicts an optical scheme 2008. An output 442 nm laser beam 2010 from OPO 2006 was directed through a shutter 2012 on a beamsplitter 2014 to produce two beams of equal intensity: one is a signal beam 2016 and one is a reference beam 2018. Two mirrors 2020 and 2022 directed signal and reference beams on a $Al_2O_3$:C,Mg crystal 2024 at the angle of incidence $\theta$ to the normal to the sample plane. An optical C-axis of crystal 2024 was set parallel to the polarization direction of the laser light. Interference of two coherent laser beams produced modulation of an electromagnetic field inside crystal 2024. Two-photon absorptions in the region of interference ridges gave rise to photo-ionization of color centers responsible for a 435 nm band and produced modulation of a coefficient of absorption and modulation of a refraction index directly related to the absorption coefficient through the Kramers-Kronig relations. As a result, a 3D holographic grating was recorded in the volume of $Al_2O_3$:C,Mg crystal 2024. A shutter 2026 was used to interrupt the signal beam and left only reference beam 2018 to illuminate crystal 2024. Light diffracted on the holographic grating inside of $Al_2O_3$:C,Mg crystal 2024 appeared along the direction of signal beam 2016 and was monitored with a photodetector 2028. Photodetector 2028 was protected from strong illumination during the recording stage with a shutter 2030.

Figure 21:
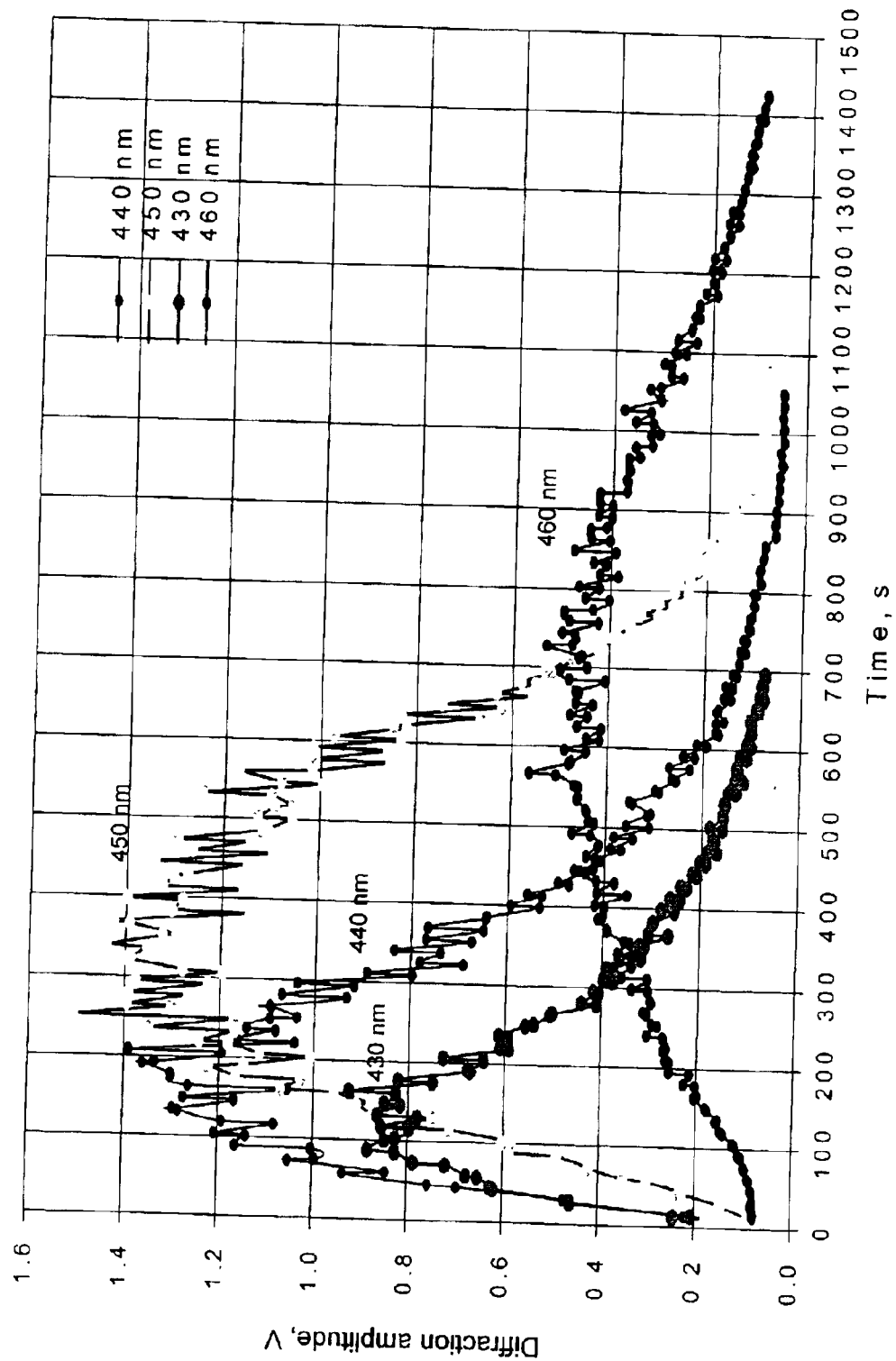
FIG. 21 is a graph showing holographic grating formation and decay in $Al_2O_3$:C,Mg at different laser wavelengths.
Figure 22:
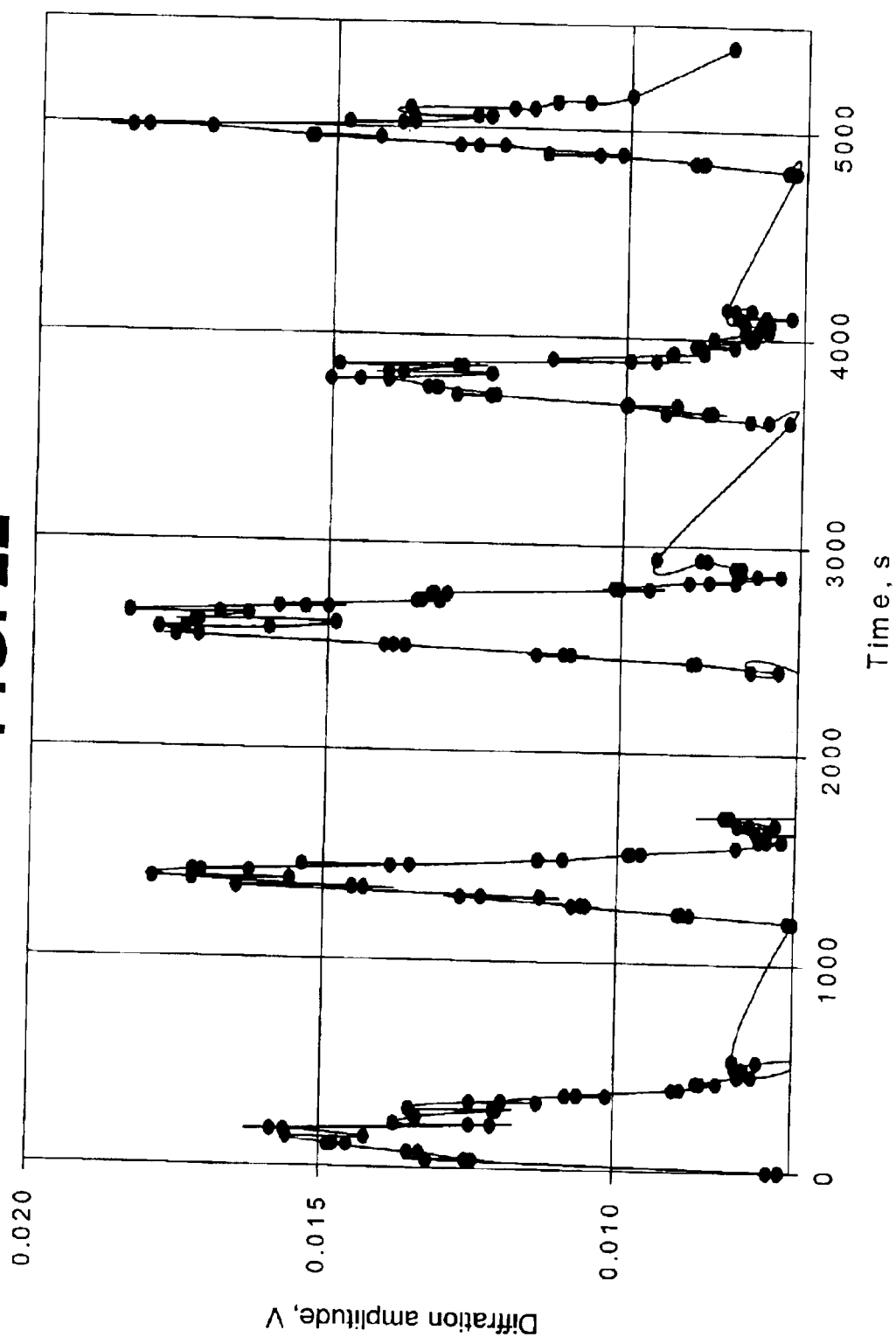
FIG. 22 is a graph illustrating "write-read-erase" cycles of holographic grating formation in $Al_2O_3$:C,Mg crystal of a preferred embodiment of the present invention.

By closing shutter 2026, opening shutter 2030 and measuring the diffracted signal with photodetector 2022, oscilloscope 2032 and computer 2034, the dynamic of holographic grating formation and destruction was monitored. FIG. 21 shows holographic grating formation and decay in $Al_2O_3$:C,Mg at different laser wavelengths. The most efficient recording of holographic grating was demonstrated at the wavelength of 440 nm.

EXAMPLE XI

Non-destructive reading of the holographic grating produced in an $Al_2O_3$:C,Mg crystal 2024 under pulsed laser light at 442 nm was demonstrated with a 75 mW CW He—Cd laser 2036 emitting light at the same 442 nm wavelength (see FIG. 20). A collimated CW laser beam 2038 reflected by a mirror 2040 was directed on an $Al_2O_3$:C,Mg crystal 2024 under the Bragg angle through an additional shutter 2042 and beam splitter 2014 used in Example X and mirror 2020 used during the recording stage of Example X. CW light with a power density of 50 mW/mm² was not able to perform photo-ionization of the color center in $Al_2O_3$:C, Mg and caused only one-photon absorption and diffraction of the CW reference laser beam in the direction of the photodetector. The results of continuous illumination of the $Al_2O_3$:C,Mg crystal 2024 with CW laser beam 2038 for 14 hours and monitoring the intensity of diffracted signal are presented in FIG. 23. There was no significant degradation of holographic grating after illumination of crystal 2024 with 3800 J of laser energy. This amount of laser energy should be enough to perform 51 million readings with 1 ms exposure used in holographic reading with fast CCD cameras capable of digitizing 1000 frames per second.

Figure 23:
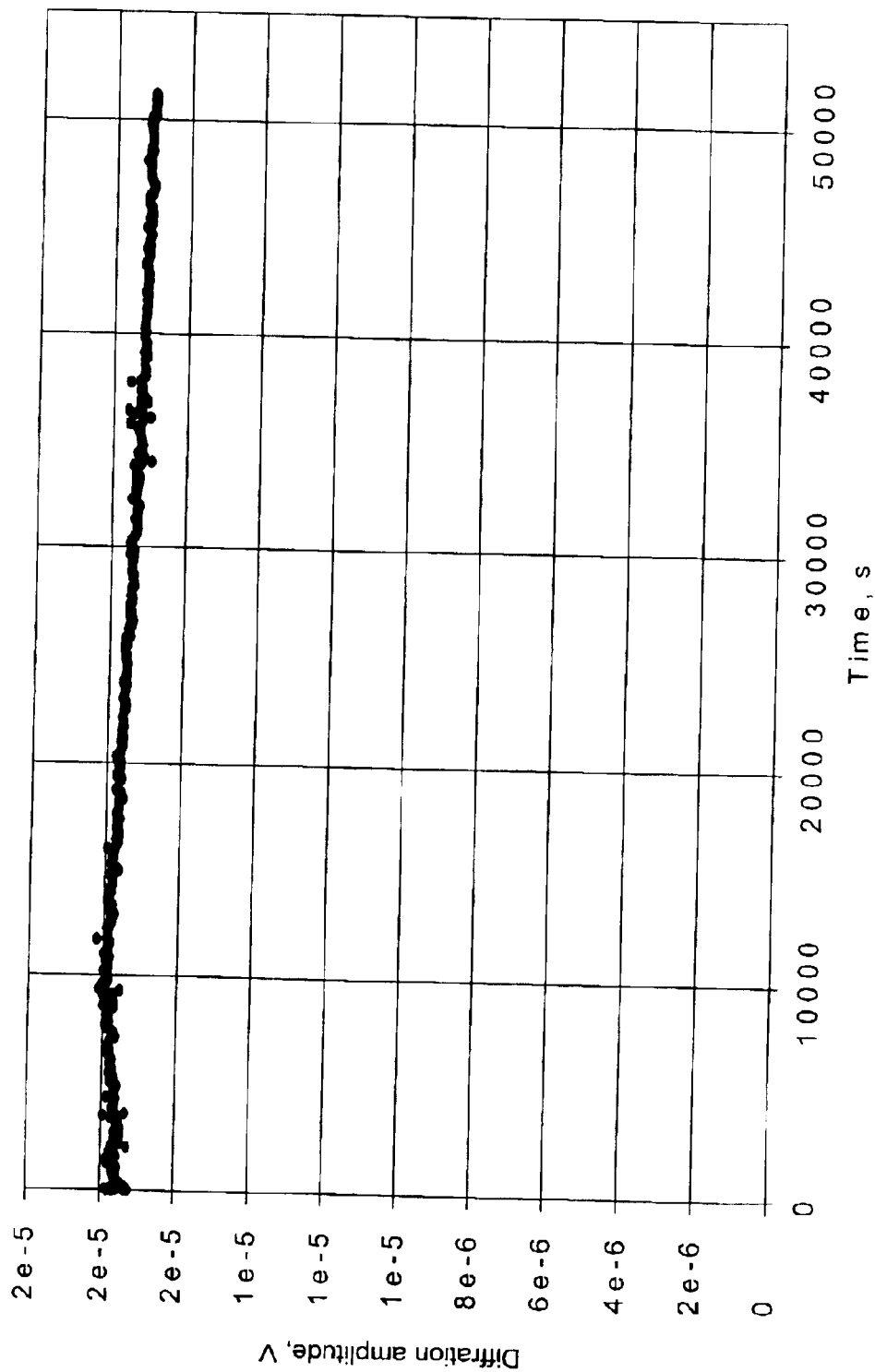
FIG. 23 is a graph showing the result of continuous illumination of the $Al_2O_3$:C,Mg crystal with a reference 442 nm CW laser beam for 14 hours and monitoring the intensity of diffracted signal previously written with two 442 nm pulsed laser beams.

Optical cycling with write, read and erase operations were demonstrated using laser light from the pulsed OPO laser system depicted in FIG. 20. Writing and reading of the holographic grating was performed as explained above in Example X at a wavelength equal to 442 nm. Erasure of the grating and restoration of an initial concentration of color centers responsible for an absorption band centered at 435 nm was done using a sequence of two illuminations with two different wavelengths: 215 nm and 330 nm. These two wavelengths were also generated by the laser system described above in Example X and depicted in FIG. 20. UV light 2046 for the erasing operation was directed on the $Al_2O_3$:C,Mg crystal 2024 by mirror 2048 through yet another computer controlled shutter 2050. The first illumination generated electrons by photo-ionization of F-centers responsible for the absorption band centered at 205 nm and the second one performed ionization of the band centered at 335 nm associated with $F_2^+$(2 Mg)-centers converting them back into $F_2^{2+}$(2 Mg)-centers and restoring original green coloration of crystal 2024. As shown in FIG. 23 cycling with Write-Read-Erase operations was performed many times without degradation of the diffraction efficiency. A screen 2052 was used for viewing reference beam 2018 and a translational stage 2054 was used to mount the test $Al_2O_3$:C, Mg crystals 2024.

EXAMPLE XII

Figure 24:
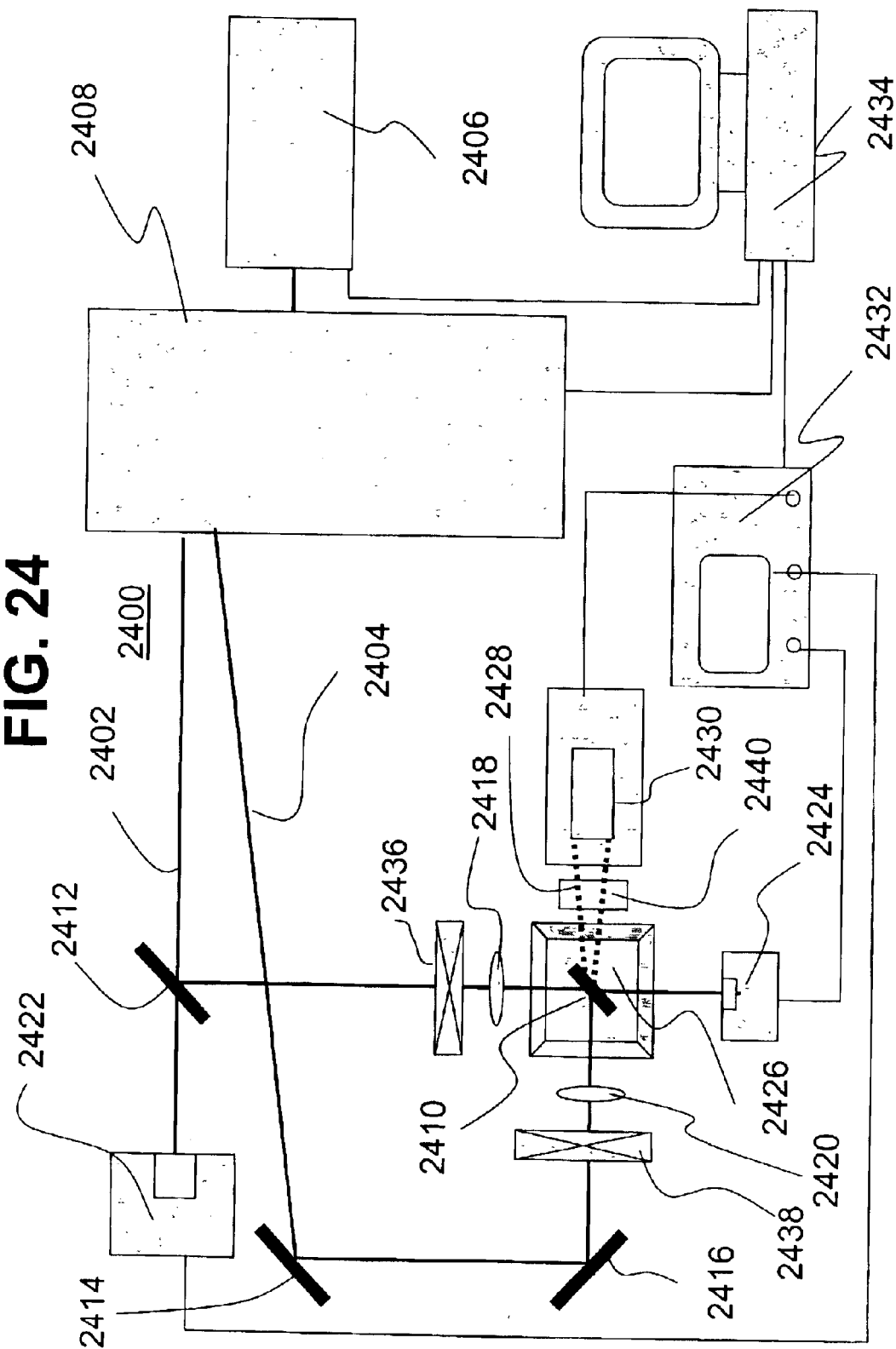
FIG. 24 is a schematic diagram of the test system utilizing an OSL readout technique and an $Al_2O_3$:C,Mg,H crystalline material according to a preferred embodiment of the present invention.

The "write-read" operations utilizing an OSL technique were performed using a crystal sample described in Example I and a laser system 2400 illustrated in FIG. 24. The "write" operation was performed with a pulsed laser beam having a wavelength at 215 nm. The "read" operation was performed with the laser pulse adjusted to 532 nm. The duration of both pulses was 4.3 ns. The pulse of the OSL "data" response in the emission band of $F^+$-centers at 330 nm (FIG. 5) was shown earlier in FIG. 6. The half width of the OSL "data" pulse is 4.7 ns and indicates that the lifetime of $F^+$-center emission is not longer that 1 ns.

An optical data recording and retrieving technique was tested using a laser system illustrated by FIG. 24. A 215 nm "write"-beam 2402 and a 430 nm or 532 nm "read"-beam 2404 are produced by the same tunable laser system based on Nd:YAG laser 2406 equipped with $2^{nd}$ and $3^{rd}$ harmonic generators and optical parameteric oscillator 2408 with UV doubling crystals. Laser beams 2402 and 2404 are directed on $Al_2O_3$:C,Mg,H crystal 2410 using beam splitter 2412 and mirrors 2414 and 2416, and focusing lenses 2418 and 2420. Laser power meter 2422 and fast PIN-diode 2424 were used to monitor the laser beams. $Al_2O_3$:C,Mg,H crystal 2410 was installed inside of a light-tight chamber 2426 and a "data" signal 2428 was detected by the photomultiplier tube (PMT) 2430 and the digital scope 2432 interfaced with the computer 2434. "Write" beam 2402 and "read" beam 2404 are controlled with electronic shutters 2436 and 2438.

All equipment is controlled by computer 2434. The test was performed in the following sequence. "Write"-shutter 2436 was open for a "write" time $t_1$ and the pulse of the "write"-beam 2402 having a duration at a half maximum of 4.5 ns was directed on the crystal 2410. Than "read" shutter 2438 was opened and the pulse of "read" laser beam 2404, also having a duration of 4.5 ns, was directed on the same spot of the storage crystal. During the "read" pulse, the OSL signal was detected using PMT 2430 and digital scope 2432. PMT 2430 had a band-pass filter 2440 in front of the window to optically discriminate the OSL "data" signal having wavelength of 330 nm (see FIG. 5) with the half of the bandwidth equal to 50 nm from the stimulation "read" laser light having wavelength of 430 or 532 nm.

Figure 25:
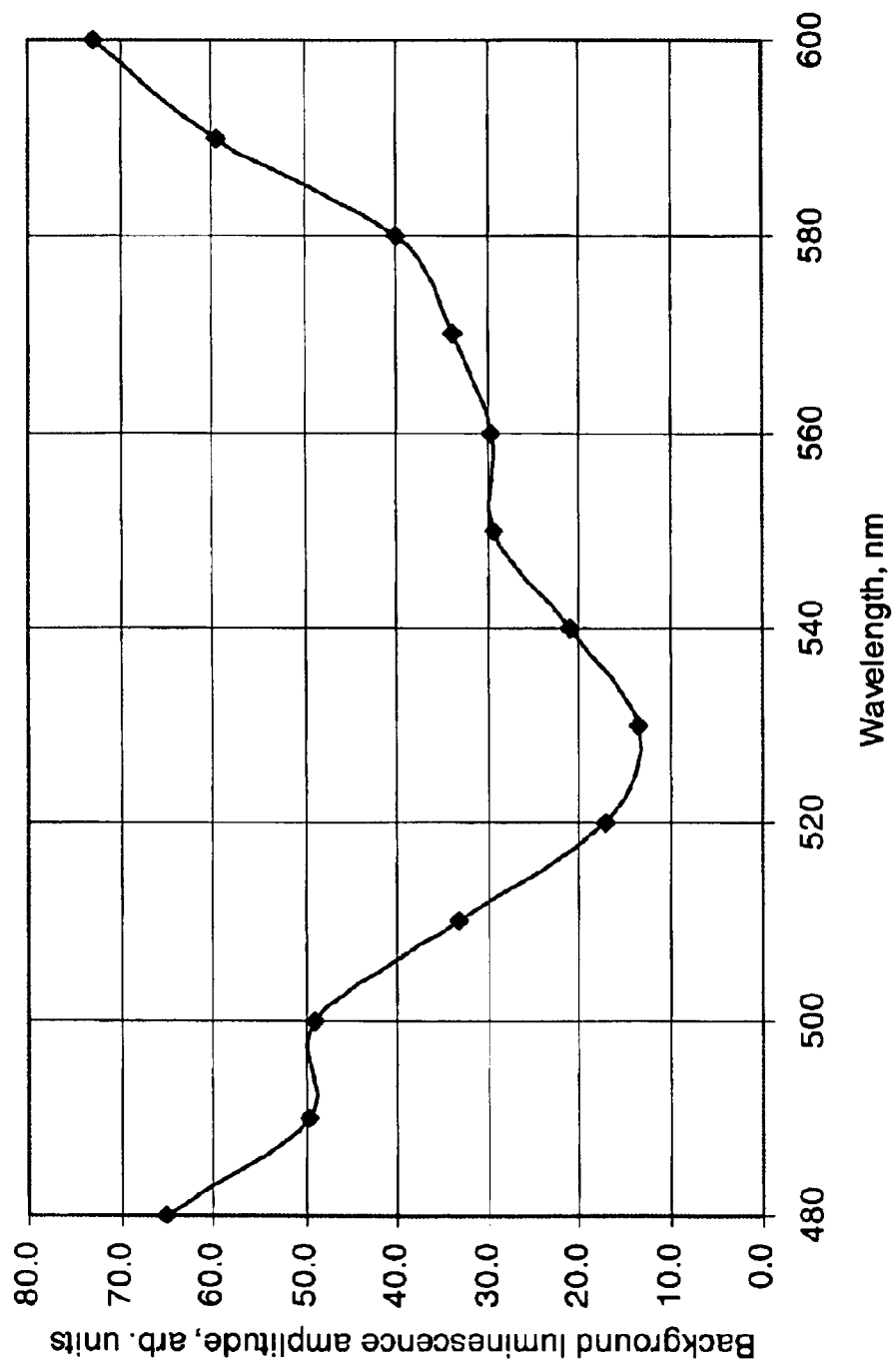
FIG. 25 is a graph illustrating the selection of a preferred wavelength (532 nm) of the OSL "read"-beam where the minimum background fluorescent signal from unwritten $Al_2O_3$:C,Mg,H crystal according to a preferred embodiment of the present invention was used as a criterion for this selection.

The 532 nm wavelength was preferred because it produced a lower background luminescent signal and allowed for a higher signal-to-noise ratio. The later result is illustrated by the wavelength dependence of the background signal shown in FIG. 25.

EXAMPLE XIII

Figure 26:
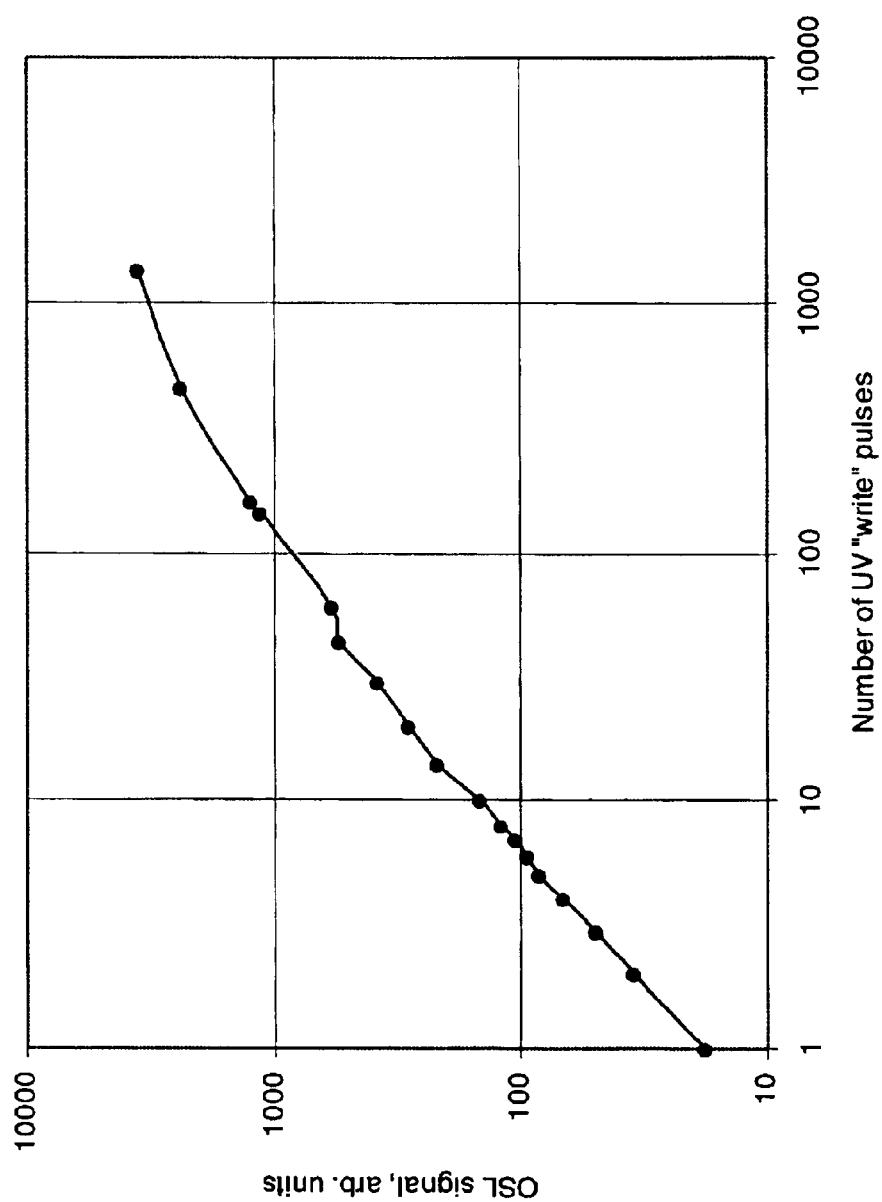
FIG. 26 is a graph illustrating the multilevel data storage principle based on proportionality of the OSL "data" signal to the number of UV "write"-pulses according to a preferred embodiment of the present invention.

The ability to achieve multilevel data storage and retrieval utilizing OSL technique is illustrated by FIG. 26. The tested $Al_2O_3$:C,Mg,H crystal was subjected to an incrementing number of "writing" UV laser pulses with the wavelength of 215 nm and "reading" the stored information was done using $2^{nd}$ harmonic of Nd:YAG laser at 532 nm. The "data" OSL signal at 330 nm was detected and plotted as a function of number of UV "writing" pulses. The data shows proportionality of OSL response to the number of UV pulses within 3 decades. A discrete number of data levels that may be used for multilevel data storage is preferably at least $2^8=256$ and depends on accuracy of the analog-to-digital converter used in the storage system.

EXAMPLE XIV

Figure 27:
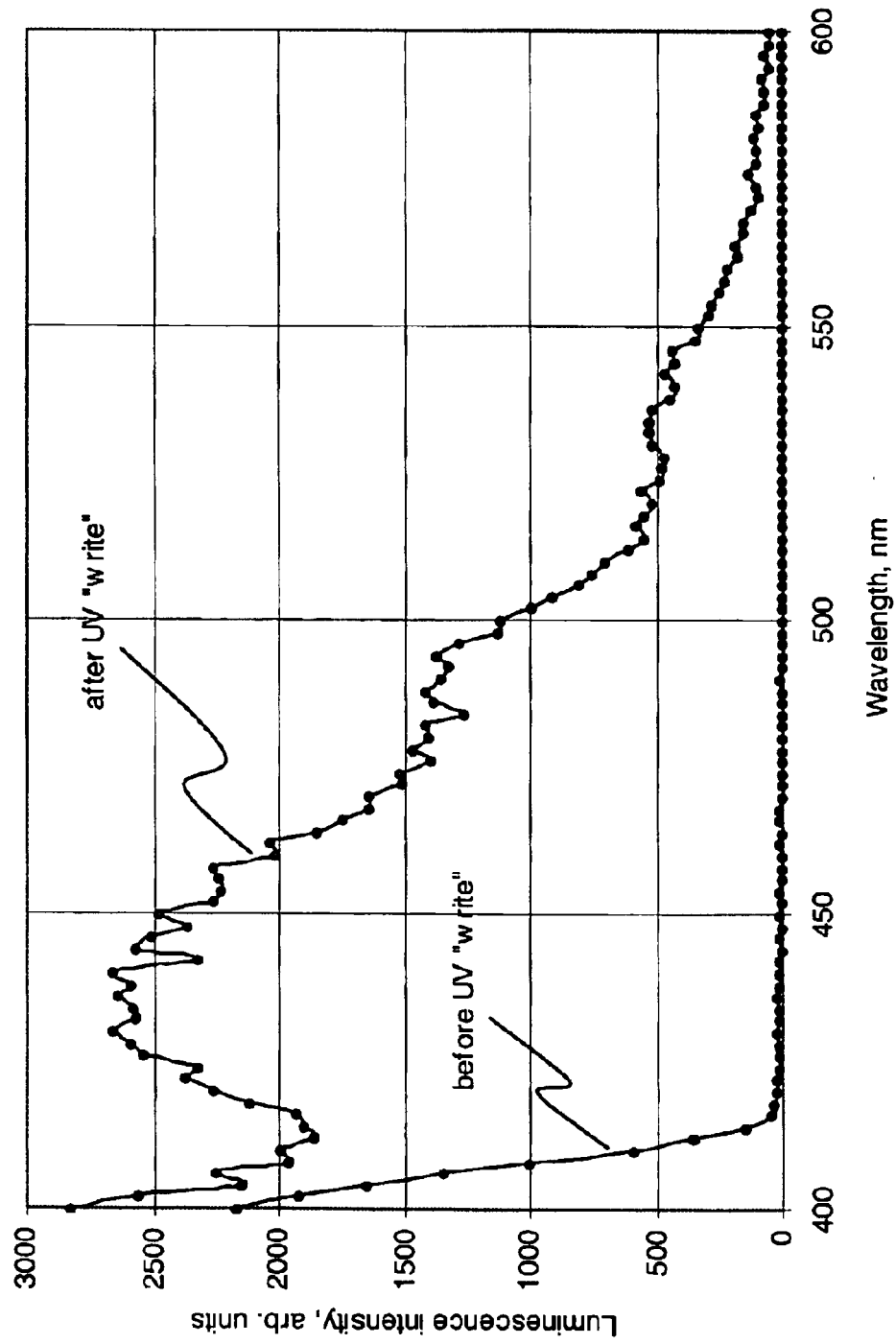
FIG. 27 is a graph illustrating the band of optical stimulation for an $Al_2O_3$:C,Mg,H crystal and illustrates the selected range of "read"-beam wavelengths according to a preferred embodiment of the present invention.

Though one may "write" on the proposed aluminum oxide material within the range of wavelengths from 180 to 240 nm, the preferred wavelength of the "write" beam should correspond to the maximum absorption band of F-centers at 205 nm (FIG. 4). The preferred wavelength of the "read" beam is suggested at 532 nm and is preferably within the range of OSL stimulation band (400–600 nm) shown in FIG. 27 and at the same time should correspond to the minimum wavelength dependence of an OSL background signal shown in FIG. 26. FIG. 27 shows OSL response from Al2O3:C,Mg,H crystal as a function of stimulation wavelength. Stimulation was performed with a pulsed Xe-lamp through Acton Research scanning monochromator and a GG-400 long pass filter on the exit slit. The difference between OSL response from the crystal before 210 nm UV illumination (writing) and the same crystal after UV illumination demonstrated the optical depth of electron traps and an optimum wavelength of OSL stimulation in the range between 400 and 600 nm.

Another way to optically stimulate traps filled during a "write" process and to perform the "read" operation was tested using two-photon absorption of infrared light in the range of 800–1200 nm from the OPO idler instead of the visible light used above. In the later case a 1064 nm fundamental harmonic of Nd:YAG laser is readily available and may be considered a preferred wavelength.

All documents, patents, journal articles and other materials cited in the present application are hereby incorporated by reference.

It is important to emphasize that the invention is not limited in its application to the detail of the particular material and technological steps illustrated herein. The invention is capable of other embodiments and of being practiced or carried out in a variety of ways. It is to be understood that the phraseology and terminology employed herein is for the purpose of description and not of limitation.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A crystalline material comprising:
    a base material comprising $Al_2O_3$;
    a first dopant comprising magnesium; and
    a second dopant comprising carbon, wherein said crystalline material includes a plurality of at least one type of oxygen vacancy defect.

2. The crystalline material of claim 1, wherein Mg is present in said crystalline material in a quantity of between 1 and 100 ppm of said base material by weight.

3. The crystalline material of claim 1, wherein Mg is present in said crystalline material in a quantity of between 10 and 40 ppm of said base material by weight.

4. The crystalline material of claim 1, wherein said Mg is present in said crystalline material in a quantity of about 27 ppm of said base material by weight.

5. The crystalline material of claim 1, wherein said C is present in said crystalline material in a quantity of between 0.5 and 20 ppm of said base material by weight.

6. The crystalline material of claim 1, wherein C is present in said crystalline material in a quantity of between 1 and 10 ppm of said base material by weight.

7. The crystalline material of claim 1, wherein C is present in said crystalline material in a quantity of about 6 ppm of said base material by weight.

8. The crystalline material of claim 1, wherein said plurality of at least one type of oxygen vacancy are present in said crystalline material at a concentration of about $10^{13}$–$10^{19}$ cm$^{-3}$.

9. The crystalline material of claim 1, wherein said plurality at least one type of oxygen vacancy defect comprises a plurality of F-centers.

10. The crystalline material of claim 9, wherein said plurality of F-centers are present at a concentration of about $10^{16}$–$10^{18}$ cm$^{-3}$.

11. The crystalline material of claim 1, wherein said plurality of at least one type of oxygen vacancy defect comprises a plurality of $F^+$-centers.

12. The crystalline material of claim 11, wherein said plurality of $F^+$-centers are present at a concentration of about $10^{15}$–$10^{17}$ cm$^{-3}$.

13. The crystalline material of claim 1, wherein said plurality of at least one type of oxygen vacancy defect comprises a plurality of $F_2^{2+}$-centers.

14. The crystalline material of claim 13, wherein said plurality of $F_2^{2+}$-centers are present at a concentration of about $10^{15}$–$10^{17}$ cm$^{-3}$.

15. The crystalline material of claim 1, wherein said plurality of at least one type of oxygen vacancy defect comprises a mixture of different types of F-type centers.

16. The crystalline material of claim 1, wherein said crystalline material has an absorption band in the region of 205±5 nm and said absorption band is related to an emission band in the region of 420±5 nm with a luminescent lifetime of 35±5 ms.

17. The crystalline material of claim 1, wherein said crystalline material has an absorption bands in the regions of 230±5 nm and 255±5 nm and said absorption bands are related to an emission band in the region of 330±5 nm with a luminescent lifetime of 4±3 ns.

18. The crystalline material of claim 1, wherein said crystalline material has an absorption band in the region of 335±5 mu and said absorption band is related to an emission band in the region of 750±10 nm with a luminescent lifetime of 80±10 ns.

19. The crystalline material of claim 1, wherein said crystalline material has an absorption band in the region of 435±5 nm and said absorption band is related to an emission band in the region of 520±10 nm with a luminescent lifetime of 9±3 ns.

20. The crystalline material of claim 1, wherein said crystalline material has an absorption band in the region of 500±15 nm.

21. The crystalline material of claim 1, wherein said crystalline material has an absorption band in the region of 630±15 nm.

22. The crystalline material of claim 1, further comprising a third dopant comprising hydrogen.

23. The crystalline material of claim 22, wherein said first dopant is present in a quantity of between 1 and 100 ppm of base material by weight; said second dopant is present in a quantity of between 0.5 and 20 ppm of base material by weight; and said third dopant is present in a quantity of between 1 and 100 ppm of base material by weight.

24. The crystalline material of claim 1, wherein said crystalline material comprises color centers formed by a cluster of defects comprising $F_2^{2+}$-centers charge-compensated with Mg and C impurities.

25. The crystalline material of claim 24, wherein said color centers have a concentration of about $10^{13}$ to $10^{17}$ cm$^{-3}$.

26. The crystalline material of claim 1, wherein said crystalline material comprises color centers present in a concentration of about $10^{13}$ to $10^{19}$ cm$^{-3}$.

27. The crystalline material of claim 1, wherein said crystalline material includes deep traps of charge.

28. The crystalline material of claim 27, wherein said deep traps of charge have delocalization temperature about 600° C. to 700° C. and have concentration about $10^{13}$ to $10^{17}$ cm$^{-3}$.

29. The crystalline material of claim 1, wherein said crystalline material is substantially insensitive to room light.

30. The crystalline material of claim 1, wherein said crystalline material has a photo-ionization cross-section of at least 0.01 cm$^2$/J.

31. The crystalline material of claim 1, wherein said crystalline material has a fluorescence yield of at least 0.1.

32. A crystalline material comprising $Al_2O_3$, wherein said crystalline material includes at least one color center having: an absorption in the region of 435±5 nm, an emission in the region of 520±5 nm and a 9±3 ns fluorescence lifetime.

33. A crystalline material comprising $Al_2O_3$, wherein said crystalline material includes at least one color center having: an absorption in the region of 335±5 nm, an emission in the region of 750±5 nm and a 80±10 ns fluorescence lifetime.

34. A crystalline material comprising:
    a base material comprising $Al_2O_3$;
    a first dopant comprising magnesium; and
    a second dopant comprising carbon, wherein said crystalline material includes at least one color center having: an absorption in the region of 435±5 nm an emission in the region of 520±5 nm and a 9±3 ns fluorescence lifetime.

35. A crystalline material comprising:
    a base material comprising $Al_2O_3$;
    a first dopant comprising magnesium; and
    a second dopant comprising carbon, wherein said crystalline material includes at least one color center having: an absorption in the region of 335±5 nm, an emission in the region of 750±5 nm and a 80±10 ns lifetime.

36. A crystalline material comprising:

a base material comprising $Al_2O_3$;

a first dopant comprising magnesium; and a second dopant comprising carbon, wherein said crystalline material includes at least one color center having: an absorption in the region of 435±5 nm, an emission in the region of 520±5 nm and a 9±3 ns fluorescence lifetime and at least one color center having: an absorption in the region of 335±5 nm, an emission in the region of 750±5 nm and a 80±10 ns lifetime.

37. A crystalline material comprising:

a base material comprising $Al_2O_3$;

a first dopant comprising magnesium;

a second dopant comprising carbon, and a third dopant comprising hydrogen, wherein said crystalline material includes at least one color center having: an absorption in the region of 435±5 nm, an emission in the region of 520±5 nm and a 9±3 ns fluorescence lifetime and at least one color center having: an absorption in the region of 335±5 nm, an emission in the region 750±5 nm and a 80±10 ns lifetime.

38. A crystalline material comprising a base material comprising $Al_2O_3$ and a dopant comprising Mg, wherein said crystalline material includes a plurality of aggregate oxygen vacancy defects.

* * * * *